US008413088B1

(12) United States Patent
Armbruster et al.

(10) Patent No.: US 8,413,088 B1
(45) Date of Patent: Apr. 2, 2013

(54) VERIFICATION PLANS TO MERGING DESIGN VERIFICATION METRICS

(75) Inventors: Frank Armbruster, Erfurt (DE); Sandeep Pagey, Noida (IN); F. Erich Marschner, Ellicott City, MD (US); Dan Leibovich, Modiin, IL (US); Alok Jain, New Delhi (IN); Axel Scherer, Beverly, MA (US); Yaron Peri-Glass, Raanana, IL (US)

(73) Assignee: Cadence Design Systems, Inc., San Jose, CA (US)

( * ) Notice: Subject to any disclaimer, the term of this patent is extended or adjusted under 35 U.S.C. 154(b) by 365 days.

(21) Appl. No.: 12/426,188

(22) Filed: Apr. 17, 2009

Related U.S. Application Data

(63) Continuation-in-part of application No. 11/759,758, filed on Jun. 7, 2007, now Pat. No. 7,890,902.

(60) Provisional application No. 61/046,372, filed on Apr. 18, 2008, provisional application No. 61/156,479, filed on Feb. 28, 2009.

(51) Int. Cl.
*G06F 17/50* (2006.01)

(52) U.S. Cl. .................... 716/106; 716/100; 716/101

(58) Field of Classification Search .......... 716/100–101, 716/106
See application file for complete search history.

(56) References Cited

U.S. PATENT DOCUMENTS

| | | | |
|---|---|---|---|
| 5,778,167 A | 7/1998 | Carrel et al. | |
| 6,223,272 B1 | 4/2001 | Coehlo et al. | |
| 6,718,521 B1 | 4/2004 | Bentlage et al. | |
| 7,178,112 B1 | 2/2007 | Ciolfi et al. | |
| 7,181,708 B1 | 2/2007 | Du et al. | |
| 7,243,337 B1 | 7/2007 | Cowan | |
| 7,278,056 B2 * | 10/2007 | Hekmatpour | 714/37 |
| 7,320,090 B2 * | 1/2008 | Coulter et al. | 714/30 |
| 7,415,684 B2 * | 8/2008 | Harer et al. | 716/106 |
| 7,587,690 B1 | 9/2009 | Siarkowski et al. | |
| 7,890,902 B1 * | 2/2011 | Sahu et al. | 716/106 |
| 2002/0002698 A1 * | 1/2002 | Hekmatpour | 716/4 |
| 2003/0121011 A1 | 6/2003 | Carter | |
| 2005/0102596 A1 | 5/2005 | Hekmatpour | |
| 2005/0283664 A1 | 12/2005 | Coulter et al. | |
| 2007/0089007 A1 | 4/2007 | Wood et al. | |
| 2008/0022262 A1 | 1/2008 | Prakash et al. | |
| 2010/0070935 A1 * | 3/2010 | Bist et al. | 716/4 |
| 2010/0070940 A1 * | 3/2010 | Bist et al. | 716/5 |
| 2010/0169853 A1 * | 7/2010 | Jain et al. | 716/5 |

OTHER PUBLICATIONS

Kim et al.; "Program Element Matching for Multi-Version Program Analyses"; May 23, 2006; Computer Science & Engineering University of Washington; ACM; pp. 58-64.
Ur, Shmuel.; "Code and Functional Coverage Tutorial"; May 1999; IBM Research Laboratory in Haifa; 60 pages.

\* cited by examiner

*Primary Examiner* — Stacy Whitmore
(74) *Attorney, Agent, or Firm* — Alford Law Group, Inc.; William E. Alford

(57) ABSTRACT

A method and apparatus for producing a verification of digital circuits are provided. In an exemplary embodiment on the invention, a plurality of verification scopes of an integrated circuit design as defined as part of a verification plan. A plurality of verification runs are executed within two or more verification scopes defined by the verification plan. At least two verification runs are selected to merge verification results together. Like named scenarios are merged together for each verification scope to generate merged verification results that are then stored into a merge database. A verification report is generated for the integrated circuit design from the merged verification results. A merge point may be specified so like named subtrees and subgroups may be merged across different verification scopes of selected verification runs. The merge point may combine check and coverage results obtained during simulation with check and coverage results obtained during formal verification.

22 Claims, 26 Drawing Sheets
(4 of 26 Drawing Sheet(s) Filed in Color)

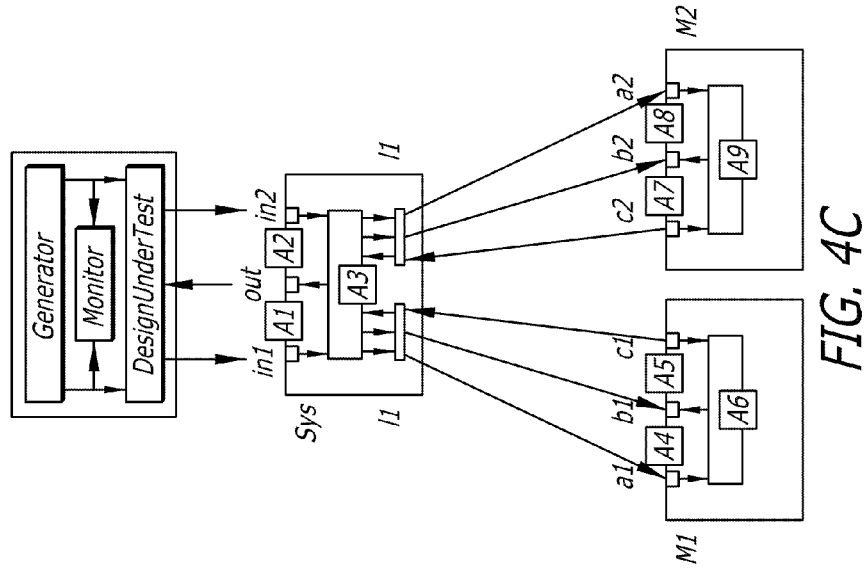
FIG. 4C
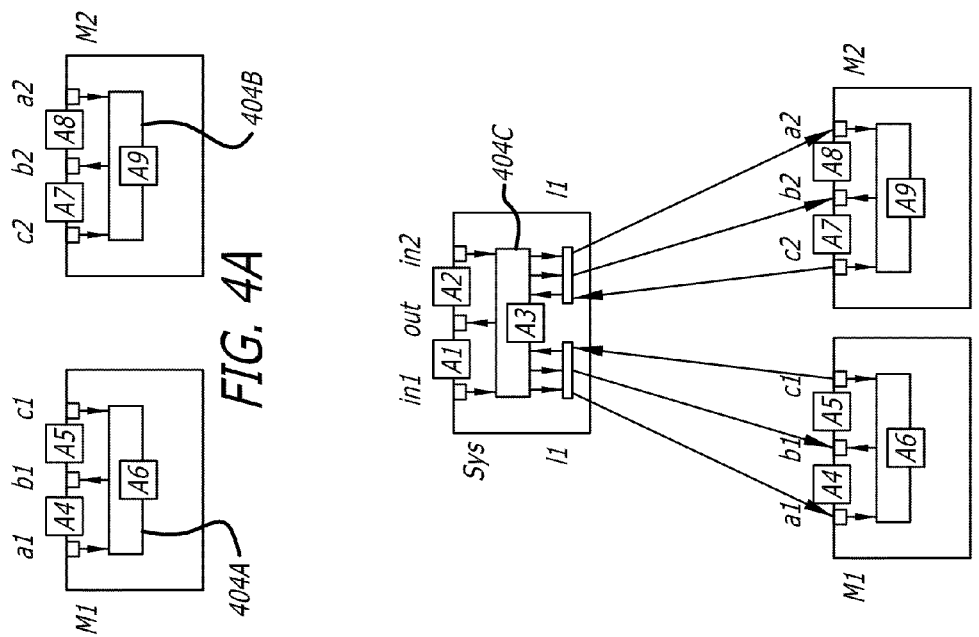
FIG. 4A
FIG. 4B

|  | Path | Verification Scope | Parameters | Instance Match |
|---|---|---|---|---|
| Section From Another Plan | Another_Plan::Another_Section | VS1 | | |

FIG. 14

| Section | Associated Verification Scope |
|---|---|
| a | A |
| b | B |
| c | C |
| b.a | B (which is "this" of instantiation of section A in section B - rule no.4) |
| c.b.a | C (explicitly specified in instantiation of Section B in Section C and through "this" used in instantiation of section A in section B - rule no. 1 and rule no.4) |
| c.b | C (explicitly specified in instantiation of section B in section C - rule no.1) |

FIG. 15

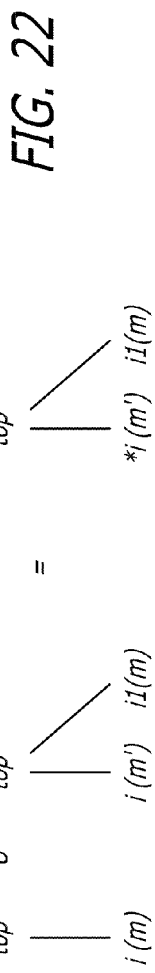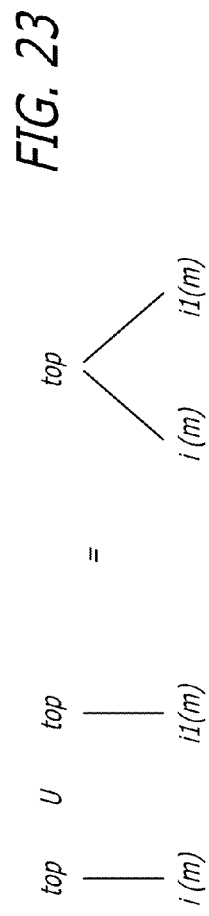

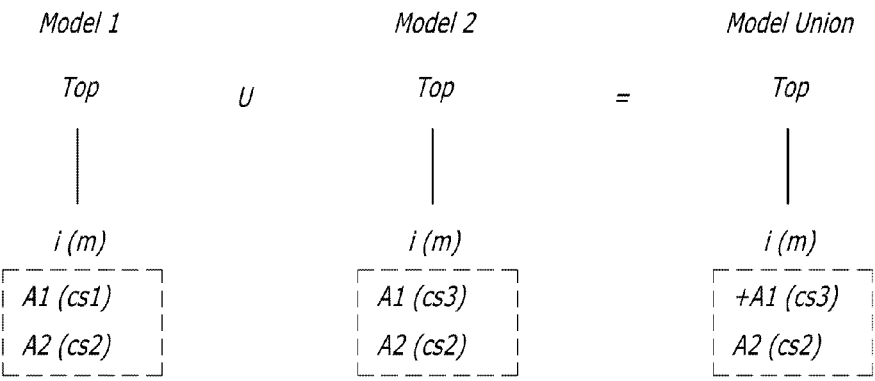
FIG. 25
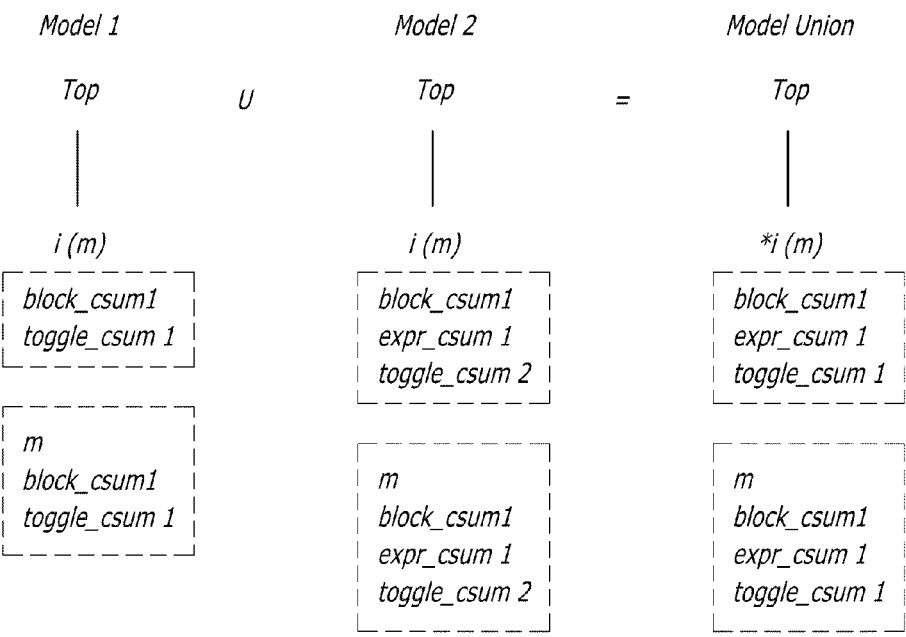
FIG. 26    *CONFLICT-WITH-LOSS-OF-TOGGLE-DATA

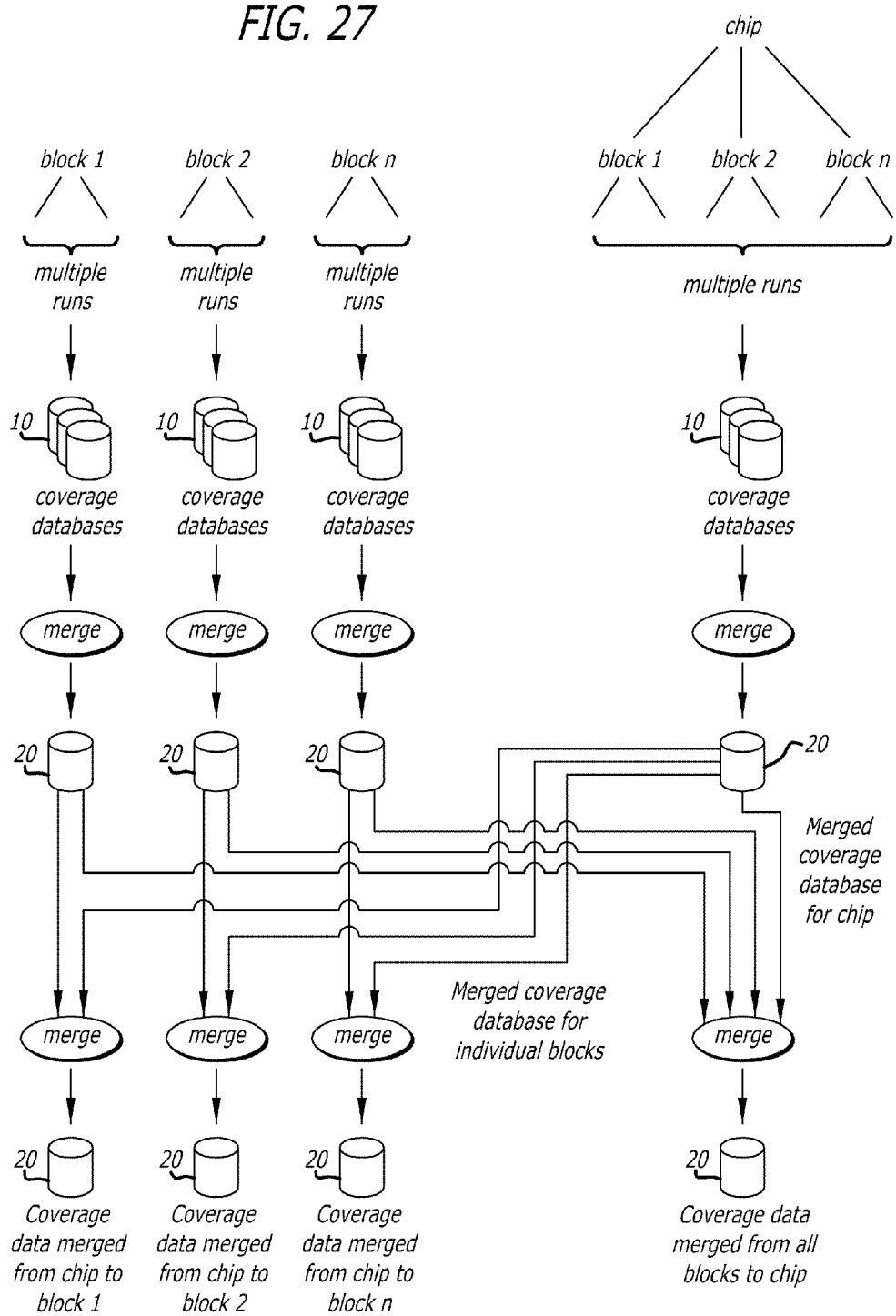

VERIFICATION PLANS TO MERGING DESIGN VERIFICATION METRICS

CROSS REFERENCE TO RELATED APPLICATIONS

This patent application incorporates by reference and claims the benefit of U.S. Provisional Patent Application No. 61/156,479 entitled MERGING OF DESIGN VERIFICATION METRICS filed on Feb. 28, 2009 by inventors Sandeep Pagey et al, which is hereby incorporated by reference in its entirety; and U.S. Provisional Patent Application No. 61/046,372 entitled USER- AND PLAN-DRIVEN MERGING OF DESIGN VERIFICATION METRICS ACROSS MULTIPLE HIERARCHIES AND DESIGN INTEGRATION LEVELS filed on Apr. 18, 2008 by inventors Erich Marschner et al.

Furthermore, the subject matter of the present invention is a continuation in part and claims the benefit of U.S. patent application Ser. No. 11/759,758, entitled METHODS AND APPARATUS FOR MERGING COVERAGE FOR MULTIPLE VERIFICATION AND DESIGN SCENARIOS, filed Jun. 7, 2007, by Bijaya Sahu et al., now issued as U.S. Pat. No. 7,890,902, which is hereby incorporated by reference in its entirety.

FIELD OF THE INVENTION

The embodiments of the invention generally relate to merging metrics in verification of integrated circuit designs.

BACKGROUND OF THE INVENTION

Integrated circuits (ICs) have become the backbone of modern consumer electronics. The increased demand for functionality of consumer electronics has forced the complexity of IC's to skyrocket. In a number of applications, ICs are highly functional, low cost and have low power consumption. These demands create increased complexity on the design, verification, and manufacture of ICs.

A typical integrated circuit design may involve the creation of electronic components, such as transistors and resistors, and the interconnections of these components onto a substrate, such as silicon. The simulation, verification, and sometimes layout of these components usually is accomplished in sub-blocks, or modules. Each block may be simulated and verified individually. Multiple design teams typically work on the individual blocks. During the design process, before semiconductor manufacturing, it is desirable to verify the functionality of an integrated circuit design to be sure that it works substantially as expected. This process may be referred to as functional verification of an integrated circuit design.

Functional verification involves the verification that the design conforms to the specification. Functional verification may involve the validation that a design meets the desired functionality. Part of the process of verification includes the creation of a Register Transfer Level (RTL) representation of the digital circuit designs (RTL design) that describe in detail the functionality of the device or block at every cycle of the clock. Creation and verification of the RTL design may be one of the more difficult portions of the design process. In many instances, this verification is a very difficult and time intensive task. Simulation tools are typically used to assist in verification. In some designs, simulation-based functional verification is performed on multiple machines in parallel. During the verification process coverage data is produced that indicates which portions of the functionality and/or code have been tested.

Coverage in the verification cycle of digital designs was previously performed using a very simple flow and was restricted mainly to using code coverage. In the simplest flow, shown in background FIG. 1, a design under verification (DUV) is stimulated using multiple test-benches and a coverage database is generated for the DUV for each simulation run. Once all the simulations have been run, the coverage databases obtained from each run are merged together to get a comprehensive view of the coverage obtained from the entire verification.

If the design under verification (DUV) is identical across all the simulation runs, a merge of coverage databases is straightforward since the design hierarchy and the set of coverage points is identical. In practical usage, this is not the case. Multiple design teams work on different blocks of a chip design. Different configurations of a chip may be run with different simulations. As part of user methodology, different simulation runs of the same design have different modules at different levels of abstraction. For example, one level of abstraction may contain modules written in a higher level language, such as system C, while another may be written in a low level language such as a Hardware Description Language (HDL). As multiple design teams work on various parts of a design and the design evolves over time, both the design hierarchy (affecting code coverage) and the functional coverage points (affecting functional coverage) undergo changes. It may not be easy to get an overall view of coverage results for a chip design with different simulations, different coverage points, and different hierarchies.

SUMMARY OF THE INVENTION

The present invention provides a system, apparatus and methods for overcoming some of the difficulties presented above. In an exemplary embodiment, a method and apparatus configured to perform the method are provided. The method includes the identification of a verification model and data that should be kept separate during merge processes. Another provided embodiment includes a method and apparatus configured to perform the method, where the method identifies and names a subset of the Device Under Test and/or the verification environment instance hierarchy (or subtree) within a given verification scope, for which coverage and check information is to be recorded. A further provided method and corresponding apparatus automatically merges portions of verification models and corresponding data for each occurrence of a given named subtree in the same scope in any run of a given regression run.

Further provided methods and associated computing apparatus are provided that allow user specification and provide merger of selected named subtrees from verification models with the same or different scopes {'merge points'}; for user specification of merging for type-based rollup of summary data for selected module types within a set of named subtrees in a given scope ('named subgroup'); for incorporating user specifications of merge point definitions into the verification plan or optionally a file, which exists aside the verification plan and read during verification plan analysis; and for driving the verification model merge process from the verification plan.

Various embodiments provide methods and a computing apparatus that enable more flexible control over the model merge operation. These embodiments make accurate progress measurement feasible even when different verification environments and different levels of DUT are involved. One exemplary embodiment allows a user to identify model and data elements that should not be merged. In one embodiment a verification scope is defined that contains a context in which verification data is collected and processed separately from all other verification scopes. A verification scope is characterized by a user-defined name that is associated with each run involving the same verification environment or the same use of a given verification environment. The user may also specify that verification data associated with different verification scopes should be merged.

One feature of various embodiments of the present inventions is that they enable more flexible control over the model merge operation, which makes accurate progress measurement feasible even when different verification environments and different levels of DUT integration are involved. Various provided embodiments enable the user to (a) keep separate model and data elements that should not be merged; (b) drive the automatic merge process based on selected instances rather than selected modules; and (c) define additional user-specified merge operations that would not occur automatically. Some embodiments also enable the merge process to be driven by the verification plan, which opens opportunities for intelligent optimization of the merge process. Other embodiments provide a uniform approach (single syntax and semantics) for controlling the merge process that applies equally to e, SystemVerilog, Verilog, VHDL, SystemC, and mixed-language hierarchies.

BRIEF DESCRIPTION OF THE DRAWINGS

This patent or application file contains at least one drawing executed in color. Copies of this patent or patent application publication with color drawing(s) will be provided by the Office upon request and payment of the necessary fee.

Various embodiments of the present invention taught herein are illustrated by way of example, and not by way of limitation, in the figures of the accompanying drawings, in which:

FIGS. 4A-4C are block diagrams to illustrate various exemplary verification steps for an integrated circuit design.

FIG. 14 illustrates a table for instantiating a verification plan including column entries of Paths, Verification Scope, and Parameters.

FIG. 15 illustrates a table with sections and exemplary verification scope used to search the coverage/check references in those respective sections.

FIGS. 22-26 illustrate different hierarchy of two models and a union merge of each.

FIG. 27 illustrates chip level and block level coverage merges.

Figure 1:
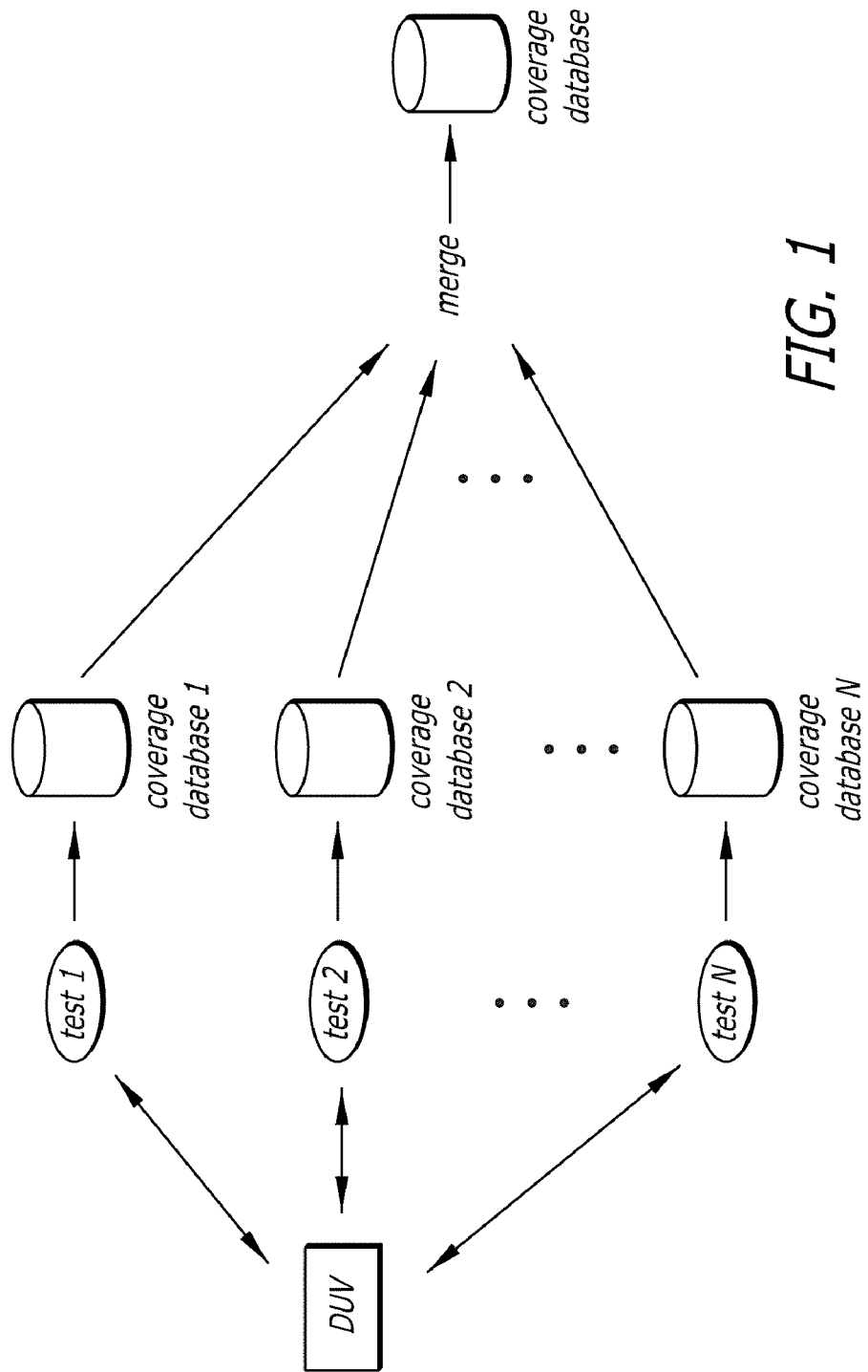
FIG. 1 is a background figure illustrating a simple coverage merger flow.

It will be recognized that some or all of the Figures are for purposes of illustration and do not necessarily depict the actual relative sizes or locations of the elements shown. The Figures are provided for the purpose of illustrating one or more embodiments of the invention with the explicit understanding that they will not be used to limit the scope or the meaning of the claims.

DETAILED DESCRIPTION OF THE INVENTION

In the following paragraphs, the present invention will be described in detail by way of example with reference to the attached drawings. While this invention is capable of embodiment in many different forms, there is shown in the drawings and will herein be described in detail specific embodiments, with the understanding that the present disclosure is to be considered as an example of the principles of the invention and not intended to limit the invention to the specific embodiments shown and described. That is, throughout this description, the embodiments and examples shown should be considered as exemplars, rather than as limitations on the present invention. Descriptions of well-known components, methods and/or processing techniques are omitted so as to not unnecessarily obscure the invention. As used herein, the "present invention" refers to any one of the embodiments of the invention described herein, and any equivalents. Furthermore, reference to various feature(s) of the embodiments of the invention throughout this document does not mean that all claimed embodiments or methods must include the referenced feature(s).

INTRODUCTION

Verification is the process of validating whether a circuit design conforms to the specification it was designed to meet. In smaller designs the task of verification may be trivial, but as digital design complexity increases verification becomes significantly difficult. In most digital designs suited for commercial applications, there may be no possibility of exercising all logic. Simulation based verification is widely used to simulate the design. Stimulus is provided in the form of a test bench that seeks to verify the design by providing scenarios that attempt to ascertain that a design responds to a given input (e.g., test input vector of binary numbers) by producing an appropriate output (e.g., expected output vector of binary numbers).

On a typical digital design project, the full verification test suite consists of multiple test runs involving various verification environments (i.e., simulation test benches or formal verification constraint sets), potentially verifying different design integration levels (module-system). For each such verification run, the tool creates a verification model for the specific verification environment and/or design under test (DUT) or design under verification (DUV) involved, and records coverage and check data for that model. Models and data are then merged across all runs of a verification test suite to give an aggregate picture of the overall verification status. Coverage and check metrics are typically embedded in testbenches used in simulation and in the DUT in both simulation and formal verification. The metrics are composed to form a 'verification model', and during a verification run, coverage and check data are recorded based on that model.

Current technology supports creation of verification models that reflect the hierarchical structure of selected modules within the verification environment and/or DUT, including summary information for non-top-level modules (rolling up results over all instances of each module type anywhere within the selected modules). If verification suite involves multiple verification environments and/or multiple levels of design integration, the resulting models are potentially difficult to merge in a meaningful way, because the structures do not correspond intuitively, and because information that should be kept separate gets merged automatically. This makes it very difficult, and in some cases impossible, to accurately measure the overall progress of verification.

One existing approach is to define a module in the design hierarchy (historically called the 'covered DUT', or 'covdut') for which coverage and check information shall be merged across different design hierarchies from different test benches. This approach can only be used for simulation metrics and only applies to code coverage collected in Verilog or VHDL hierarchies. It requires the user to declare such hierarchies, prior to design compilation. Another existing approach is to provide logical names for instances of functional coverage groups. This enables the current technology to merge coverage results that are collected for instances of the same name. This approach can only be used for e Verification Language (EVL) and SystemVerilog (SV) functional coverage groups. With this approach, if such coverage groups are part of a verification intellectual property (VIP) block, results of two VIP instances will be merged, even if such a merge is undesirable (e.g., if the test benches verify two different designs, or two different aspects of the same design).

A limitation with all existing approaches is the inability to separate coverage and check metrics from different verification environments during the verification progress measurement. For example: reusing a VIP with named functional coverage groups in two different test benches would require the user to change the VIP code in at least one test bench to avoid merging VIP coverage and check results from the two test benches. However, such code changes break the VIP reuse concept. Furthermore, the methods provided for the user to control verification model merging are complex to use. They require the user to learn System Verilog and e-coding guidelines as well as simulator switches. Also, the current approaches do not provide a sensible solution for module-to-system result merging since one 'covdut' cannot include another 'covdut' within its hierarchy. If a verification IP or design IP block is instantiated more than once in a verification model, the user is not able to control the type-based merging of coverage/check results. Because of this, obtaining accurate verification results for IC designs is a challenge when VIP blocks are used.

Simulation-based functional verification of Register Transfer Level (RTL) digital designs typically uses code coverage and functional coverage to determine the completeness of verification. These methods can be very processor intensive and may typically be performed on multiple machines in parallel. Coverage data is generated by each machine and stored in a coverage database. Once the simulations are complete, the coverage data may be merged to get a complete view of the verification coverage achieved by each of the verification runs. These approaches experience significant difficulties as the design matures. Some blocks, or modules, of a chip design may change over the design life cycle. Additionally, some modules may be changed and it would be advantageous to verify the new changes to a module and directly merge the results with a chip-level verification.

Functional verification typically involves two major aspects: demonstrating that the design works correctly under legal inputs, and demonstrating that the full range of legal inputs and combinations thereof have been explored. The first aspect measures the correctness of the design; the second measures the completeness of the verification environment. Historically, verification has addressed each of these in different ways, for example using testbench procedural code to check design correctness, and using cover groups to sample input signals to confirm that the full range of signal values have been presented to the design during verification.

The advent of assertions and assertion-based verification provided an opportunity to use assertion constructs for both correctness checking and completeness monitoring. However, the potential for a uniform approach is undermined by the fact that different tools process assertions in different ways. Similarly, assertions themselves differ in sense: some require behavior to occur, while others disallow behavior. Also, while assertion languages define clearly what a single assertion means in one run of a design, accumulation of assertion results across multiple runs in a regression suite is not straightforward, especially when regression suites include error handling tests in which assertion-triggering errors are intentionally injected into the design. These challenges make it difficult to incorporate assertion results into a verification plan in a manner that addresses both correctness checking and completeness checking consistently across multiple tools and multiple runs.

Various embodiments of the invention provide a set of methods for collecting results from both positive and negative assertions in a multi-tool, multi-run regression suite and processing those results to produce both correctness and completeness metrics that can be combined and used effectively in a plan-driven verification environment and presented to the user in an integrated fashion.

The embodiments of the invention can incorporate assertions into a plan-driven verification flow by providing processes for registering the user's expected evaluation results for a given assertion in a given run of a regression suite; for systematically recording check and coverage data for each run; for dissecting those results cleanly into correctness and completeness aspects (the implicit coverage of check aspect); for abstracting the correctness results to enable merging of correctness information across simulation and formal verification runs; for referencing both abstract check results and tool-specific coverage results in the verification plan; and for displaying check and implicit coverage results in an integrated view.

At a high level, functional verification of a design (a) clearly specifies the behavior required of the design, (b) clearly specifies the behavior of the environment around the design (e.g., the way in which the environment provides input signals to the design), (c) verifies that the design behavior is consistent with the specified behavior of the design when stimulated in accordance the specified environment behavior, and (d) confirms that the verification process itself has thoroughly exercised the design, for substantially all (or at least a representative sample) of the possible behaviors of the environment. If (c) and (d) are accomplished successfully, then the design is very likely to behave as specified in (a), in any environment that it operates as specified in (b).

At a more detailed level, functional verification of a design quickly becomes much more complex. The specification of the design may include multiple versions or configurations, each of which must be verified. The design may also operate differently in different modes. In some modes, the design may require that the environment behave exactly as specified, whereas in other modes the design may be expected to operate in a predictable way even if the environment does not behave exactly as specified. For example, part of the environment specification may be that the environment communicates with the design via a standard bus protocol, which imposes constraints on how and when the environment may drive certain inputs to the design. In a given operating mode, the design may be required to recover cleanly if those protocol constraints are violated by the environment.

Functional verification also becomes more complex due to the sheer size of today's designs, which are often too complex to verify in a single environment, but rather must be decomposed hierarchically into a set of verification tasks, the results of which must be recomposed (i.e., merged) carefully to determine whether or when the entire design has been verified. Another source of verification complexity is the fact that different verification tools and algorithms are available, and depending upon the nature of a particular sub-task in a complex verification flow, one tool or another may be preferable for that sub-task. The fact that each algorithm provides slightly different results adds to the complexity of recomposing the results of the various subtasks into an intelligible result for the whole design.

In practice, step (c) above is realized as a set of checks that monitor the design to measure its correctness, and step (d) is realized as a set of coverage points that monitor the design and testbench to measure the thoroughness of the verification process. Both checks and coverage points can be constructed in various ways. Checks can be constructed using procedural code in a hardware description language (HDL) or hardware verification language (HVL), or they can be constructed using assertions in an assertion language such as IEEE 1850-2005 Property Specification Language (PSL), or in the assertion language subset of IEEE 1800-2005 SystemVerilog, referred to as SystemVerilog Assertions (SVA), or in the 'check' and 'expect' features of IEEE 1647-2008 e Verification Language. Coverage points can be constructed using covergroups in SystemVerilog (SV) or e Verification Language (EVL), or by using cover directives in PSL or SVA.

To deal with the complexity of functional verification as it occurs in practice, we need to maximize our ability to use checks to measure design correctness, and coverage points to measure verification thoroughness, even when different configurations or modes of a given design have different or even contradictory behavior requirements. We also need to ensure that we can effectively decompose complex verification tasks into subtasks, each with possibly different environment constraints and involving possibly different DUT integration levels; exercise those subtasks with possibly different verification tools; and combine the results of the subtasks in a manner that gives a meaningful result for the whole design. Embodiments of the invention disclosed herein address these issues.

Several aspects provided by various embodiments address the requirement to maximize use of checks and coverage points. First, the embodiments of the invention provide a way to automatically derive coverage points from assertions about design behavior, so that checks written as assertions can be leveraged more effectively. Second, they provide methods of encoding the verification engineer's intention regarding a particular assertion in a given verification run, so that automatic derivation of coverage points reflects the engineer's goals for this run. Third, they provide methods of correctly recording both check result and check intent, so that the result can be correctly accumulated in subsequent processing. Fourth, they provide methods for uniformly computing an abstract result for a given check in formal verification and simulation respectively, so that for a given check, the abstract result from a formal verification run and the abstract result from a simulation run can be combined in a meaningful way. Fifth, they provide methods for computing a coverage grade for a given check in a parallel manner for formal verification and simulation, so that the respective coverage results can be referenced individually and in combination. Sixth, they provide methods of defining aggregations of coverage points (including the implicit coverage points derived from assertions) to define verification scenarios, and method of correlating these scenarios with check results to compute an overall result for each verification run. Seventh, they provide methods for merging check and coverage results from multiple runs into a combined result representing the aggregation of all runs. Eighth, they provide methods for incorporating the relevant check and coverage results into appropriate sections of a verification plan. Finally, they provide methods of presenting the merged abstract check results together with corresponding merged coverage results in a status display representing that state of the verification process for a given design and verification plan.

Several provided embodiments address the requirement to effectively decompose complex verification tasks into subtasks, run each subtask with possibly different environments, DUT integration levels, and tools, and then recompose the results of those subtasks into a meaningful result for the whole design.

First, an exemplary provided method partitions the set of verification runs to reflect differences in the level of DUT integration (and therefore environment) of the verification task involved. Second, a provided method identifies the relevant portions of each verification run, so that recomposition of results can happen automatically but in a user-controlled fashion. Third, provided methods employ a mechanism for explicit user-directed recomposition of verification results, for cases in which the complexity of the verification problem makes the automatic recomposition mechanism insufficient. Fourth, a provided method identifies related subsets of the check and coverage elements of the verification run for which check and coverage information should be summarized by module type, to give an aggregated view of the results by type. Fifth, a provided method directs recomposition of data from within a verification plan. Sixth, a provided method drives the recomposition of results from multiple runs entirely from the verification plan.

Exemplary Verification Steps for an Integrated Circuit Design

Referring now to FIGS. 4A-4C, block diagrams are shown to illustrate various exemplary verification steps for an integrated circuit design that may be supported by the various embodiments of the invention.

FIG. 4A illustrates a first verification step of a first module M1 and a second module M2. The first module M1 and the second module M2 may be independently verified without further hierarchy. The first module M1 has inputs a1, c1; an output b1; and internal logic 404A. The second module M2 has inputs a2, c2; an output b2; and internal logic 404B. To verify the first module M1, assertions A4, A5 may be used to monitor the inputs a2, c2; and the output b2, while assertion A6 is used to monitor the internal logic 404A. To verify the second module M2, assertions A7, A8, and A9 may be used to monitor the inputs a2, c2, and the output b2, while assertion A9 is used to monitor the internal logic 404B.

FIG. 4B illustrates a second verification step for the first module M1 and the second module M2 instantiated at a lower level of hierarchy into a system module (Sys). The System module (Sys) includes a first instance I1 of a lower level module (instance I1 of module M1, and a second instance I2 of a lower level module (instance I2 of module M2). Each module (Sys, M1, M2) may be verified and include three assertions. The first and second modules M1,M2 may have been previously independently verified and may now be verified together with the system module Sys. The Sys module may include assertions A1, A2 to monitor the interface to the Sys module (e.g., in1, in2, and out) and an assertion A3 to monitor the internal logic 404C of the Sys module.

The assertions A1, A3, A4, A6, A7, and A9, are positive assertions (i.e., describe behavior that is required to occur). The assertions A2, A5, and A8, are negative assertions (i.e., describe behavior that is disallowed). Example assertions A1, A2, and A3 are further described with reference to the example shown in FIGS. 4B-4C.

Positive assertion A1 for example, which specifies a requirement on the environment of the system, may have the following PSL assertion:

A1: always (in1 or in2);

Similarly, positive assertion A3, which specifies a requirement on the logic of the system itself, may have the following PSL assertion:

A3: always ((in1 and not in2)-> next out1);

In contrast, the negative assertion A2, which specifies a requirement on the environment of the system, may have the following PSL assertion:

A2: never {in1[*5]};

The [*5] portion of assertion A2 is part of the syntax of the assertion written in IEEE Std 1850 Property Specification Language (PSL). The expression in1[*5] is a regular expression that is true in a given cycle if in1 is true (has logic value one) for five successive cycles, starting in that cycle. Thus, assertion A2 as a whole asserts that signal in1 is never true for five successive cycles.

If a system is very complex, multiple verification runs are typically used at various DUT integration levels exercising various modes of operation of the IC design with different verification tools. For example, assume that the following verification process is being used:

Referring to FIG. 4A and a first verification step, modules M1, M2 are verified using formal verification. In these runs, the interface assertions A4, A5 of M1, and A7, A8 of M2, respectively, are used as constraints (i.e., interpreted as definitions of the possible inputs to be considered in formal verification). Internal assertions A6 of M1 and A9 of M2, respectively, are verified formally under the corresponding constraints.

Referring to FIG. 4B and a second verification step, the interface assertions A4, A5 of M1, and A7, A8 of M2, respectively, are formally verified to be true in the context of the module Sys in which M1 and M2 are instantiated as I1, I2 respectively.

Referring now to FIG. 4C and a third verification step, the behavior of the complete system (module Sys together with instances I1 of module M1, and I2 of module M2) is then verified using simulation. At least two simulation test runs are involved: one in which the interface specification for module Sys, given by assertions A1, A2, is correctly implemented by the testbench, and a second one in which the interface specification for Sys is violated (i.e., either A1 or A2 or both detect an error). The first test verifies that the system works in a normal mode. The second test verifies that the system works as expected in an error handling mode by correctly handling an interface error.

In the first verification step shown in FIG. 4A, the verification scope of each verification run is set to Module, to separate the results at this level from results at the system level. Furthermore, in the verification of module M1, we define named subtree NS_M1 corresponding to module M1, and in the verification of module M2, we define named subtree NS_M2 corresponding to module M2. These named subtrees will facilitate automatic merging (recomposition) of the verification results from these runs with results from other runs.

In each run, for each interface assertion used as an interface constraint (e.g., A4, A5 for M1, and A7, A8 for M2), the formal verification tool effectively considers input values that meet those constraints. In each run, for each internal assertion (A6, A9), the formal verification tool stores into the check and coverage database (a) an indication of whether the assertion is a positive or negative assertion (IsNegative), and (b) an indication of whether the assertion MustNotFail, or is AllowedToFail, or is Ignored (CheckIntent). If the CheckIntent indication is not Ignored, then the formal verification tool stores additional information into the check and coverage database, as follows. First, it stores (c) the tool-specific CheckStatus for the assertion. If the assertion is a positive assertion (IsNegative=False), then the formal verification tool also stores—(d) the tool-specific TraceStatus for the implicit coverage point representing assertion success. If the CheckIntent indication is MustNotFail, then the formal verification tool also computes and stores (e) an Abstract Uniform (AU) Check Result (Pass, Fail, Other) that normalizes the formal verification result in preparation for merging it with simulation results.

In the second verification step shown in FIG. 4B, the verification scope of the run is again set to Module. In this run, we define named subtree NS_M1 corresponding to instance I1 of M1 in Sys (i.e., Sys.I1). Similarly, we define named subtree NS_M2 corresponding to instance I2 of M2 in Sys (i.e., Sys.I2). This ensures that the check and coverage information collected for the individual formal verification runs for M1 and M2 respectively in step 1 will be automatically merged with the check and coverage results coming from this verification run, in which the module interface assertions for the instances of M1 and M2 are verified in the context of Sys. In this run also, for each interface assertion (A4, A5 for instance I1 of M1, and A7, A8 for instance I2 of M2) that is now being verified in the Sys context, the formal verification tool again stores into the check and coverage database the IsNegative, CheckIntent, TraceStatus, CheckStatus, and AU Check Result as in step 1.

In the third verification step shown in FIG. 4C, the verification scope of the run is set to System, because the results from these runs represent the verification of the whole system, and the user wants to keep these separate (by default) from the module-level results, to be able to measure and track progress on system verification separately, independent of module-level verification results.

In the third verification step shown in FIG. 4C, verification is done via simulation. The testbench TB is used to drive the primary inputs of the DUT (an instance of the Sys module) and the outputs of the DUT are observed. The observed output results are compared to the expected output results for the given input stimulus provided by the testbench TB. Two simulation tests are involved in the third verification step. A first test, Test1, verifies the design under normal operation. A second test, Test2, verifies that the design handles input errors appropriately when they occur. For Test1, all assertions have CheckIntent set to MustNotFail. For Test2, one or more interface assertions for the Sys module have CheckIntent set to AllowedToFail.

In each simulation-based verification run, named subtrees are defined such as NS_I1=TB.DUT.I1 (an instance of module M1), and NS_I2=TB.DUT.I2 (an instance of module M2), and DUT=TB.DUT (an instance of module Sys). In each run, for each assertion in the entire system, the simulator stores into the check and coverage database (a) an indication of whether the assertion is a positive or negative assertion (IsNegative), and (b) an indication of whether the assertion Must-NotFail, or is AllowedToFail, or is Ignored (CheckIntent). If the CheckIntent indication is not Ignored, then the simulator stores additional information into the check and coverage database, as follows. First, it stores (c) the simulation-specific FailedCount for the assertion. If the assertion is a positive assertion (IsNegative=False), then the simulator also stores— (d) the simulation-specific FinishedCount for the implicit coverage point representing assertion satisfaction. If the assertion CheckIntent indication is MustNotFail, the simulator also (e) an Abstract Uniform (AU) Check Result (Pass, Fail, Other) that normalizes the simulation result in preparation for merging it with formal verification results.

The two simulation runs described above (Test1, Test2) are directed tests that are specifically designed to stimulate the design in either normal mode or in error handling mode, respectively. An alternative approach involves definition of scenarios representing normal mode and error handling mode. Each scenario definition consists of a collection of detailed coverage points that together characterize a particular aspect of the design's behavior. For example, the following two scenarios could be defined for verification of the system:

```
scenario NormalMode={
    // the DUT (an instance of module Sys) is operating
       in normal mode
    (System) DUT.A1.Trace,
    (System) DUT.A2.Trace
}
scenario ErrorHandlingMode={
    // the DUT is seeing errors on its inputs and should be
       able to recover from these errors
    (System) DUT.A1.Fail,
    (System) DUT.A2.Fail
}
```

With these scenarios defined for a given verification run, a constrained-random simulation methodology can be used, in which the testbench generates inputs randomly within specified constraints. During the constrained random simulation, a RunResult of Pass will be computed for the simulation run if (a) there is no failure of any assertion for which CheckIntent=MustNotFail, and (b) at least one of the scenario definitions is satisfied by the run, by having all of its coverage points covered in the run.

Verification Planning

To evaluate the status of this verification process, check and coverage results collected from the various runs in verification steps 1 through 3 are combined, and then composed to produce an aggregate result for the entire design. To do this, a hierarchical verification plan is created that includes subsections that correspond to different aspects of the design and the verification process. For example, a verification plan may be defined that contains two subsections, one for the Module scope, and another for the System scope. The subsection for the Module scope may then itself contain two subsections, one for module M1, and the other for module M2. The subsection for the System scope may also have two subsections, one for normal mode behavior, and the other for error handling behavior. Each subsection is annotated to refer to the check and coverage information appropriate for the scopes and named subtrees to which that section relates. For example, in the subsection related to Module scope, in its subsection related to module M1, the following annotations may appear:

verification_scope=Module;

coverage: NS_M1.A4;

coverage: NS_M1.A5;

check NS_M1.A6;

Similarly, in the subsection related to System scope, in its subsection related to error handling behavior, the following annotations may appear:

verification_scope=System;

coverage: DUT.A1.Fail;

coverage: DUT.A2.Fail;

check: DUT.A3;

For each annotation in the verification plan referring to check or coverage information from a given verification scope and named subtree, the results from each individual verification run for that verification scope and named subtree will be automatically combined into an aggregate result. This aggregation includes summing the FinishedCount and FailedCount results obtained during simulation runs for implicit coverage points derived from assertions, and logically combining the results obtained in formal verification runs for implicit coverage points derived from assertions. It also includes computing a combined AU Check Result for all simulation runs, and a combined AU Check Result for all formal verification runs, and then a combined AU Check Result for all verification runs Additional aggregation may be requested by the user, by including explicit merge point definitions in the verification plan. For example, in the above example, the user may want to combine the check and coverage results obtained during simulation of the whole system (verification scope=System) with the check and coverage results obtained during formal verification of module M1 (verification scope=Module). Since the verification scopes and named subtrees involved are different, these results will not be automatically merged, but the user can invoke such additional merging by including a merge point definition in the verification plan, such as the following:

merge_point: Combined:NS_M1={Module:NS_M1, System:NS_I1};

This merge point will create a new verification scope (Combined), containing named subtree NS_M1, representing the combined check and coverage results for (a) named subtree NS_M1 in verification scope Module (from steps 1 and 2 above) and (b) named subtree NS_I1 from verification scope System (from step 3 above). The user can then modify the subsection for module M1 in his verification plan to refer to this combined result, by changing the verification_scope attribute appropriately:

verification_scope=Combined;
    coverage: NS_M1.A4;
    coverage: NS_M1.A5;
    check: NS_M1.A6;

The annotated verification plan thus directs the recomposition of results from each of the verification tasks created by decomposing the overall verification problem into subtasks.

Figure 2:
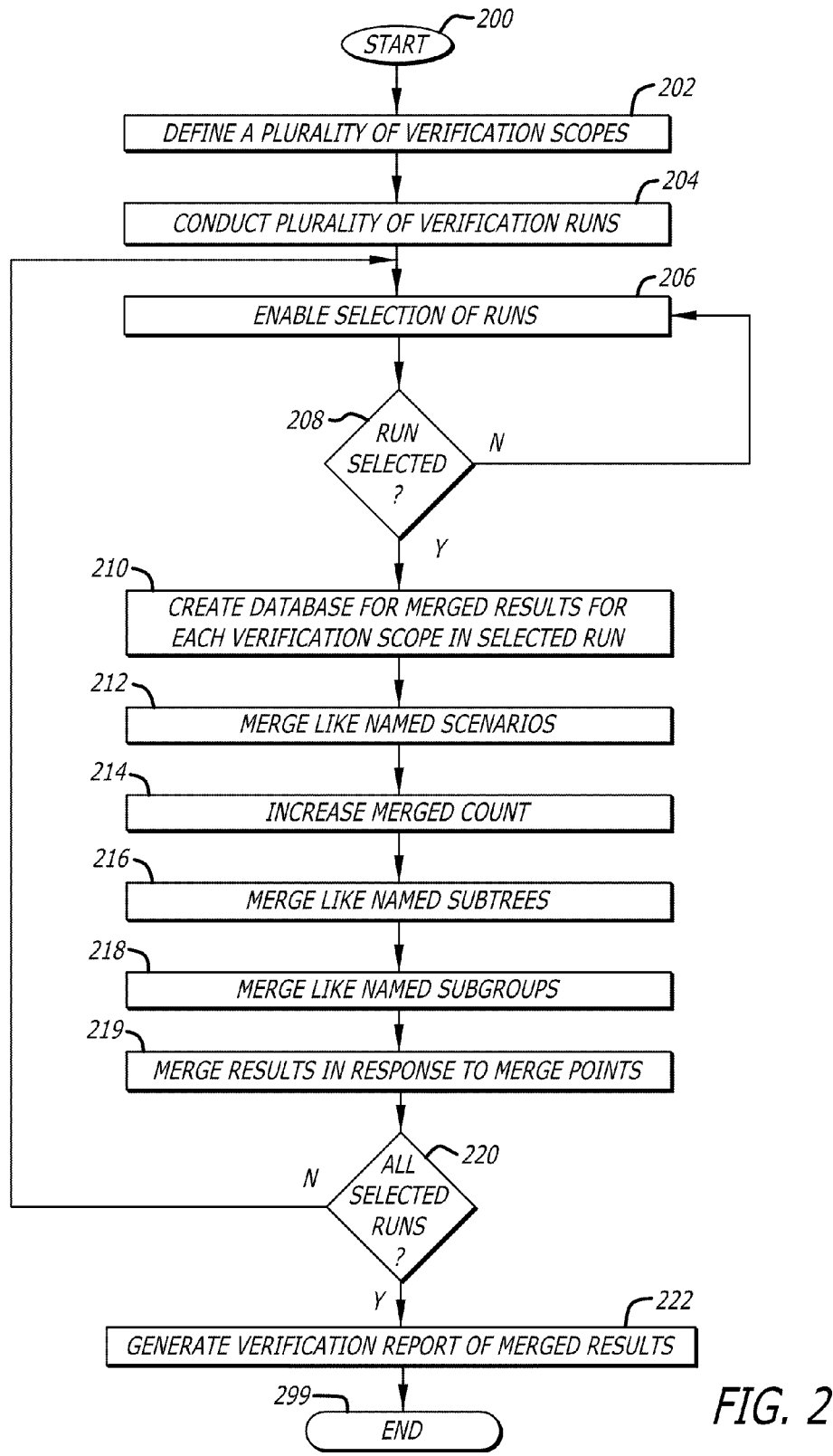
FIG. 2 is a flow chart illustrating a method for producing a verification report in accordance with one or more embodiments of the invention.

Referring now to FIG. 2, a flow chart of a method for producing a verification report in accordance with one or more embodiments of the invention is illustrated. The method starts at process 200 and goes to process 202.

At process 202, a plurality of verification scopes are defined. The process then goes to process 204.

At process 204, a plurality of verification runs are performed on the verification scopes that were defined previously. The process then goes to process 206.

At process 206, the method enables a user to select verification reports from a subset of the plurality of verification runs. Until a particular run is selected the method waits in a loop through process 208. If at process 208 one or more verification runs are selected by a user for the verification report, the process goes to process 210.

At process 210, assuming that one or more verification run were selected for the verification report, a database is created and instantiated into which merged results may be stored for each verification scope of the one or more selected verification runs. The merged results for each verification scope are separately saved in the database of merged results. The merged results may also be added together and saved into a newly created scope or one of the pre-existing scopes. The process then goes to process 212.

At process 212, like named scenarios in each verification scope of the selected runs are merged together and added to a pre-existing scope or a new scope with a predetermined name.

Next at process 214, the merge count (initialized to zero) is increased for each pair of like named scenarios that are merged together. The process then goes to process 216.

At process 216, like named subtrees are merged together in each verification scope of the selected runs.

Then at process 218, like named subgroups are merged together in each verification scope of the selected runs.

The merged results for each verification scope of the selected runs is stored into the merged database that may have been previously instantiated in process 210. The process may then go to process 219 if merge points are specified.

At process 219, verification results are further merged together in response to merge points. A merge point may specify that verification results from non-alike named subtrees (i.e., different named subtrees) within the same scope be merged together. A merge point may alternatively specify that verification results for like named or non-alike named subtrees from different scopes be merged together. The merging of results from different scopes may be referred to as a cross-scope merge process. The process then goes to process 220.

At process 220, a determination is made as to whether or not all the desired verification runs had results processed for merger into the merged database. If so, the process goes to process 222. If not all verification runs were selected for consideration, the process loops back to process 206 to allow for the selection of other desired verification runs so that their results may be merged together.

At process 222, after all of the one or more selected verification runs have results merged, a verification report is created by projecting the merged results into a verification plan. In this manner a user is allowed to decide which runs to include and exclude from a particular verification report. The verification report may be output to a user in various ways or formats, such as a window of a user interface displayed on a display device of a computer system or a print out from a printer of a computer system.

After the verification report is created and made available as an output to a user, the process may then go to process 299 and end. The verification report may be used by a designer to redesign the integrated circuit design if a failure is detected or generate additional tests to improve test and/or functional fault coverage of the integrated circuit design. The verification report could lead to a better integrated circuit design and yield in the manufacturing of the integrated circuit with semiconductor materials.

Figure 5:
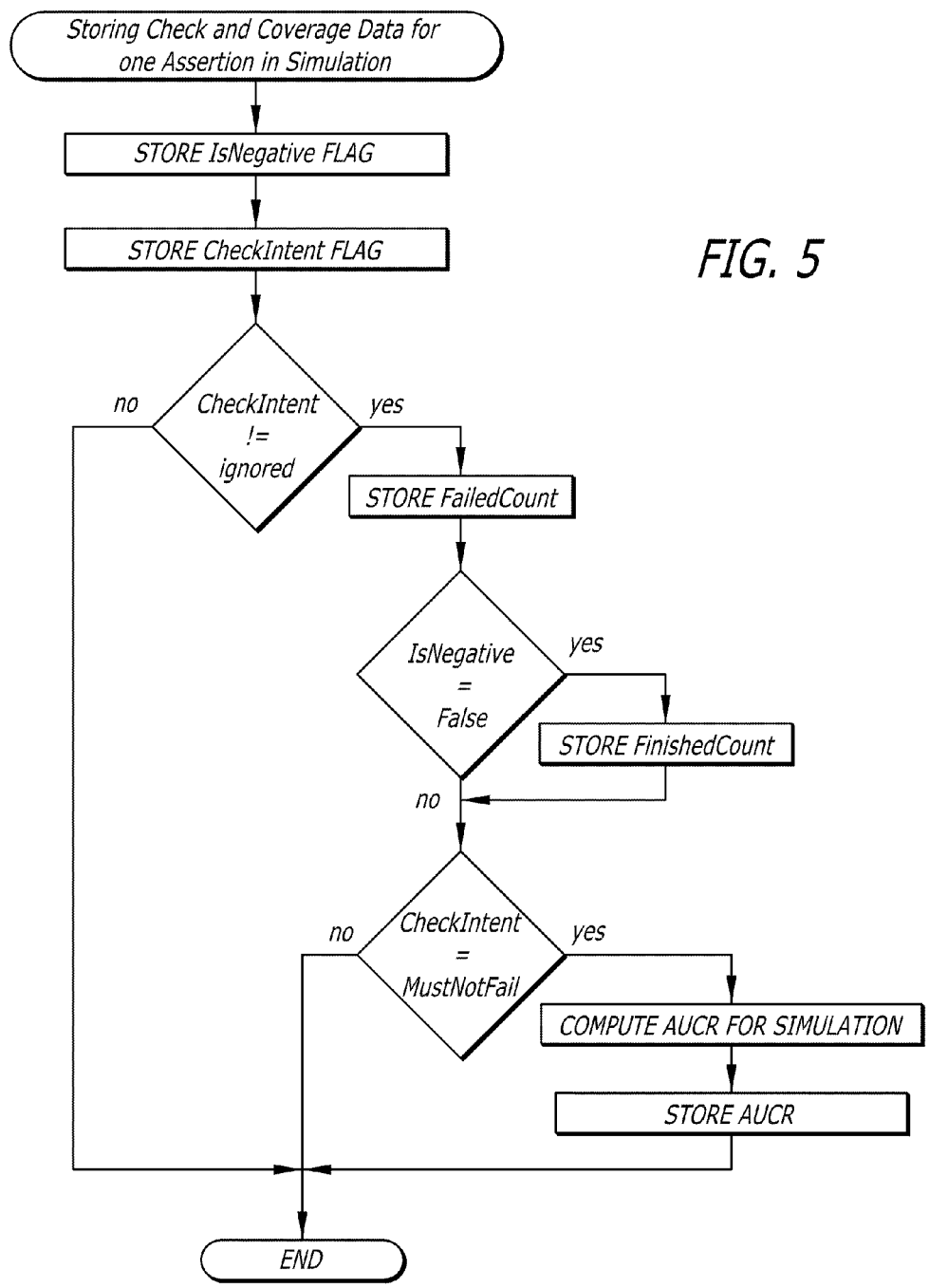
FIG. 5 is a flow chart illustrating a Storing Check and Coverage Data process for each Assertion in Simulation.
Figure 6:
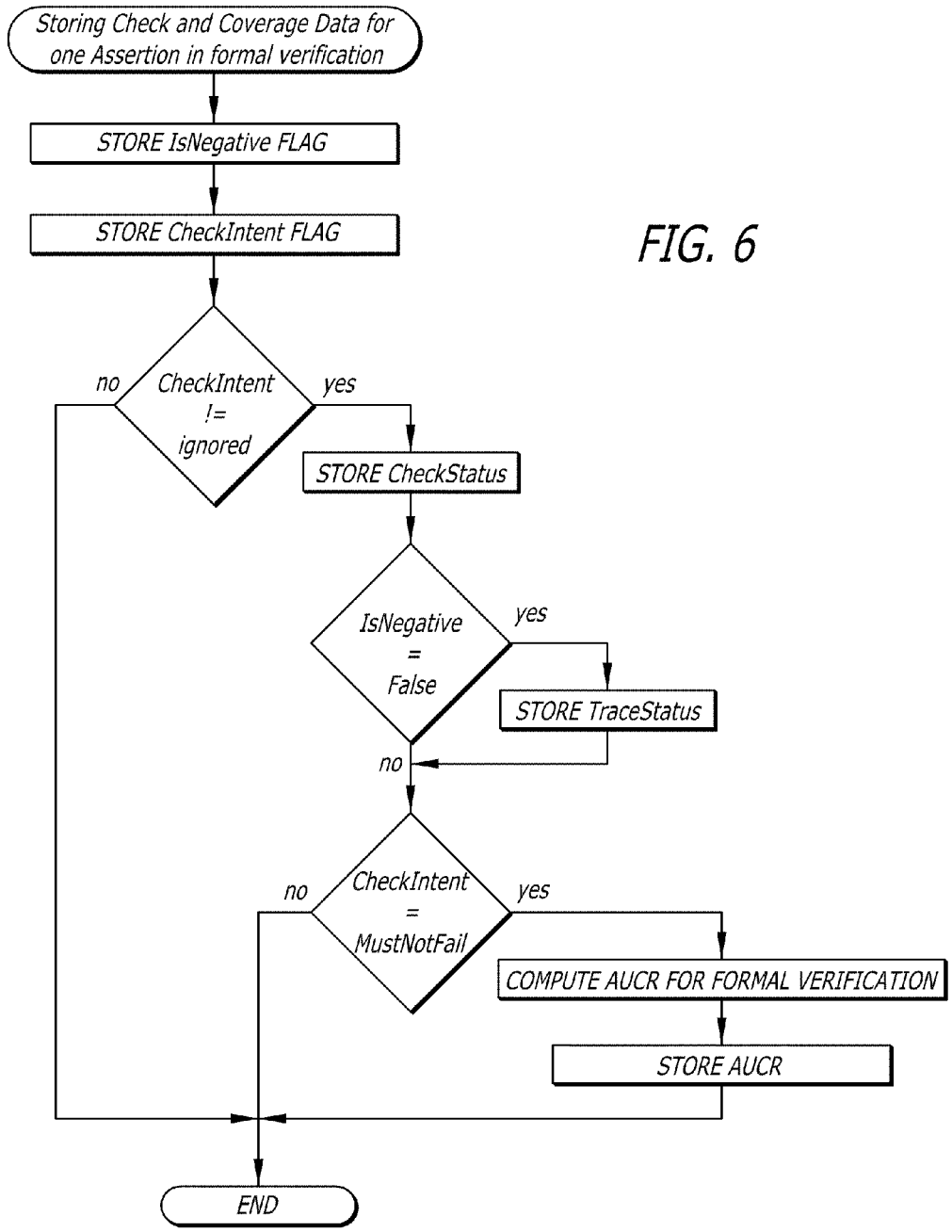
FIG. 6 is a flow chart illustrating a Storing Check and Coverage Data process for each Assertion in Formal Verification.

Reference is now made to the flow charts of FIGS. 5-6 illustrating pseudo-code to provide various processes in methods of merging verification results.

FIG. 5 illustrates a Storing Check and Coverage Data process for each Assertion in Simulation. The pseudo code for this process is as follows:

```
Storing Check and Coverage Data for One Assertion in Simulation
================================================
Store IsNegative;
Store CheckIntent;
If CheckIntent != Ignored then
    Store FailedCount;
    if IsNegative = False then
        Store FinishedCount;
    end;
    if CheckIntent = MustNotFail then
        Compute AU Check Result for Simulation;
        Store AU Check Result;
    end;
end;
```

FIG. 6 illustrates a Storing Check and Coverage Data process for each Assertion in Formal Verification. The pseudo code for this process is as follows:

```
Storing Check and Coverage Data for One Assertion
          in Formal Verification
==========================================
Store IsNegative;
Store CheckIntent;
If CheckIntent != Ignored then
```

```
        Store CheckStatus;
        if IsNegative = False then
            Store TraceStatus;
        end;
        if CheckIntent = MustNotFail then
            Compute AU Check Result for Formal Verification;
            Store AU Check Result;
        end;
    end;
```

Figure 7:
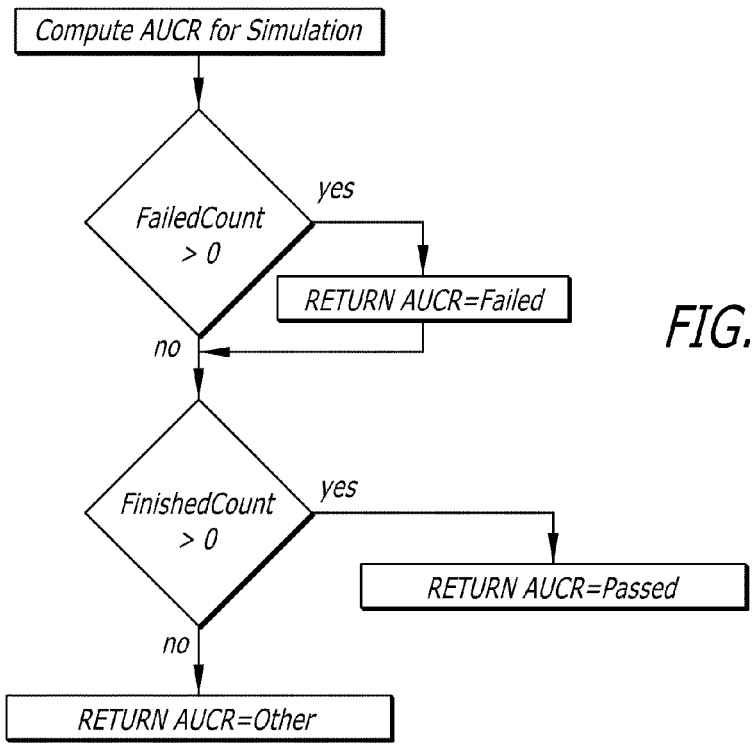
FIG. 7 is a flow chart illustrating the process of a Compute AU Check Result in Simulation in Formal Verification.

FIG. 7 illustrates the process of a Compute AU Check Result in Simulation in Formal Verification. The pseudo code for this process is as follows:

```
Compute AU Check Result in Simulation
==============================
if FailedCount > 0 then
    Return AUCR=Failed
else if FinishedCount > 0 then
    Return AUCR=Passed
else
    Return AUCR=Other;
```

Figure 8:
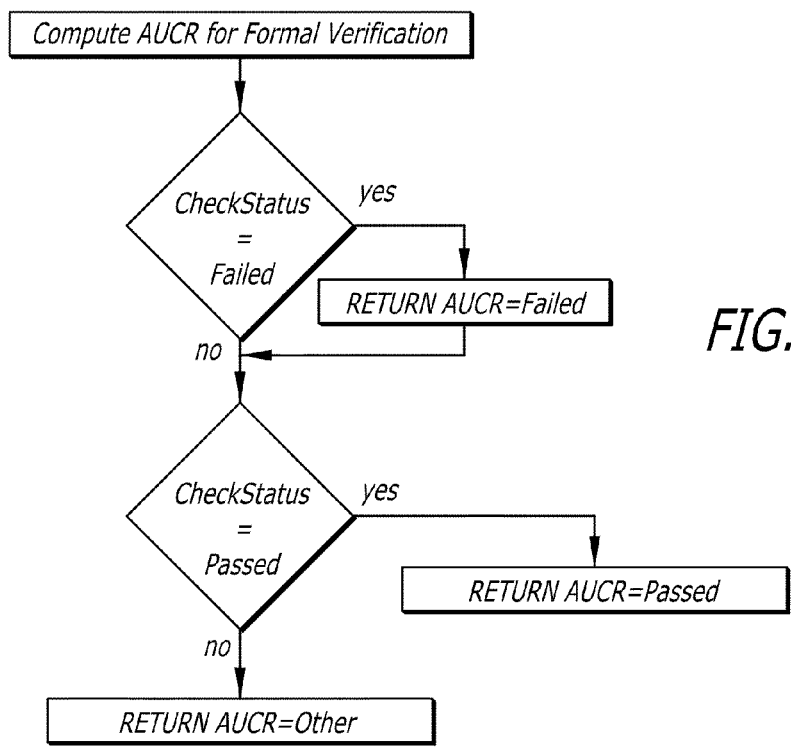
FIG. 8 is a flow chart illustrating the process of a Compute AU Check Result in Formal Verification.

FIG. 8 illustrates the process of a Compute AU Check Result in Formal Verification. The pseudo code for this process is as follows:

```
Compute AU Check Result in Formal Verification
========================================
if CheckStatus=Failed then
    Return AUCR=Failed
else if CheckStatus=Passed then
    Return AUCR=Passed
else
    Return AUCR=Other;
```

Figure 9:
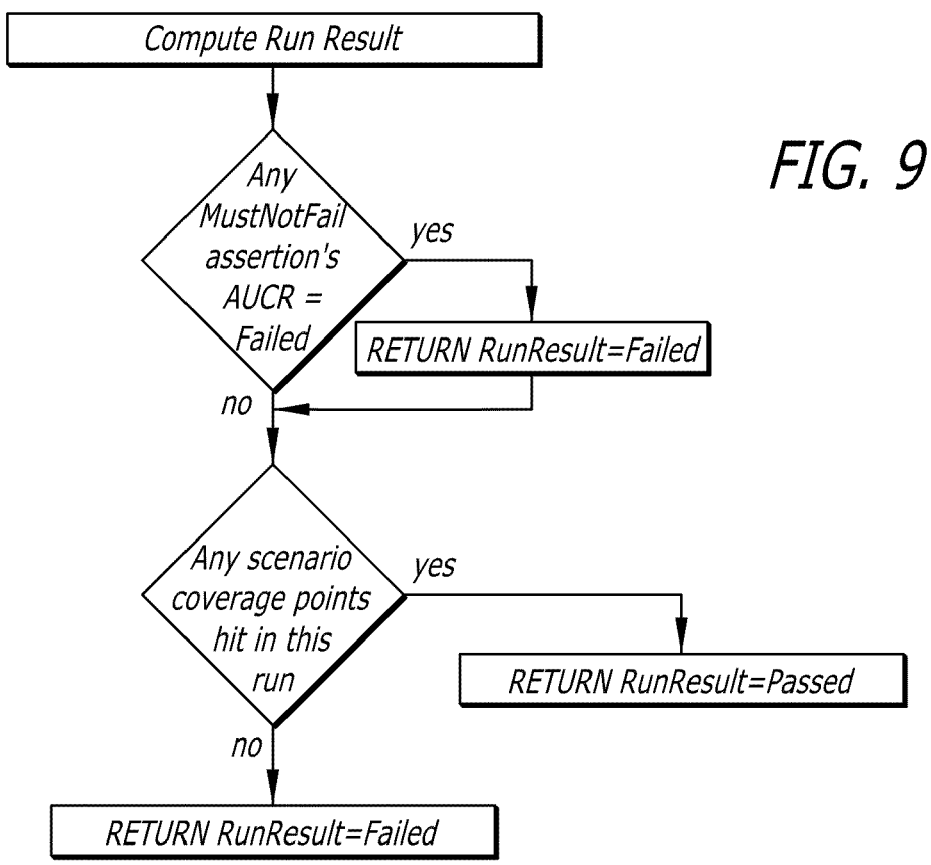
FIG. 9 is a flow chart illustrating the process of a Compute RunResult in Simulation.

FIG. 9 illustrates the process of a Compute RunResult in Simulation. The pseudo code for this process is as follows:

```
Compute RunResult
================
if any MustNotFail assertion's AU Check Result = Failed then
    Return RunResult=Failed;
else if any Scenario coverage point hit then
    Return RunResult = Passed;
else
    Return RunResult = Failed;
end;
```

Figure 10:
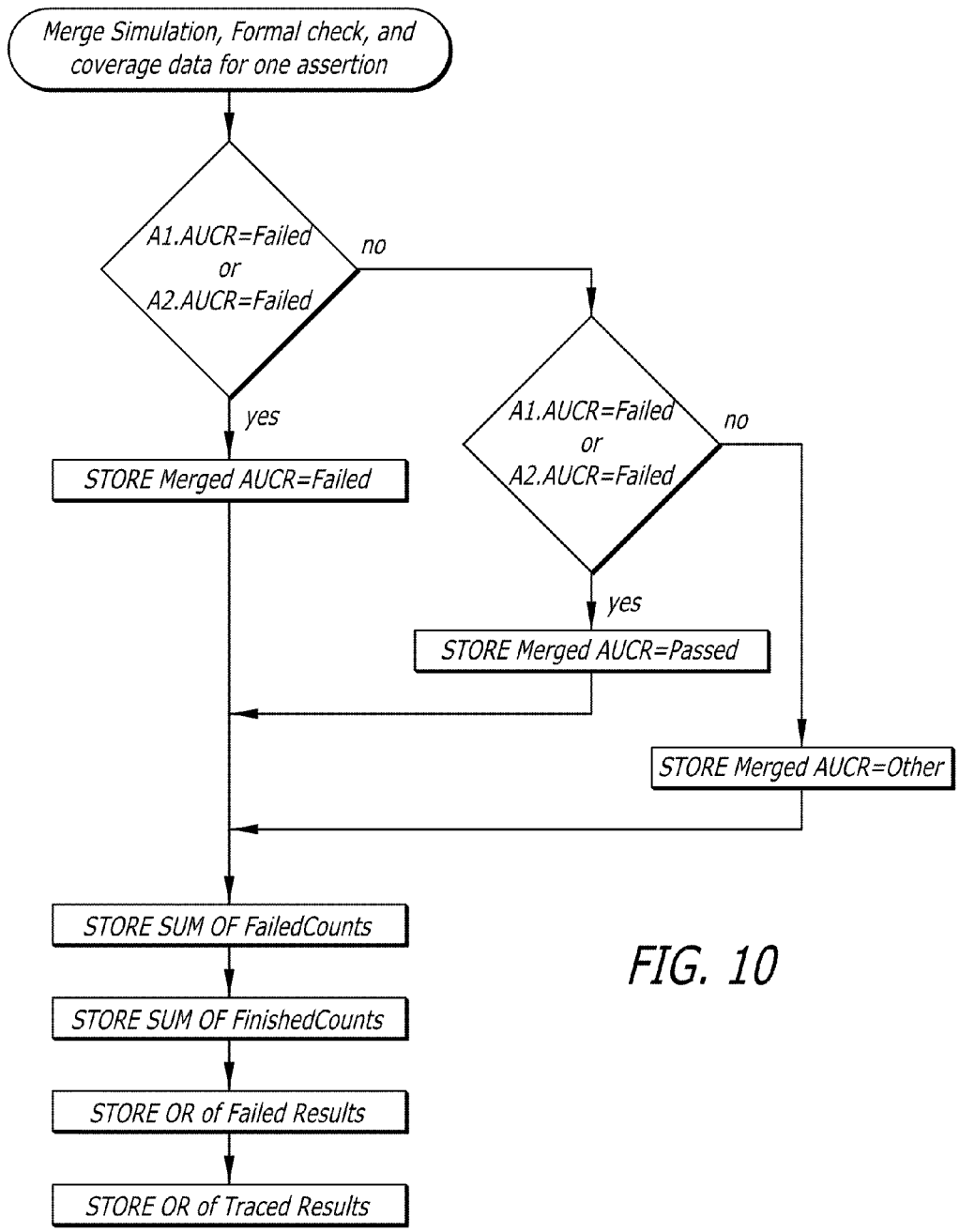
FIG. 10 is a flow chart illustrating a Merge Simulation and Formal Check and Coverage Data process for each Assertion.

FIG. 10 illustrates a merge process of simulation and formal check and coverage data for each assertion. The pseudo code for this process is as follows:

```
Merge Simulation and Formal Check and Coverage
Data for One Assertion
==========================================
Inputs: check and coverage data for assertions A1, A2
Output: merged check and coverage data (Merged)
if (A1.AUCR=Failed or A2.AUCR=Failed) then
    Store merged AUCR = Failed;
else if (A1.AUCR=Passed or A2.AUCR=Passed) then
    Store merged AUCR = Passed;
else
    Store merged AUCR = Other;
end;
Store Merged.FailedCount = sum of A1.FailedCount, A2.FailedCount;
Store Merged.FinishedCount = sum of A1.FinishedCount,
    A2.FinishedCount;
Store Merged.Failed = logical OR of A1.Failed, A2.Failed;
Store Merged.Traced = logical OR of A1.Traced, A2.Traced;
where "An.Failed" means "An.CheckStatus=Failed"
and "An.Traced" means "An.TraceStatus=Passed"
================================
```

The embodiments of the invention may be reduced to practice in a number of ways. The following discussion represents an exemplary reduction to practice of the various disclosed embodiments of the invention.

Specifying What Assertion Results are Required

In the simplest form of assertion-based verification, for a given set of assertions and coverage points, and given set of verification runs, it is intended that no assertions will fail in any run, and that all coverage points will be hit in at least one run. However, this simple model may not be sufficient for more focused verification approaches involving individual tests aimed at specific scenarios, especially those that involve verification of error handling capabilities.

For verification of error handling capabilities, it is necessary to ensure that the error conditions to be handled have in fact occurred in a given run. If the error is already characterized by an assertion, the occurrence of the error can be detected by monitoring for coverage of the assertion failure. At the same time, the assertion failure must not cause the run itself to fail, since the goal in this case is to verify error handling capabilities.

To control whether an assertion failure should cause a run to fail, CheckIntent attributes are defined to indicate the intent of the check. The user associates a CheckIntent attribute (e.g., MustNotFail, May Fail, Ignored) with each relevant assertion. The following CheckIntent attributes may be used:

MustNotFail attribute: The MustNotFail checkintent attribute is the default attribute, if the user has not specified something else. If an assertion with a MustNotFail checkintent attribute fails, then the entire run fails. Both check and coverage results will be used in subsequent analysis.

MayFail attribute: If an assertion with a MayFail checkintent attribute fails, that failure will not cause the entire run to fail (although the run may still fail for some other reason). Coverage results alone may affect subsequent analysis.

Ignored attribute: An assertion with an Ignored checkintent attribute will have no effect at all. Neither check results nor coverage results will affect later analysis. Specifying that a given assertion is ignored is equivalent to disabling the assertion for the entire run.

For example, the following command line syntax may be used to specify the check intent for selected assertions:

mayfail {$AHBmaster.monitor.master_idle_during_reset, $DUT.reset_correctly} ignored {$AHBmaster.monitor.slave_*}

As an alternative, check-intent specifications might be read from a file. In either case, use of wildcards should be allowed in the specification of assertion names, as shown above.

Each verification tool must provide a means for the user to specify which attribute should be associated with any given assertion instance. The specification of these attributes must be provided to the verification tool when starting a run, and the attributes must be stored as part of data recorded for each assertion instance.

Specifically, each formal, simulation or emulation/acceleration verification tool should (a) allow the user to specify these attributes for a given run, (b) store the attributes in the unicov database, along with the detailed check and coverage information for the run, (c) use the attribute settings as described below to determine the run result for the verification run, and (d) store the result in a unified coverage database as well.

Specifying Scenarios for Directed Testing

For a given test, the user may wish to define scenarios that the test is intended to exercise. A scenario can be thought of as a directed test, in that it targets a particular subset of the potential behavior of a design. The user may wish to define one scenario per test, or he may wish to define multiple scenarios that might be hit by the same test. In either case, defining a scenario involves specifying which coverage points are relevant for a given scenario.

For a given assertion instance AI, we can define an abstract coverage point AI.Fail for the failure of the assertion. If the assertion is a positive assertion, then we can also define an abstract coverage point AI.Trace for a trace that satisfies the assertion. Also, for a given cover directive instance CI, we can define an abstract coverage point CI.Trace.

These coverage point names could be used to define scenarios. For example, the following syntax might be used to define a particular scenario:

```
-scenario {
    // the DUT can handle a burst transaction that is too long
    $AHBmaster.monitor.master_burst_is_not_too_long.Fail,
    $DUT.burst_transaction.Trace
}
```

Each scenario has a name. If the user defines one scenario per test, the default name should be the name of the test. In particular, if a run is initiated by the verification manager (VM), and the run corresponds to a test T in group G of session S, then the default name of the scenario should be "T". The syntax used for defining a scenario should also allow the user to provide the name. For example,

```
-scenario TooLong={
    // the DUT can handle a burst transaction that is too long
    $AHBmaster.monitor.master_burst_is_not_too_long.Fail,
    $DUT.burst_transaction.Trace
}
-scenario TooShort={
    // the DUT can handle a burst transaction that is too short
    $AHBmaster.monitor.master_burst_is_not_too_short.Fail,
    $DUT.burst_transaction.Trace
}
```

The syntax used for defining a scenario should also allow the user to specify the minimum number of times a given coverage point must occur ("at least") in a given run in order to hit the scenario. For example, consider the following scenario:

```
-scenario FlakyBurst={
    // the DUT does not fail in any way when burst control is
    repeatedly flaky
    $AHBmaster.monitor.master_burst_control_remains_constant.Fail
    >= 3
}
```

In this case, the number of times for the scenario FlakyBurst is three.

An alternative syntax for plan-based mapping of the verification plan (VP) to checks and coverage points may be used. In this case, the above definitions could be written as follows:

```
-scenario {
    // the DUT can handle a burst transaction that is too long
    cover: $AHBmaster.monitor.master_burst_is_not_too_long(fail)
    cover: $DUT.burst_transaction
}
-scenario TooLong={
    // the DUT can handle a burst transaction that is too long
    cover: $AHBmaster.monitor.master_burst_is_not_too_long(fail)
    cover: $DUT.burst_transaction
}
-scenario TooShort={
    // the DUT can handle a burst transaction that is too short
    cover: $AHBmaster.monitor.master_burst_is_not_too_short(fail)
    cover: $DUT.burst_transaction
}
-scenario FlakyBurst={
    // the DUT does not fail in any way when burst control is repeatedly flaky
    cover:
    $AHBmaster.monitor.master_burst_control_remains_constant(fail 3)
}
```

For a given run, each scenario definition, including its name, its coverage points, and the "at least" specification for the coverage point, if present, must be stored in the unicov database. In addition, for each scenario defined for a given run, an additional coverage point indicating whether the scenario has been hit will be defined and stored in the unicov database.

Recording Verification Data

Raw Tool Results

An assertion defines required or disallowed behavior. Verification determines whether the design behavior satisfies the assertion or fails to satisfy the assertion. In a given verification tool, the assertion may be verified (shown to not fail, perhaps exhaustively) or falsified (shown to fail under some conditions).

An assertion also defines implicit coverage points. For a given assertion instance AI, if the assertion is a positive assertion, then there are two tool-specific coverage metrics indicating occurrence of behavior that satisfies the assertion: AI.FinishedCount in simulation, and AI.Traced in formal analysis. If the assertion is a positive or a negative assertion, there are two tool-specific metrics indicating occurrence of behavior that fails to satisfy the assertion: AI.FailedCount in simulation, and AI.Failed in formal analysis.

The metric AI.Passed is also defined in formal analysis, indicating that the assertion has been verified exhaustively for a given set of constraints. (There is no parallel in simulation). This metric is used in determining whether an assertion has been verified or falsified; it is not used as a coverage point.

For a check (assertion) instance AI in a given named subtree, the following information is recorded into the database:

Simulation Records

AI.FinishedCount, AI.FailedCount: Integers.

Formal Analysis Records

AI.Traced, AI.Failed, AI.Passed, AI.Blocked, AI.Explored: Booleans.

Both Record

AI.CheckIntent: a user-specified CheckIntent value.

AI.IsPositive: False if the assertion is a PSL 'never' or SVA 'not' assertion, else True.

In addition, if an assertion fails in a given run, and its CheckIntent=MustNotFail, then the time (in simulation) or cycle count (in formal analysis) should be recorded in the database as well. The earliest of these times, or cycle counts, should be recorded as the time/cycle of first failure for this run, to help support failure analysis (e.g., determining which tests to debug first).

A cover directive defines an explicit coverage point. For a given cover directive instance CI, there are two tool-specific coverage metrics indicating occurrence of behavior that satisfies the cover directive: CI.FinishedCount in simulation, and CI.Traced in formal analysis.

For a coverage point (cover directive) instance CI, the following information is recorded into the database:
Simulation Records
CI.FinishedCount: Integer.
Formal Analysis Records
CI.Traced: Boolean.

For a given run, each verification tool may also record the following information in the database:
RunType: a value in {Simulation, FormalAnalysis} representing the kind of tool run performed.

FinishedCount, FailedCount, Traced, Failed, and Passed are all raw results from simulation and formal analysis. The first four of these are also treated as coverage points, which can be referenced from a verification plan (VP) using plan-based mapping.

Explored is a coverage point. ExploreDepth and CoverDepth may also be used to ensure there is correlation between checks and coverage results for a given run.

CheckIntent represents the user's intent regarding checks for a given run. The default ensures that all assertions MustNotFail. If the user wants to relax an assertion (to use it as a coverage point alone), he can specify that the assertion "MayFail".

IsPositive is a Boolean flag that indicates whether a given assertion is positive ("always") or negative ("not" or "never"). This flag determines whether a Trace coverage point is associated with the assertion. The computation of higher-level results takes this into account, to ensure that there is correlation between the check result and the implicit coverage result for the assertion itself.

RunType is a Boolean flag that indicates whether a given run is a simulation run or a formal analysis run.

Computed Results

From the raw results (verification or coverage results) recorded in the database for each run by each tool, additional results are computed at various levels. First, abstract uniform (AU) check results are computed. Second, abstract coverage results are computed. Third, scenario results are computed. Fourth, the impact of these results on the overall run result is computed.

These computations are performed by code in a shared library. The code to perform these computations can be invoked by either or both of the verification manager (VM) and the coverage analysis user interface as needed. The code may also be invoked to perform these computations immediately after a run, so that the results can be stored in a sessions database for efficient selection of runs without having to read all runs and recompute each run's results.

Abstract Uniform Check Results (AUCR)

For a given run, for each check (assertion) in the run, an abstract, uniform (AU) check result for that check is computed. AU check result values are {Failed, Passed, Other}. Following is a summary of the meanings of these values for simulation and for formal analysis, and the color coding that may be used to representing them in the verification plan user interface:

| State | Color | Simulation | Formal Analysis |
|---|---|---|---|
| Failed | Red | AI fails at least once during simulation | AI fails at least once during formal analysis |
| Passed | Green | AI does not fail in the portion of the state space reached during simulation | AI is proven to not fail anywhere in the reachable state space |
| Other | Grey | AI is disabled in ncelab, or turned off throughout the simulation run | AI is disabled in ncelab, or not "assertion -add"ed, or not evaluated at all, or Blocked, or Explored |

With reference to FIG. 7 for a Simulation run, for each assertion instance AI, the

```
AU check result is computed as follows:
    if (AI.CheckIntent = MustNotFail), then
        if (AI.FailedCount > 0) then
            AI.CheckResult := Failed
        else if (AI.FinishedCount > 0) then
            AI.CheckResult := Passed;
        else
            AI.CheckResult := Other;
        end
    else
        AI.CheckResult := Other;
    end;
```

With reference to FIG. 8, for a Formal Analysis run, for each assertion instance AI, the AU check result is computed as follows:

```
if (AI.CheckIntent = MustNotFail), then
    if (AI.Failed) then
        AI.CheckResult := Failed
    else if (AI.Passed) then
        AI.CheckResult := Passed;
    else
        AI.CheckResult := Other;
    end
else
    AI.CheckResult := Other;
end;
```

For Formal Analysis, the abstract check result may be intentionally conservative (based on Passed rather than on Explored). However, if may be modified so that the abstract check result is based on Explored instead. In this case, the ExploreDepths for each assertion is collected, and the depth at which each coverage point is hit is collected, so that correlation at the run level could check that all assertions were checked at least to the depth at which all coverage points had been hit. Being based on Explored, additional complexity is added to the algorithms. Being based on Passed, the abstract check result is conservative with simpler algorithms.

Abstract Coverage Results

For a given run, for each assertion instance (AI) or coverage point (cover directive) instance (CI), abstract coverage results are computed also. The abstract coverage results may be computed temporarily for a given run and need not be stored in the database associated with the run. The abstract coverage results are not directly involved in the merging of verification data during later analysis. However, references to the abstract coverage results may be used to define scenarios for the verification plan.

For each assertion instance AI, abstract coverage results for the corresponding implicit coverage points are computed as follows:

AI.Fail:=AI.FailedCount>0 or AI.Failed.

AI.Trace:=AI.IsPositive and (AI.FinishedCount>0 or AI.Traced);

For each explicit cover directive instance CI, the abstract coverage result for the coverage point is computed as follows:

CI.Trace:=CI.FinishedCount>0 or CI.Traced;

Scenario Results

For a given run, one or more scenario results are computed. This reflects the success of the run as a whole with respect to exercising the test scenario(s) defined for the run.

For each scenario S defined for a given run, a coverage point S.Count is computed. This coverage point is set to the value 1 if every coverage point defined as part of scenario S was hit during the run; otherwise it is set to 0.

For example, consider the following scenario:

```
-scenario TooLong={
    // the DUT can handle a burst transaction that is too long
    $AHBmaster.monitor.master_burst_is_not_too_long.Fail,
    $DUT.burst_transaction.Trace
}
```

In this scenario, the coverage point TooLong.Count is defined. This coverage point will be given the value 1 if, during the run, assertion $AHBmaster.monitor.master_burst_ is_not_too_long failed, and the cover directive $DUT. burst_ transaction was satisfied.

Each scenario coverage point is stored in the database. During later analysis, data from multiple runs are merged, and in the process, the number of times a given scenario was hit over multiple runs will end up in the merged data. For this reason, the scenario coverage point is defined as an integer rather than as a boolean.

If a given run does not hit one of the scenarios defined for it, the tool should issue a message explaining why the scenario was not hit (i.e., which coverage points within the scenario were not hit).

Overall Run Result

Referring to FIG. 9, an overall run result indicating the overall success or failure of the run is also computed. The overall run result is affected by many factors, including the check and coverage information. Thus, the overall run result is typically specified by what is a run failure. That is, how check and coverage results can cause the run to fail is typically specified without specifying what is required to cause the run to pass in determining the overall run result. For example, a given run will fail if either of the following is true:

a check fails, and the corresponding check intent is Must-NotFail.

the run defines one or more scenarios, and none of the scenarios are hit during the run.

Computing the Abstract Uniform Check Results

This section describes the results verification manager (VM) will calculate and display for each check and rollup check results for a section (description of the actual presentation of those results will come later).

For each check item verification manager (VM) has a raw data and also the AU results. The raw data will be presented in the details pane of the item while the AU results will be presented on a check meter.

There are different kinds of checks which supported by assertion based verification (ABV), namely: testcases, simulation assertions, formal assertions. the verification manager (VM) will calculate "Abstract Uniform (AU) Check result" for any check regardless of its origin. Those results will consist of 3 possible values:

Failed #—The number of times the check failed

Not Failed #—The number of times the check did not fail

Other #—The number of time the check was in 'other' state, which means it did not fail and neither did not "not fail"

Note that the "Passed #" does not appear as a possible result.

Testcases

For each testcase, the verification manager (VM) presents the following raw results in the details window pane of the verification plan:

Number of times the testcase passed

Number of times the testcase failed

Count—Number of times the testcase should have run

For testcases the AU results are calculated as follows and presented on the tree of the verification hierarchy:

Failed=<number of times the testcase failed>

Not Failed=<number of times the testcase passed>

Other=Count-(Failed+Not Failed)

Assertions

Simulation Assertions

Referring to FIG. 7, for each assertion collected during the simulation, the verification manager (VM) presents the following details of the raw results:

Number of times the assertion finished

Number of times the assertion failed

Number of times the assertion was checked

For simulation assertions the AU results will be calculated as follows:

Failed=<number of times the assertion failed>

Not Failed=<number of times the assertion finished>

Other=<number of checked assertions>-(Failed+Not-Failed)

Formal Assertions

Referring now to FIG. 8, for each assertion collected by the formal verifier (FV), the verification manager (VM) presents the following details of the raw results:

Number of times the assertion passed

Number of times the assertion failed

Number of times the assertion was explored

Number of times the trace of the assertion was found

For formal assertions, the AU check results will be calculated as follows:

Failed=<number of times the assertion failed>

Not Failed=<number of times the assertion passed>

Other=<number of times the assertion produced any result>-(Failed+Passed)

For Formal Analysis, the abstract uniform check result (AUCR) may be intentionally conservative (based on Passed rather than on Explored) allowing for no failure. However, this may be modified to be less conservative such that it is based on Explored instead. If the assertion has both formal and simulation results then both formal and simulation raw data will appear in the detailed results.

AU Results Rollup

In the general case, a section in the verification plan (VP) can have several checks annotated from the section as well as children subsections. The calculation of the AU results for a section will be according to the following formula:

$$AU_i = \sum_{checks(c)} AU_i(c), i \in \{Failed, NotFailed, Other\},$$

where checks are all the annotated checks from the section directly or from one of its sub sections. In other words AU result for a section is a simple summary of AU results for all of it's children assertions recursively.

Figure 11:
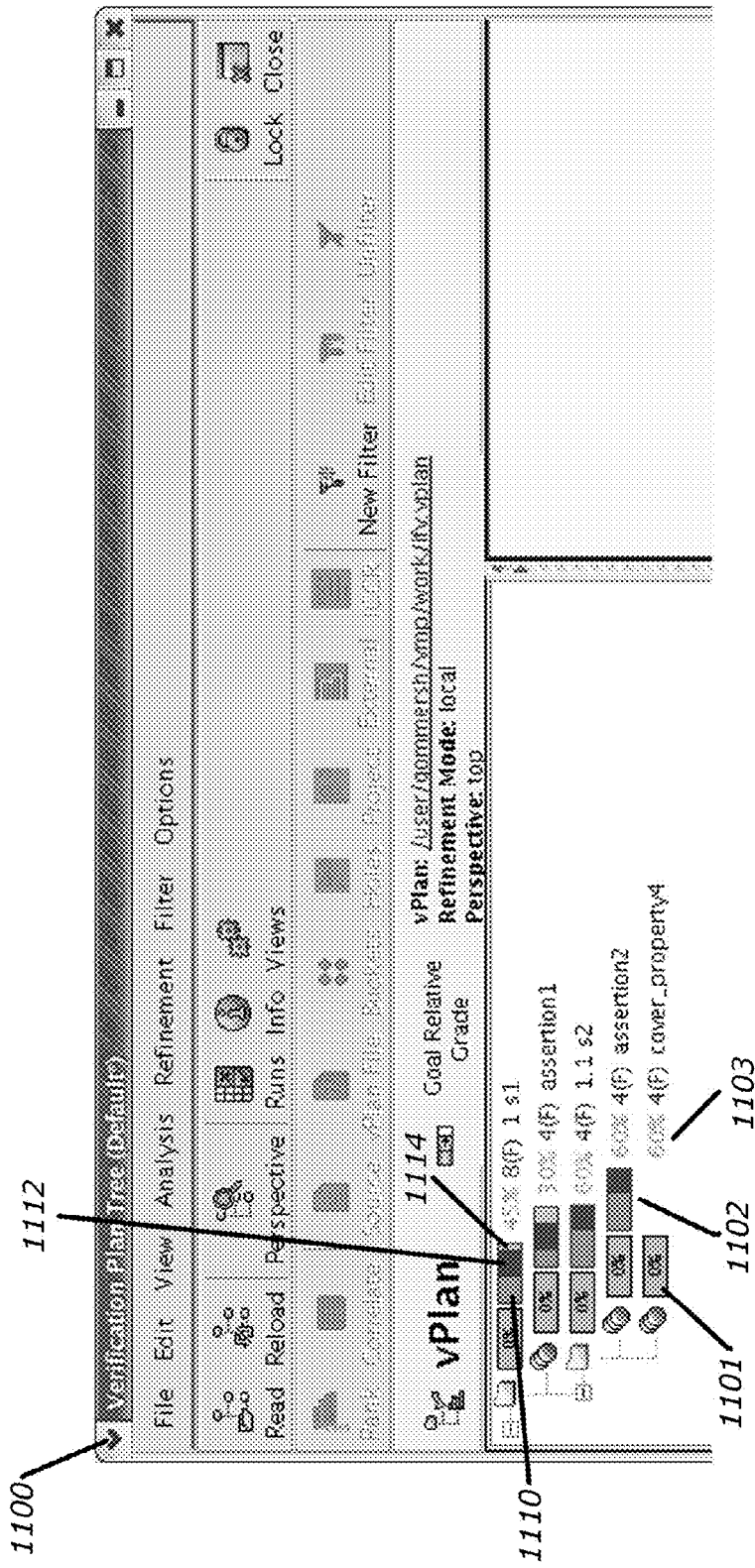
FIG. 11 illustrates a screen shot of an exemplary verification plan (VP) that uses the foregoing formula/algorithm for the calculation of AU results of a section and presents the new grading metric with the coverage grade metric and the check meter.

FIG. 11 illustrates a screen shot of an exemplary verification plan 1100 that uses the foregoing formula/algorithm for the calculation of abstract uniform (AU) check results (AUCR) of a section. The screen shot of the verification plan 1100 shown in FIG. 11 illustrates that:

- The AU results are summed along the hierarchy. For example, 60% of level 1.1 s2 is summed together with 30% of level assertion) (90%) and averaged by dividing by two in order to arrive at 45% at level 1 s1 in the hierarchy.
- The AU results are not presented for cover properties. The cover_property4 is missing a check meter 1102.
- The rollup AU results are presented for sections. The AU results are rolled up for sections at level 1.1 s2 (60%) and level 1 s1 (45%).

Computing Coverage Results

The verification manager (VM) continuously shows the coverage grade for any coverage item and coverage section. Formal verification results contribute to the coverage grades for assertions and cover properties.

Coverage Grade of an Assertion

The coverage grade of an assertion based on its simulation results will be:

$$\frac{FinishedCount}{\max(at\_least, FinishedCount)} \cdot 100$$

Note that the finished count is used instead of the checked count in the coverage grade equation. The coverage grade of an assertion based on its formal results will be:
- 100% if the assertion was traced (or proved),
- 0% otherwise.

The overall coverage grade of an assertion is the maximum between its simulation results and formal results. The rollup grade for a section does not change and continues to be a weighted average of its children.

To merge check and coverage data over multiple runs the following methods may be performed:
- A method of merging abstract check results and tool-specific coverage results across multiple simulation runs.
- A method of merging abstract check results and tool-specific coverage results across multiple formal verification runs.
- A method of merging abstract check results between simulation and formal verification.

Merging Verification Data

At the lowest level, merging check and coverage data amounts to combining the data from one assertion instance record (AI) with the data in a second assertion instance record (TargetAI), and updating the second record so it contains the combined results. This merging will occur in the verification manager (VM), as part of merging check and coverage data within a single run or across multiple runs. The following algorithm is used for this:

```
merge (AI, TargetAI) =
    // aggregate the AU check results
    TargetAI.CheckResult =
        Max(TargetAI.CheckResult, AI.CheckResult);
    // aggregate the tool-specific coverage results
    TargetAI.FailedCount := TargetAI.FailedCount + AI.FailedCount;
    TargetAI.FinishedCount := TargetAI.FinishedCount +
        AI.FinishedCount;
    TargetAI.Failed := Target.AI.Failed or AI.Failed;
    TargetAI.Traced := Target.AI.Traced or AI.Traced;
end;
```

The TargetAI.CheckResult is initially set to the abstract uniform value Other. The function "Max(R1,R2)" compares two abstract uniform values and returns whichever is leftmost in the definition {Failed, Passed, Other}.

Merging Data within a Single Run (Roll-Up by Type)

If a given named subgroup contains instance-level data for multiple instances of the same type (e.g., same (e.g., Verilog, SystemVerilog) module or class, or same (e.g., VHDL) design entity, or same (e) unit or struct), the data for each instance will be merged into an aggregate representation for the type itself. The instance data will remain in the named subtrees that are associated with the named subgroup, and the named subgroup will be updated with merged type data.

The roll-up operation can be done either upon creation of the database for a given run, before the results are written to the file system, or it can be done on demand when the data for one or more runs is being analyzed. If it is done on demand, then it might be done either before the individual run's data is merged with other data, or it might be done in the process of merging the individual run's data with other data.

The set of instances of this type in any named subtree in the named subgroup will be partitioned into subsets that are compatible for merging. The merge process is as follows:

for each compatible subset S of instances of type T in subtrees of named subgroup NS,
    create new type record TR in NS;
    for each instance I of type T in subset S,
        for each assertion instance AI in I (where AI is an instance of some assertion A in T)
            create a corresponding assertion instance AI in TR;

```
        // initialize the metrics in TR.AI;
        TR.AI.CheckResult = Other;
        TR.AI.FailedCount := 0;
        TR.AI.FinishedCount := 0;
        TR.AI.Failed := False;
        TR.AI.Traced := False;
        // merge check and coverage data from AI into TR.AI
        merge(AI, TR.AI);
        end;
    end;
    // merge other coverage data from instance I into TR;
    ... ;
end;
```

Each type record TR should act as if it were a new instance in the named subgroup, so further merging of the updated named subgroup should transparently handle merging of data that has already been merged by type.

Merging Across Multiple Runs

Merging data across multiple runs is done in the verification manager (VM), after all runs are completed and each run's verification data has been stored in a unicov database. Merging is done separately for each verification scope involved in the set of runs. Within each verification scope, merging is done separately for each named subgroup.

During the merge operation, data may be coming from both simulation and formal analysis runs. Since the tool-specific check results have already turned into AU check results, merging the check results across simulation and formal analysis results sets is trivial. For simplicity of the presentation here, we assume that database generated for both simulation and formal analysis includes all four coverage result fields. The implementation may choose to optimize a given database so that it contains simulation-generated or formal analysis-generated data, depending upon which tool produced the database.

Merging across multiple runs is done as follows:
The user selects which runs to consider, based on RunResult (those that are Failed, those that are Passed, or both)
For each verification scope VS involved in the set of runs being considered,
Create and initialize a new database newDB for the merged results;
For each run R associated with VS,

```
For each scenario S defined for R,
    mergedS := the entry in newDB for the merged results of
    scenarios with name S;
    add the value of R.S.Count to mergedS.Count;
end;
For each subtree name N in R
    mergedN := the entry in newDB for the merged results for
    subtrees with name N;
    For each named subtree NST with name N in R,
        Merge the data in NST into mergedN;
    end;
end;
For each subgroup name N in R
    mergedN := the entry in newDB for the merged results for
    subgroups with name N;
    For each named subgroup NSG with name N in R,
        Merge the data in NSG into mergedN;
    end;
end;
end;
end;
```

Combining Simulation and Formal Results on Same Block

During the merge operation, data may be coming from both simulation and formal analysis runs. Since the tool-specific check results have already turned into AU check results, merging the check results across simulation and formal analysis results sets is trivial. In case an assertion has results coming from simulation and formal, the verification manager (VM) will simply sum the #Failed from formal with the Failed# from simulation, and same summary will be done for #NotFailed, #Other.

In order to be able to combine formal and simulation results, the user collects coverage data from the unified simulator (US) and the formal verifier (FV) on the same block. The 'covdut' option can be used to specify to the unified simulator (US) that data from the specified block should be collected.

Combining Simulation and Formal Results from Different Hierarchies

Usually formal and simulation will run on different hierarchies (e.g. formal on block and simulation on full chip). In that case the assertion based verification (ABV) solution will be subject to all the limitations of the coverage driven verification (CDV) solution with respect to analysis of different hierarchies simultaneously. Specifically, the formal results at the block level cannot be projected on the system simulation results, but rather will be presented side by side with the chip level results. In general results from different hierarchies can be combined if they were created on orthogonal models.

Figure 12:
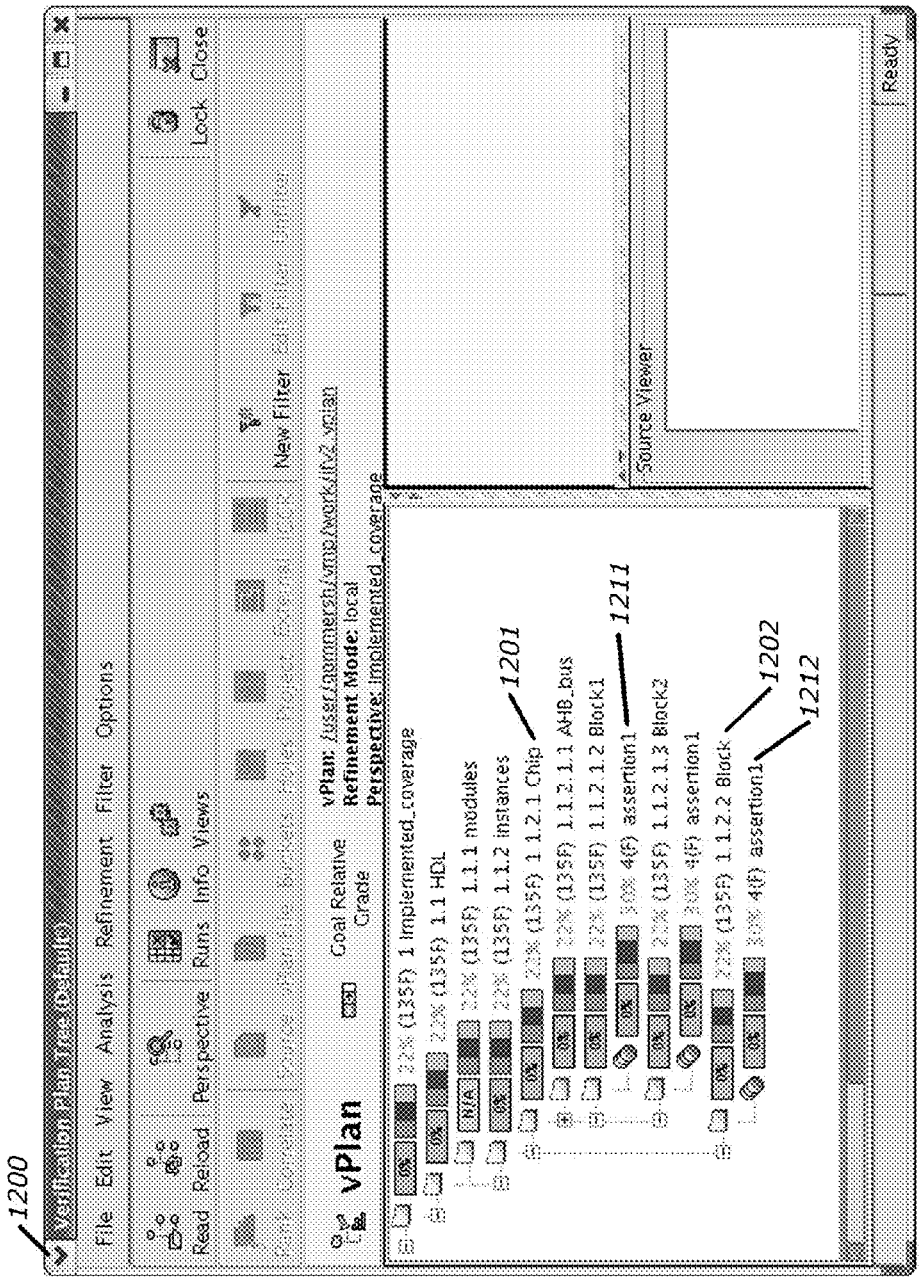
FIG. 12 illustrates a screen shot of exemplary results of the merging unified simulation results (from a unified simulator—US) and formal verification results (from a formal verifier—FV), assuming that the formal verification (coverage) results were created on Block and the unified simulation results were collected on the Chip which might have several blocks in it.

FIG. 12 illustrates a screen shot of exemplary merged results 1200 of the merging of unified simulation results (from a unified simulator—US) and formal verification results (from a formal verifier—FV), assuming that the formal verification (coverage) results were created on Block and the unified simulation results were collected on the Chip which might have several blocks in it.

FIG. 12 shows that the formal results from the Block are not merged inside the simulation results but shown side by side. In case the user is willing to combine them in the verification plan, the user can write a section which refers to both coverage items. In case implementation based mapping is used, then the combination into the section might happen automatically.

The following is pseudocode for a verification plan (VP) Example:

```
section foo {
    Check: Chip.Block1.assertion1; // will get simulation data
    Check: Block.assertion1; // will get the formal data
};
```

As shown in the exemplary FIG. 12, the Block 1202 is at the same level of verification plan hierarchy as the Chip 1201. As described by the pseudocode, the formal verification data or results are stored in the Block.assertion1 level 1212 of the verification plan (VP) hierarchy and the simulation data or results are stored in the Chip.Block1.assertion1 level 1211 of the verification plan (VP) hierarchy. The formal results from the Block are not merged inside the simulation results for the instantiated block in the chip.

Referencing Check and Coverage Data from a Verification Plan

To support plan-based mapping from the verification plan (VP) to check and coverage items collected from verification runs, specific notation is required. The following notational forms may be used:

coverage: [[sessionID.]groupID.]testID

The above form is the current testcase coverage metric, which reflects whether the testcase was run or not. The scenario coverage metric can provide a more flexible and detailed measure of specific testcase success.

The following forms each refer to check and coverage items that are associated with module/class/unit/struct types or instances in the design or verification environment. In these cases, the specification of the target instance or type may involve user-defined verification scope names, subtree names, and subgroup names, as follows. For an instance-based reference, the specification of the target is of the form [scopeID.] subtreeID {.instanceID}
For a type-based reference, the specification of the target is of the form
[[scopeID.] subgroupID.] typeID
In the following, <target> may be of either of the above forms.
coverage: <target> (codecoveragetype)

The above form is essentially the current code coverage form for instance-based and type-based references, extended to allow for specification of verification scope name (scopeID), and a subtree name (subtreeID) for instance-based references, or a subgroup name (subgroupID) for type-based references. Both should be backward compatible with the current definition, since the scopeID is optional (defaults to "default" if not present), the subtreeID is the same as the top-level module name if no subtree is specified, and the subgroupID is optional (defaults to "run" if not specified).

check: <target>.checkID [(<coveragepoint>{, <coveragepoint>}]

The above form allows for reference to the target assertion's AU CheckResult, and optionally to the tool-specific implicit coverage points (FinishedCount, FailedCount, Traced, Failed) associated with the assertion. Both the assertion's CheckResult and the referenced implicit coverage points contribute to the verification plan (VP) section result (check meter coverage grade, respectively).

cover: <target>.checkID-or-coverID [(<coveragepoint>{, <coveragepoint>}]

The above form allows for reference to the target assertion or cover directive's tool-specific coverage points (FinishedCount, FailedCount, Traced, Failed). If the target denotes a check, any of the four coverage points can be specified. If the target denotes a cover directive, FinishedCount or Traced are specified. The referenced coverage points contribute to the verification plan (VP) section result (coverage grade).

scenario: [scopeID.] scenarioID

The above form allows for reference to the scenarioID. Count result for the specified scenarioID.

Detailed Definitions for Check/Cover Forms

Following are proposed syntax definitions for the new check: and cover: forms, also showing how they could be extended to support "at least" specifications for each (implicit or explicit) coverage item. In the following, AI="assertion instance" pathname, and ACI="assertion or cover directive instance" pathname.

Note that shorter keywords (failed, finished, traced) are used instead of the full coverage point names FailedCount, FinishedCount, Failed, Traced. This is intentional, to make what the user must write as simple as possible. Doing so results in "failed" being used for both simulation (FailedCount) and formal analysis (Failed) results. This potential ambiguity is partially resolved by interpreting the presence of an "at least" count as indicating simulation. Also, coverage of assertion failures are typically of interest in the context of success of other assertions (e.g., in a scenario definition), so the verification method will generally be determinable from the context.

```
Tool-independent:
    check:AI                    <==> [include AI.AUCheckResult in CheckMeter]
    cover:ACI                   <==> cover:ACI(finished) or cover:ACI(traced)
    cover:AI(failed)            <==> satisfied iff (AI.AUCheckResult = Failed)
Tool-specific:
  Simulation-only:
    check:AI(finished)          <==> check:AI and cover:AI(finished)
    check:AI([finished] N)      <==> check:AI and cover:AI(finished at least N)
    cover:ACI(finished)         <==> satisfied iff (ACI.FinishedCount>=1)
    cover:ACI([finished] N)     <==> satisfied iff (ACI.FinishedCount>=N)
    cover:AI(failed N)          <==> satisfied iff (AI.FailedCount>=N)
  Formal-only
    check:AI(traced)            <==> check:AI and cover:AI(traced)
    cover:ACI(traced)           <==> satisfied iff (ACI.Traced=True)
  where N>0
```

40

Examples of Check/Cover Forms

Following are examples of the new forms described above.

```
check:top.i1.input_no_overflow;               // add input_no_overflow assertion to CheckMeter
cover:top.i1.input_no_overflow(failed);       // add assertion failure in formal verifier (FV) or
                                              simulator as a coverage item
cover:top.i1.input_no_overflow(failed 1);     // add assertion failure (1x) in simulator as a
                                              coverage item
cover:top.i1.input_no_overflow(failed 5);     // add assertion failure (5x) in simulator as a
                                              coverage item
check:top.i1 .i3.input_fills_fifo(finished 3);   // add input_fills_fifo assertion to
                                              CheckMeter, and
                                              // add assertion occurrence (3x) in simulator as a
                                              coverage item
check:top.i1.i3.input_fills_fifo(finished);   // same as above, but just 1x
check:top.i1.i3.input_fills_fifo(1);          // same as above
cover:top.i1.i3.input_fills_fifo(traced);        // add assertion occurrence in formal verifier
(FV) as a coverage item
cover:top.i1.i3.input_fills_fifo(finished 1); // add assertion occurrence in simulator as a
                                              coverage item
cover:top.i1.i3.input_fills_fifo(finished);   // same as above
cover:top.i1.i3.input_fills_fifo(1);          // same as above
cover:top.i1.i3.input_fills_fifo;                // cover top.i1.i3.input_fills_fifo in either
simulator or fa
check:top.i2.i4.master_req_ack(traced);       // add master_req_ack assertion to CheckMeter, and
                                              // add assertion failure trace in formal verifier (FV)
as a coverage item
```

Presentation

The verification plan (VP) window can present two metrics for each node in the tree:
  Coverage grade metric—presented for sections and coverage items
  Check meter—presented for sections and assertion and testcase coverage items.

The verification manager (VM) always presents the check meter next to a section or an assertion coverage item. (For the FCS this behavior is configurable). The check meter is not presented for functional/code coverage items and for cover properties. A section which has no check items under it, may have a special indication on the check meter.

FIG. 11 illustrates a screen shot of an exemplary verification plan (VP) window 1100. The Verification plan (VP) window 1100 presents a new grading metric. The verification plan (VP) window 1100 includes a coverage grade meter 1101 and a check meter 1102 for checker entities in the plan. In the verification plan (VP) window 1100, bars of the check meter 1102 may be color coded to indicate a metric of the check data. The color coding is as follows:
  Green bar 1110—Not Failed
  Red bar 1112—Failed
  Gray bar 1114—Others Additionally, as can be seen from a comparison of the check meters 1102 at different levels of verification plan hierarchy, the width of the respective bars in each check meter 1102 may vary in order to represent the respective percentages. For example, the width of the green bar 1110 varies to graphically illustrate the percentages of not-failed checks 1103 indicated in the window.

Figure 19:
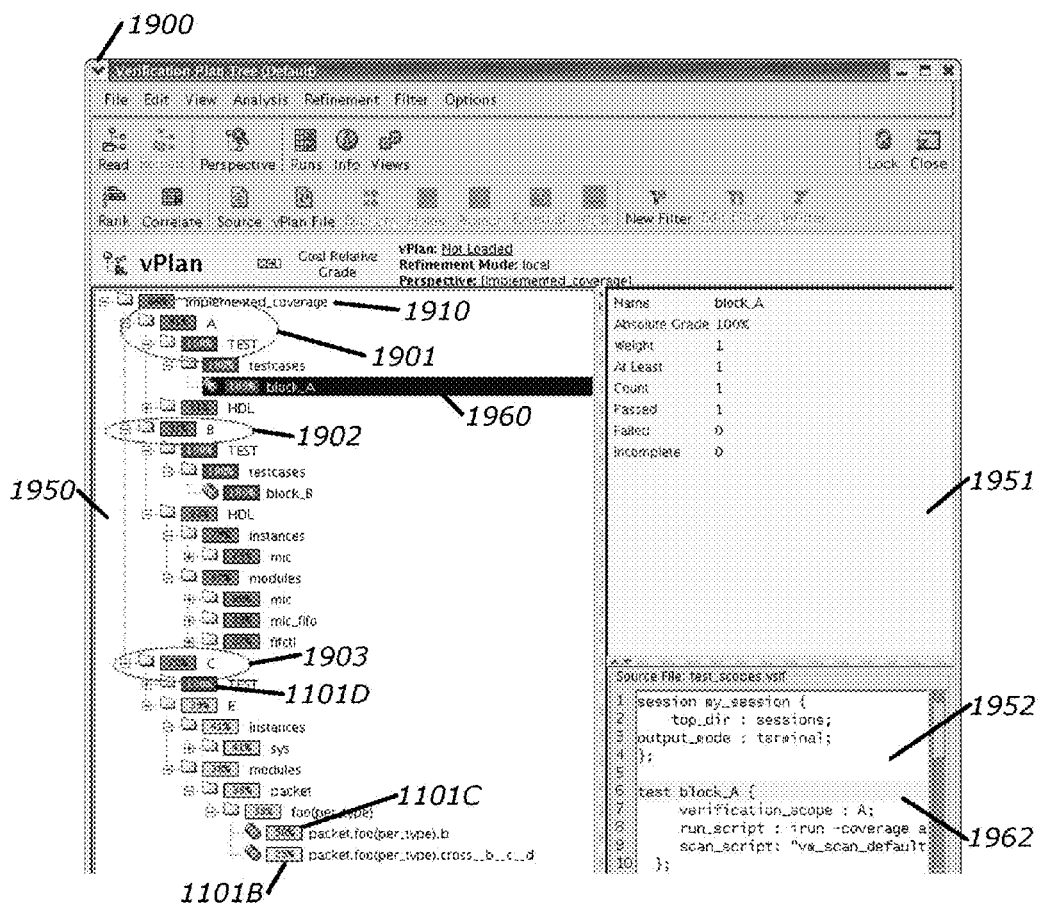
FIG. 19 is a screenshot illustrating a verification plan (VP) with a default verification plan hierarchy when verification scopes are present in the verification manager (VM).

Moreover, the bar of the coverage grade meter 1101 at each level of hierarchy may be color coded to represent the percentage of coverage which may also be indicated by text overlaid on top of each bar of the coverage grade meter. For example in FIG. 11, a coverage grade meter 1101 may be color coded red to indicate a zero percent (0%) coverage grade at the respective level. In FIG. 19, results of a verification plan are shown by a screen shot 1900. In FIG. 19, the coverage grade meter 1101B is color coded yellow to indicate a 25% coverage grade at the respective level. The coverage grade meter may then be color coded shades of green for a coverage grade greater than 33%. For example, coverage grade meter 1101C is color coded with a light green to indicate a 50% coverage grade while coverage grade meter 1101D is color coded with a dark green to indicate a 100% coverage grade.

Combining Simulation and Formal Results on Same Block

During the merge operation, data may be coming from both simulation and formal analysis runs. Since the tool-specific check results have already turned into AU check results, merging the check results across simulation and formal analysis results sets is trivial.

In case an assertion has results coming from a simulation run and a formal verification run, the verification manager (VM) simply sums the #Failed from the formal verification results with the Failed# from the simulation results. The same summary is performed for the #NotFailed and the #Other numbers for the respective formal verification result and simulation result values.

In order to be able to combine formal and simulation results, coverage data from the simulation software tool, also referred to as a unified simulator (US), and the formal verification software tool, also referred to as a formal verifier (FV), are collected on the same block.

Combining Simulation and Formal Results from Different Hierarchies

Usually formal verification and functional simulation are run on different hierarchies (e.g. formal on block and simulation on full chip) of the integrated circuit design. In that case the assertion based verification (ABV) solution will be subject to all the limitations of the coverage driven verification (CDV) solution with respect to the simultaneous analysis of different hierarchies. Specifically, the formal results at the block level cannot be projected on the system simulation results, but rather will be presented side by side with the chip level results. In general, results from different hierarchies can be combined if they were created on orthogonal models.

FIG. 12 illustrates a screen shot of an exemplary result of merging results from a unified simulator (US) and a formal verifier (FV), assuming the formal coverage results were created on Block and the simulation results were collected on the Chip which might have several blocks in it.

FIG. 12 shows that the formal verification results from the Block are not merged inside the simulation results but can be seen side by side. If the user wants to combine them in the verification plan (VP), a section can be written which refers to both coverage items. In the case that implementation based mapping is used, then the combination into the section may happen automatically.

--- verification plan (VP) Example:
section foo {
  Check: Chip.Block1.assertion1; // will get simulation data
  Check: Block.assertion1; // will get the formal data
};

---

Functional Description

Figure 13:
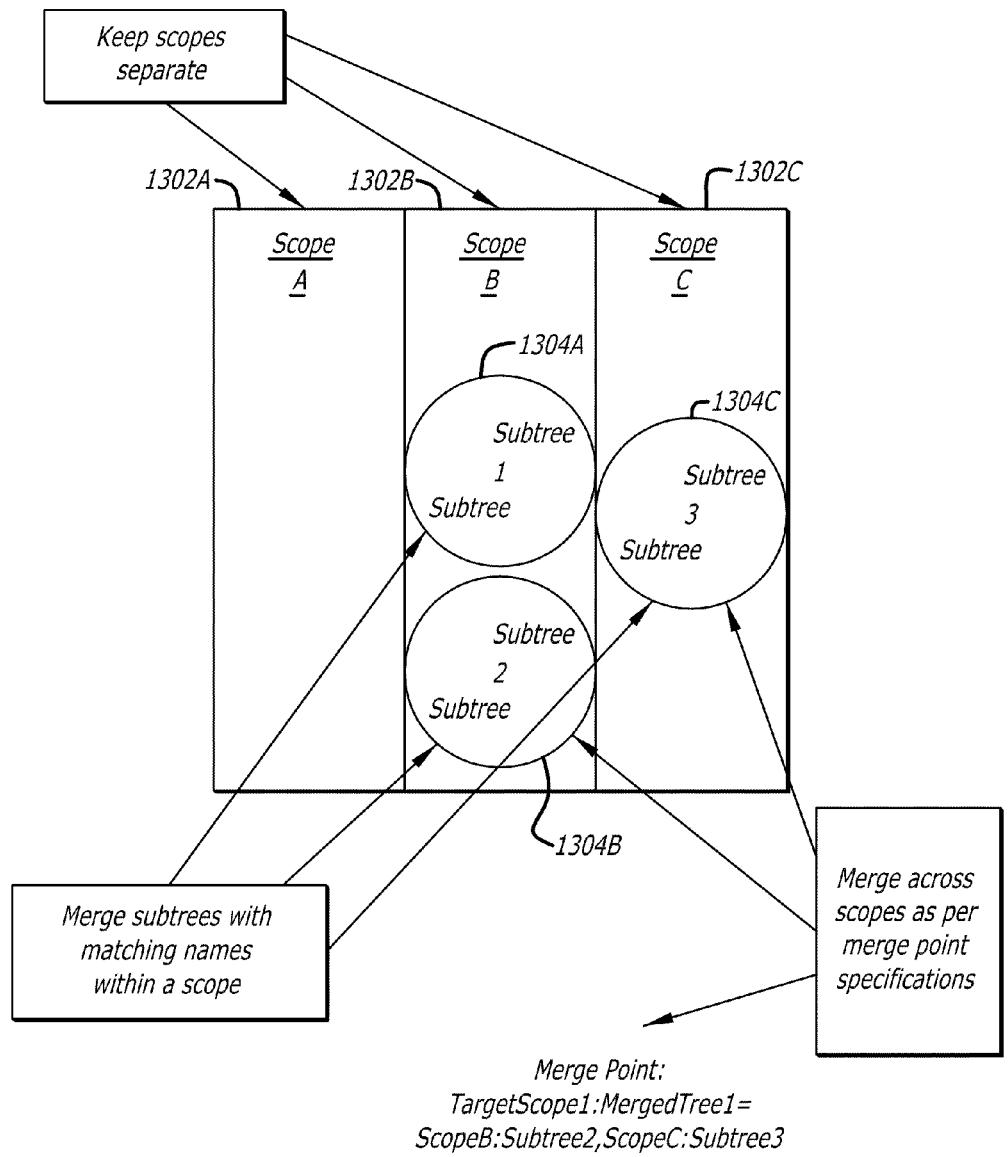
FIG. 13 is a diagram that is used to describe the high-level intent of verification scopes, named subtrees, and merge points.

FIG. 13 is a diagram that may be used to describe the high-level intent of verification scopes, named subtrees, and merge points. Multiple scopes, scope A 1302A, scope B 1302B, and scope C 1302C are shown. Coverage and check results 1304A-1304B are from verification scope B 1302B. Coverage and check results 1304C are from verification scope C 1304C.

As shown in FIG. 13, coverage and check results from the multiple scopes 1302A-1302C are kept separate. The coverage and check results from matching named subtrees within the same scope are merged. For example, if coverage and check results 1304A-1304B within verification scope B 1302B are mapped to subtrees with matching names (e.g., subtree2, subtree2), they may be merged. The coverage and check results across scopes and subtrees are merged as specified using merge points, if any. For example, a merge point of ScopeB:Subtree2, ScopeC:Subtree3 may be defined. In which case, the coverage and check results 1304B-1304C over different verification scopes may be merged together.

Verification Scope

A verification scope (e.g., scope A 1302A, scope B 1302B, and scope C 1302C) is a context in which verification data is typically collected and processed separately from all other verification scopes. A verification scope is characterized by a user-defined name that is associated with each run involving the same verification environment or the same use of a given verification environment. By default, verification data associated with the same verification scope will be merged during analysis in verification manager (VM). The user may also specify that verification data associated with different verification scopes should be merged.

Verification Scopes and Instantiation of Verification Plan Sections

A verification plan section can instantiate a section from the same verification plan or another verification plan. This is a very common scenario while recomposing verification plans. A verification scope can be specified as a parameter of the instantiation. When a section's instantiation is processed, the instantiated section needs to have a verification scope associated with it to process the coverage/check directives contained in it. The determination of verification scope associated with the instantiated section is done using the following rules. Since a section can have multiple verification scopes associated with it, the term "verification scope" in the following refers to a set of verification scopes. The set contains one or more verification scopes.

1. If a verification scope is specified in the instantiation, this verification scope is used for the instantiated section. Hence, all the coverage/check references in the instantiated section are searched for in the verification scope specified in the instantiation.
2. If the instantiated section has the verification scope specified in that section, and the instantiation does not specify a verification scope, the verification scope specified in the instantiated section is used. Hence, all the coverage/check references in the instantiated section are searched for in the verification scope specified in the instantiated section.
3. If the instantiated section does not define a verification scope and the instantiated section does not specify a verification scope, the "default" verification scope is used for the instantiated section. Hence, all the coverage/check references in the instantiated section are searched for in the "default" verification scope.
4. The verification scope parameter of a section instantiation can use the string "this" to specify the verification scope of the section in which the instantiation is done. The keyword "this" refers to the verification scope of the instantiating section and is useful when there are multiple levels of section instantiations
5. The verification scope parameter of a section instantiation can use the string "default" to specify the default verification scope.

FIG. 14 illustrates a table for instantiating a verification plan including column entries of Paths, Verification Scope, and Parameters. In this case, the coverage and check items specified in section "Another_Section" in plan "Another_Plan" will be searched in the verification scope VS1. Consider the following exemplary pseudocode for instantiation of sections a, b, and c:

```
section a {
    verification_scope : A ;
};
section b {
    verification_scope : B ;
    instantiate a {
        verification_scope : this ;
    };
};
section c {
    instantiate b {
        verification_scope : C ;
    };
};
```

FIG. 15 illustrates a table with a column of sections and a column of exemplary verification scope that is used to search the coverage/check references in those respective sections.

Section a has an associated verification scope A. Section b has an associated verification scope B. Section c has an associated verification scope C. Section b.a has the associated verification scope B which is "this" of instantiation of section A in section B—rule no. 4. Section c.b has an associated verification scope C explicitly specified in instantiation of Section B in Section C—rule no. 1. Section c.b.a has an associated verification scope C explicitly specified in instantiation of Section B in Section C and through "this" used in instantiation of section A in section B—rule no. 1 and rule no. 4.

SRS Example AHB VIPs

Figure 16:
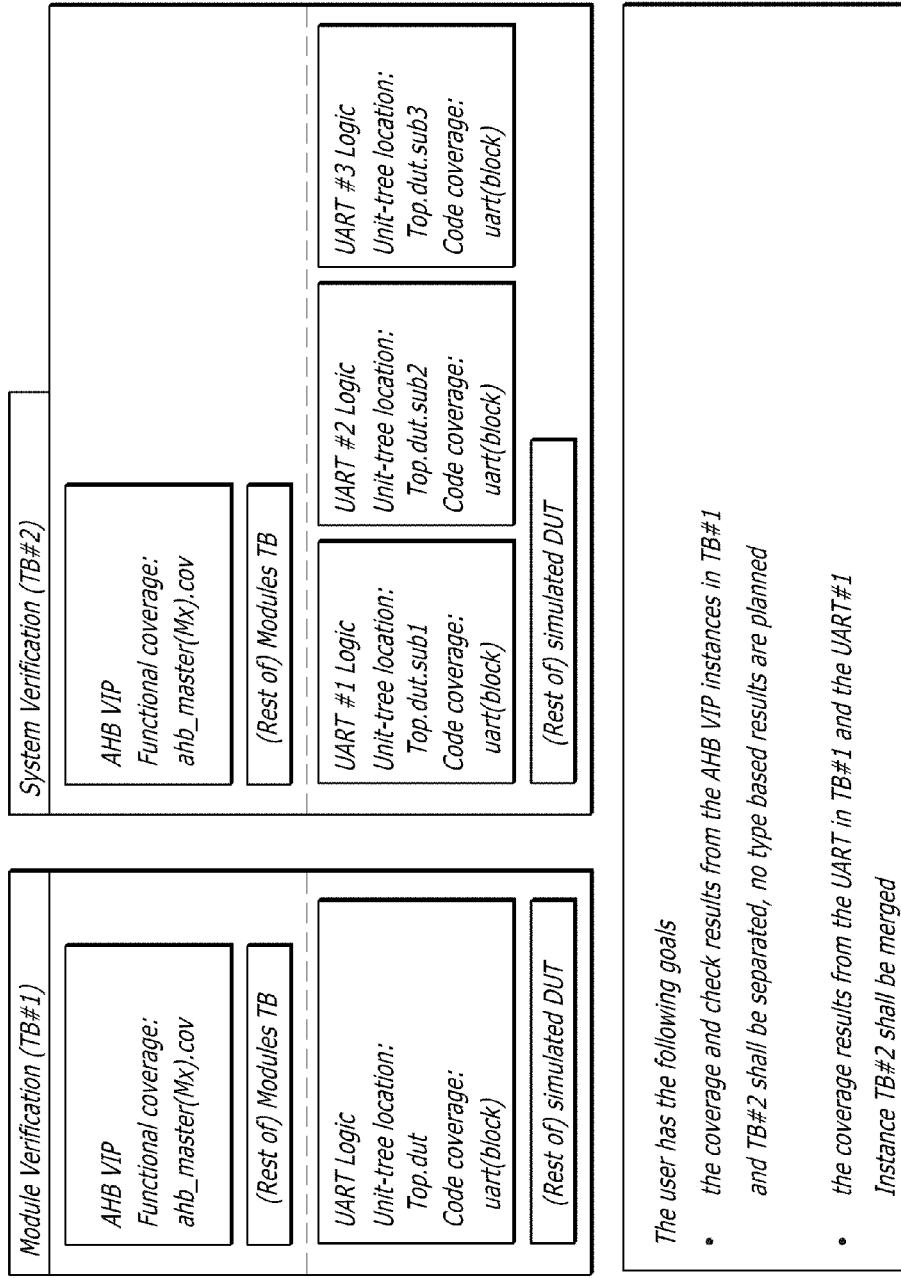
FIG. 16 illustrates a block diagram of different hierarchical levels of verification for verification intellectually property (VIP) modules.

FIG. 16 illustrates an exemplary verification intellectual property (VIP) module, an advanced high performance bus (AHB) verification intellectual property (VIP) module, and its form of requirements when instantiated in an integrated circuit. FIG. 16 shows a first test bench (TB#1) for Module Verification and a second test bench (TB#2) for System Verification. The user has a number of goals in mind with respect to these test benches. The coverage and check results from the AHB VIP instances in the first test bench TB#1 and TB#2 shall be separated with no type based results being planned. Another goal is that the coverage results for the UART in the first test bench TB#1 and the coverage results for the first UART (UART#1) in the second test bench TB#2 shall be merged together.

Figure 17:
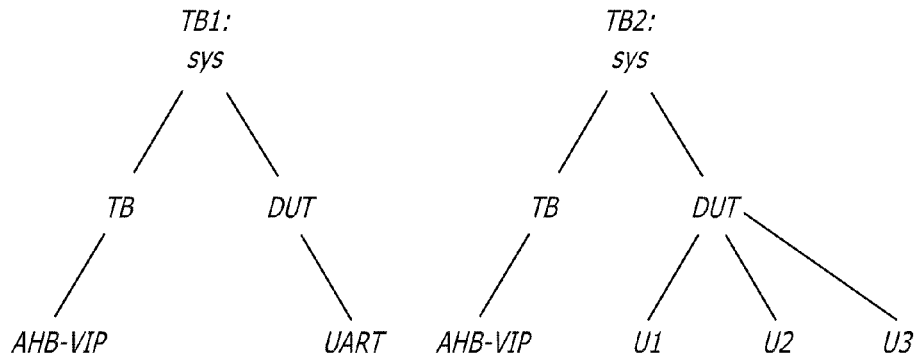
FIG. 17 is a diagram illustrating a hierarchical representation of the two verification runs for verification of the first and second test benches of FIG. 16.

FIG. 17 illustrates a hierarchical representation of the two runs for verification of the first and second test benches shown in FIG. 16.

Using Verification Scopes, Named Subtrees and Merge Points

The problem can also be solved by using all the three concepts of verification scopes, named subtrees and merge points. The specifications in this case would be as follows.

```
test test1 {
    verification_scope: VS1;
    named_subtree: NST1: "sys.TB.AHB-VIP";
    named_subtree: NSUART: "sys.DUT.UART";
}
test test2 {
    verification scope: VS2;
    named_subtree: NST2: "sys.TB.AHB-VIP";
    named_subtree: NSUART: "sys.DUT.U1";
}
``` merge_point: VSUART:MP1 = {VS1:NSUART, VS2:NSUART};

The two runs are in two different verification scopes hence the results are kept separate. In order to merge the UART results as required, a merge point MP1 is defined.

Module-to-System Flow

In this scenario, user performs module and system level verification and tracks information in a system level verification plan. The user intends to refer to merged results for the module from module and system contexts.

Figure 18:
FIG. 18 illustrates a representation of the run hierarchies for the verification plan of FIG. 16.

FIG. 18 illustrates a representation of the run hierarchies for the verification plan. In the block level runs, the DUT is verified by itself. In the system level runs, the DUT is part of a larger system SYS that includes the DUT and memory Mem for example. This problem can be approached in one of the possible ways as explained in the following two subsections.

Using VerificationScopes and Named Subtrees

Consider the following verification scope and named subtree specification.

```
test test1 { named_subtree: NST1: "DUT";
}
test test2 {
named_subtree: NST1: "sys.DUT";
}
```

No verification scope is defined so both the runs belong to the default verification scope. Both runs define a named subtree rooted at the DUT. Both runs have the default named subtree corresponding to the top instance too.

The default verification plan (VP) view with these specifications is as follows.

```
– Verification Metrics
   – default
      + Scenario (testcase) model
      – Functional coverage model
         – Instance based HDL functional coverage
            + sys (default named subtree)
            + DUT (default named subtree)
            + NST1
         + Module based HDL functional coverage
      – Code coverage model
         – Instance based code coverage
            + sys (default named subtree)
            + DUT (default named subtree)
            + NST1
         + Module based code coverage
```

The section DUT contains results from the block level run. The section top contains results from the system level runs. The section NST1 presents results for DUT merged from block as well as system runs.

The user can re-arrange the information using a user written verification plan to recreate the system hierarchy with merged results for the DUT. Consider the following user written verification plan.

```
section sys {
   coverage: sys.* (local);
   section DUT {
      coverage: NST1.*;
   }
   section Mem {
      coverage: sys.mem.*;
   }
}
```

The local coverage of instance sys from the system run is included in the top section named "sys". The subsection DUT includes merged results for DUT from the named subtree NST1. The subsection Mem contains results from memory from the system runs. The verification plan (VP) view for this verification elan is as follows.

```
– sys
   local coverage of sys
   + DUT
   + Mem
```

Using Verification Scopes, Named Subtrees and Merge Points

The problem can also be addressed using all the three concepts of verification scopes, named subtrees and merge points.

Consider the following specifications.

```
test test1 {
verification_scope: Block;
named_subtree: NST1: "DUT";
}
test test2 {
verification_scope: System;
named_subtree: NST1: "sys.DUT";
}
```

```
merge_point: VSBS:MP1 = {Block:NST1, System:NST1};
```

In this case, the block and system level runs are performed in two different scopes, thereby causing the results to be kept separate. An explicit merge point specification causes the results from the specified subtrees to be merged.

Verification Scopes

The verification manager (VM) will support verification scopes to allow simultaneous analysis of multiple coverage models, where coverage results need to be kept separate.

To support verification scopes, the verification manager (VM) will allow specification of the verification scope for each run inside the test container or for a group of runs inside a test-group container of for the whole session inside the session_input block.

EXAMPLE

```
test block_A {
   verification_scope : A;
   run_script:irun -coverage all test.sv;
   scan_script: "vm_scan default.pl ius_hdl.flt";
};
test block_B {
   verification_scope : B;
   run_script : "run_nc_2.sh";
   scan_script: "vm_scan_default.pl ius_hdl.flt";
};
test block_C {
   verification_scope : C;
   run_script:specman -c "load per_instance;test;";
   scan_script: "vm_scan_default.pl";
};
```

Each test can belong to one verification scope. The verification scope name can be an arbitrary string that contains characters, digits, and underscores. (should match [_0-9a-Z].*)

Referring now to FIG. 19, a screenshot of a verification plan (VP) 1900 is illustrated. The verification plan is a verification plan window 1900 graphically displayed on a display device as a graphical user interface. The verification plan window 1900 includes a verification hierarchy window pane 1950, a detail window pane 1951, and a source file window pane 1952 to illustrate the verification results of the verification plan. The verification hierarchy window pane 1950 displays a tree of the verification hierarchy and the verification/ coverage results for the blocks, modules, circuits, etc. in the tree and subtrees. Color coded bars with overlaid coverage percentages may be shown for each row associated with a level of hierarchy, block, module, circuit, assertion instance, coverage point, circuit etc. The detail window pane 1951 illustrates the details of the selected point in the verification hierarchy in the verification hierarchy window pane 1950. In FIG. 19, block A is selected by the highlighted line 1960 to display the verification/coverage result details in the detail window pane 1951. The source file window pane 1952 illustrates the script of the verification scope input file (vsif) that is associated with the verification plan. With block A being selected by the highlight line 1960 in the verification hierarchy window pane 1950, the associated script test block A is highlighted by the highlight line 1962 in the source file window pane 1952.

The verification plan 1900 illustrated in FIG. 19 has a default verification plan hierarchy shown in the verification hierarchy window pane 1950 when different verification scopes are present in the verification manager (VM). For example, the overall scope or implemented coverage 1910 of an integrated circuit chip has verification scope A 1901, verification scope B 1902, and verification scope C 1903 in the verification plan hierarchy.

As shown in the screenshot of FIG. 19, different verification scopes may reside in different subtrees of the scope's trees. The coverage model of each respective verification scope will be presented under each respective scope's tree. In the case a user defines one verification scope input file (vsif) in which there are different portions that belong to different verification scopes, the verification manager (VM) will put portions of the vsif into the different verification scopes.

Verification Planning

In order to refer to verification scopes, one should explicitly say for the coverage item, what is the verification scope from which it is picked. When the verification scope is not specified, the verification manager (VM) will look for the item in all verification scopes. For a particular item, one can specify the verification scope using the "coverage { }" container.

EXAMPLE

```
Coverage foo {
    sys.packets[0].foo.item_x;
    verification_scope : C;
}
```

Alternatively the user can say for the whole section that it refers to a certain verification scope, which can be done using a new style called verification_scope.

EXAMPLE

```
Section foo {
    Verification_scope : C;
    Coverage : sys.packets[0].foo.item_x;
};
```

The verification scope will apply to the section in which it was defined and to all of its subsections recursively. Inner sections can override the verification scope settings of the upper sections. In addition to that the user can specify a verification scope to an instantiate section at the moment of the instantiation. This can be done using the verification plan (VP) reference table in the verification plan by using an additional column in the verification plan (VP).

The verification scope attribute can also contain a list of verification scopes in which the specified pattern should be located. The list should be comma separated. For example, the following is a list of verification scopes where the specified pattern should be located:
    Verification_scope: A,C;
The Default Verification Scope
    In case some runs do not contain an explicit verification scope, they will be assigned to the default verification scope. The coverage results of the default verification scope will appear at the top level.

EXAMPLE

```
test block_A {
    verification_scope : A;
    run_script:irun -coverage all test.sv;
    scan_script: "vm_scan_default.pl ius_hdl.flt";
};
test block_B {
    verification_scope : B;
    run_script : "run_nc_2.sh";
    scan_script: "vm_scan_default.pl ius_hdl.flt";
};
test block_C {
    run_script:specman -c "load per_instance;test;";
    scan_script: "vm scan default.pl";
};
```

Figure 20:
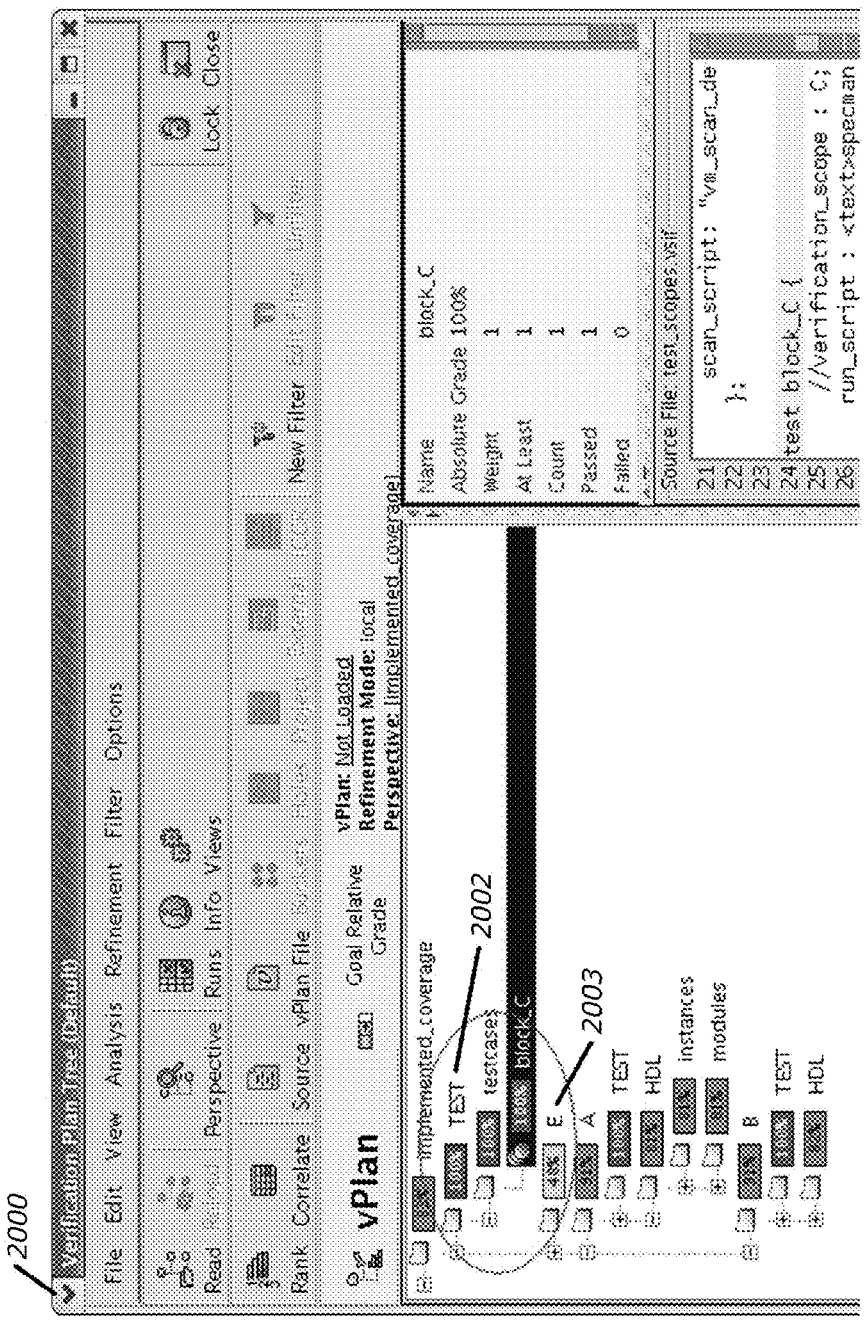
FIG. 20 is an exemplary screen shot illustrating the output results for a default verification scope.

FIG. 20 illustrates an exemplary screen shot of the output results in a verification plan window 2000 for a default verification scope. The verification scope C 1903 shown in FIG. 19 is not specified. As a result, the coverage results for TEST 2002 and E 2003 are at the top level of the verification hierarchy as shown in FIG. 20. In contrast, with the verification scope C 1902 TEST and E are at under the verification scope C 1902 as shown in FIG. 19. If the user wants to explicitly refer to coverage from the default verification scope, he can specify it by saying: "verification_scope: default;" in the verification plan (VP).

Named Subtree

A named subtree is a subtree in a verification hierarchy, starting at a merge point, and including all instances instantiated directly or indirectly below that merge point, up to but not including any instances that are also merge points. A named subtree is therefore characterized by the merge point that is its root, together with any merge points that are the roots of lower subtrees that are excluded from the named subtree.

Named Subtrees Specification

A named subtree is associated with a test. A named subtree may be specified in the vsif file such as follows:

```
named_subtree: <id>: "<path>";
id is identifier
path is HDL/HVL instance path to root of the named subtree
```

The "path" field in the named subtree can be an HDL path or HVL/e path. The qualifier string "(hdl)" or "(e)" can be used as a prefix to distinguish between HDL and e paths. The HDLs supported include Verilog, VHDL, SystemVerilog and SystemC. The path is relative to the top levels in a coverage model in the case of coverage collected from unified simulator (US).

Similar to verification scopes, a named subtree can be specified for a test in the test container, for a group of tests in the test-group container or for the entire session in the session container. There can be one or more subtree specifications associated with a test. Named subtree specifications at a lower level of hierarchy in the vsif are added to the named subtree specifications at a higher level in the vsif. It can be viewed as a resolution policy for determining the verification scope and named subtree associated with a test.

For verification scopes, the innermost specification takes effect.

For named subtrees, the specifications are accumulated.

One or more default subtrees are always defined and created for each test. The roots of the default subtrees correspond to the top levels in the forest of instances which is dumped in the coverage and check database model. The ids for these default subtrees are same as the names of the top level instances in the forest of instances in the model. A named subtree extends from root all the way to leaf level instances. It is valid to specify multiple named subtrees with the same root. Consider a first example specification of named subtrees as follows:

Example 1

```
test test1 {
    verification_scope: VS1;
    named_subtree: NST1: "dut.ctrl1.arb1";
    ...
}
test test2 {
    verification_scope: VS2;
    named_subtree: NST2: "sys.master1.ctrl1.arb1";
    ...
}
```

Example 1 defines two tests, test1 and test2. The test container for each test defines a verification scope and a named subtree. The test test1 defines verification scope VS1 and gets associated with it and defines a named subtree NST1 with hierarchical instance path "dut.ctrl1.arb1" as the root of the named subtree. Similarly, test test2 defines verification scope VS2 and gets associated with it, and defines a named subtree NST2 with hierarchical instance path "sys.master1.ctrl1.arb1" as the root of the named subtree.

Additionally, test1 has a default named subtree associated with it. The default named subtree had id "dut" and is rooted at "dut". Similarly, test2 has a default named subtree with id "sys" and rooted at "sys", associated with it.

Consider a second example specification of named subtrees as follows:

Example 2

```
group A {
    named_subtree: CMNST: "dut.a";
    test test1 {
        named_subtree: NST1: "dut.ctrl1.arb1";
        ...
    }
    test test2 {
        named_subtree: NST2: "dut.ctrl1.counter1";
        ...
    }
    ...
}
```

In Example 2, the two tests have a named subtree defined each. In addition each test has a default named subtree with id "dut" rooted at "dut". The group specific named subtree "CMNST" is also another subtree associated with each of the two tests. Thus, each test has three named subtrees associated with it.

Error Reporting:

Invalid hierarchy specified as subtree root: An error is reported by the verification manager (VM) if an invalid hierarchy node is specified as subtree root. This is reported in the verification manager (VM) console at the time of analysis.

Same subtree name for two nodes in the same run: An error is reported by the verification manager (VM) if the same subtree name is specified for two nodes in the same run.

Same subtree name for parent and child: An error is reported by the verification manager (VM) if the same subtree name/id is specified in the same scope in two different runs for two nodes which happen to have parent-child relationship. This is reported in the verification manager (VM) console at the time of analysis.

Same subtree name for roots with different type: An error is reported by the verification manager (VM) if the same subtree name/id is specified in two different runs for two nodes which happen to be of different type. This is reported in the verification manager (VM) console at the time of analysis.

Explicitly defined subtree's id clashes with one of the default subtrees: An error is reported by the verification manager (VM) when an explicitly defined subtree has its id same as one of the top level instances in the model (thereby creating a default named subtree for it). The error is reported in the verification manager (VM) console at the time of analysis.

Named Subtrees and Model Merge (Advanced Analysis)

A major objective of verification scopes and named subtrees is to allow the user to control the merging of coverage and check information. At the core of the merging is a model union algorithm.

When multiple verification runs have resulted into multiple check/coverage models, in the analysis of these runs the models are merged before correlating the check/coverage data. The model union algorithm uses a union operation to union coverage elements across models and identifies conflicting elements using checksums. Generally, with the model union algorithm coverage elements are matched using names and an element not already present is added to the model. For coverage elements having matching names but a different type or checksum, the element from the model which was generated latest is retained in the unioned model and the coverage element is marked.

Pseudo-code may be used to describe the model union algorithm as follows below. Examples of merging models with the model union algorithm are illustrated in FIGS. 21A-26.

```
Given n models, {m1, m2, ... mn} determine Mu, the unioned model.
Prepare a sorted list L of models in reverse chronological order of the
datestamp on the model files.
Mu = L.head( ); /* the first element of the list L */
for each model mt in the sorted list L do
{
        merge_model (Mu, mt);
}
merge_model (m1, m2)
{
    if (checksums(m1) == checksums (m2))
        return;
    union_tool_flags(m1, m2);
    for each top-level instance top_m2 in model m2
    {
        if (if top-level instance top_m1 with identical
            name as that of top_m2 found in model m1)
        {
            if (module names of top_m1 and top_m2 are identical)
                merge_inst(top_m1, top_m2);
            else
            {
                issue a warning message;
                mark top_m1 "CONFLICT-WITH-LOSS-OF-DATA";
            }
        }
        else
        {
            add top_m2 and its hierarchy as an additional
            top-level instance in model m1;
        }
    }
    for each module mod_m2 in module list of model m2
    {
        if (module mod_m1 with identical name as
            that of mod_m2 found in model m1)
        {
            merge_module(mod_m1, mod_m2);
        }
        else
        {
            add module mod_m2 to module list of model m1;
        }
    }
}
merge_module(mod1, mod2)
{
    merge_cc(mod1, mod2);
    merge_fc(mod1, mod2);
}
merge_inst(i1, i2)
{
    merge_cc(i1, i2);
    merge_fc(i1, i2);
    for each child child_i2 of instance i2
    {
        if (child_i1 of i1 with identical name as that of child_i2 is found)
        {
            if (module names of child_i1 and child_i2 are identical)
                merge inst(child_i1, child_i2);
            else
            {
                issue a warning message;
                mark child_i1 "CONFLICT-WITH-LOSS-OF-DATA";
            }
        }
        else
        {
            add child_i2 and its hierarchy as child of i1;
        }
```

```
    }
}
merge_cc(node1, node2)
{
    if (ldc(node1) == 0) && (ldc(node2) != 0)
        copy code coverage of node2 to node1 including ldc;
        else if (ldc(node1) != 0) && (ldc(node2) != 0) && (ldc(node1) !=
        ldc(node2))
        {
            issue a warning message;
            mark node1 "CONFLICT-WITH-LOSS-OF-DATA";
        }
}
merge_fc(node1, node2)
{
    for each assertion A2 in node2
    {
        if (assertion A1 with identical name as that of A2 exists in node1)
        {
            if (checksum(A1) != checksum(A2))
            {
                issue a warning message;
                mark A1 "CONFLICT-WITH-NO-LOSS-OF-DATA";
                /* In vm-ABV EA, the mark would be "CONFLICT-WITH-
LOSS-OF-DATA". The mark "CONFLICT-WITH-NO-LOSS-OF-
DATA" would be in 8.1 */
                propagate mark up to assertion summary;
            }
            union_tool_flags(A1, A2);
        }
        else
            add A2 (along with its checksum) to assertion list of node1;
    }
    for each covergroup cg2 in node2 /* cg2 could be covergroup type
or covergroup instance */
    {
        if (covergroup cg1 with identical name as that of cg2 exists in
        node1)
        {
            for each coverpoint cp2 in cg2
            {
                if (coverpoint cp1 with identical name as that of cp2 found in
                cg1)
                {
                    if (checksum(cp1) != checksum(cp2))
                    {
                        issue a warning message;
                        mark cp1 "CONFLICT-WITH-LOSS-OF-DATA";
                        propagate mark up to covergroup and functional summary;
                    }
                }
                else
                {
                    add cp2 (along with its checksum and bins) to covergroup
                    cg1;
                }
            }
        }
        else
            add cg2 (along with its coverpoints and checksums) to covergroup
            list of node1;
    }
}
```

FIGS. 21A-21B and 22-26 illustrate examples of exceptional cases of merging models with the module union algorithm. In each example, assume that the second model, Model 2, is generated later in the design cycle than the first model, Model 1. The symbol U in the figures represents the union function while the model after the equal sign denotes the model union.

Figure 21A:
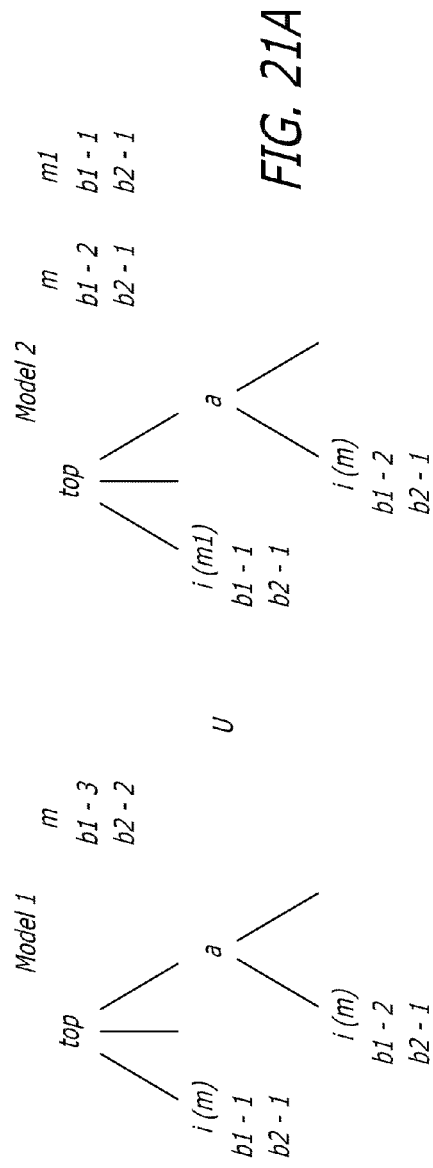
FIGS. 21A-21B illustrate a hierarchy of two models and a union merge thereof

FIG. 21A illustrates two models, Model 1 and Model 2, having substantially similar hierarchy and coverage points in the modules. However, there is a difference between the two models, Model 1 and Model 2, in the instance of top.i. The instance of top.i in the first module, Model 1, indicated by i(m1) is that of module m. The instance of top.i in the second module, Model 2, indicated by i(m1) is that of module m1.

Figure 21B:
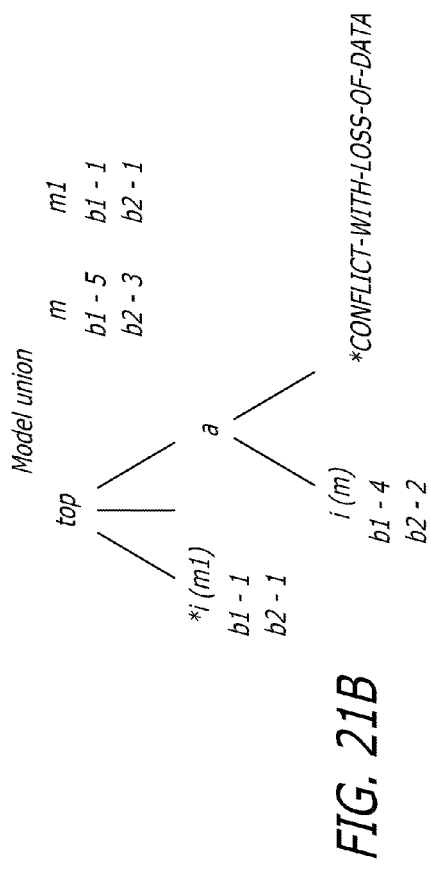

FIG. 21B illustrates the results of the union merge of the two models, Model 1 and Model 2, illustrated in FIG. 21A. Due to the difference in the instance of top.i in each of the two models, Model 1 and Model 2, illustrated in FIG. 21A, the merged model union (unioned model) shown in FIG. 21B has a mark * being associated with the instance of top.i. The mark indicates a conflict across models and that there may be a loss of data when data is merged into the unioned model.

FIG. 22 illustrates the case where the second model Model 2 has an instance that matches the pathname of an instance in the first model Model 1 but the module that is instantiated is different. That is, the path to the instance i is the same but the module instantiated at that point is module m in the first model Model 1 and the module instantiated in the second model Model 2 at that point is module m'. Different modules m and m' having the same pathname in the hierarchy of the models being merged, results in the unioned model have a mark * associated with the instance i. The mark indicates a conflict with a potential loss of data.

FIG. 23 illustrates the case where the two models, Model 1 and Model 2, have different instances i and i1, respectively. Merging these two models together with the different instances results in the unioned model containing both the instances as shown in FIG. 23.

Figure 24:
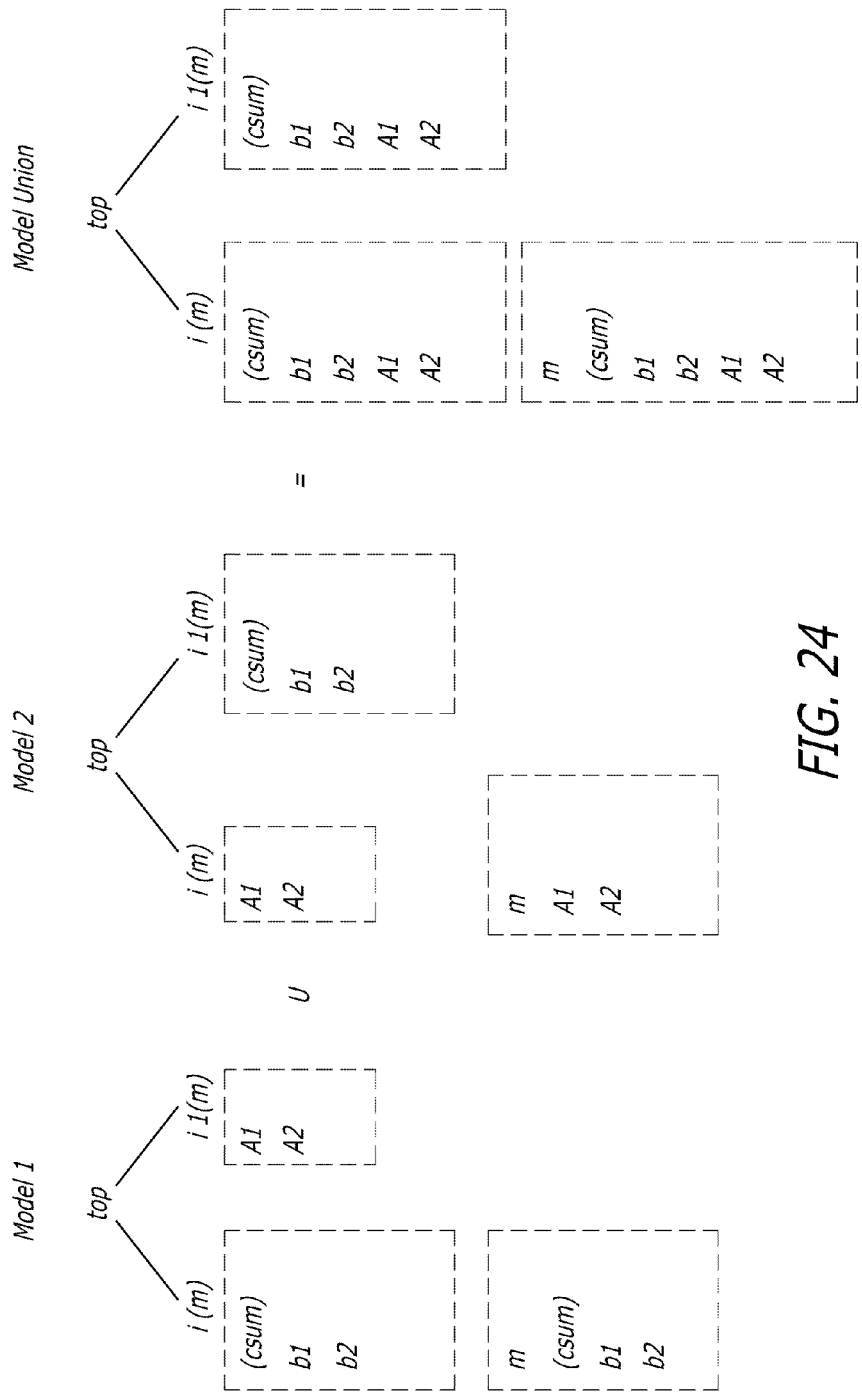

FIG. 24 presents the case of model merging where different code coverage configurations and assertions are used in the two models, Model 1 and Model 2.

The first model Model 1 has instance i with block coverage enabled and an instance i1 with two assertions. This causes instance i to contain information of blocks as indicated by b1 and b2 and a code coverage checksum indicated by csum. The instance i1 in the on the other hand has assertions A1 and A1 with their associated checksum. The module m is same as instance i since a representative instance is picked as a module and the representative instance in this case happens to be instance i. The module m includes the information of blocks as indicated by b1 and b2 and the code coverage checksum indicated by csum.

For the second model, Model 2, the instance hierarchy is same as the first model. The second model has an instance i with two assertions A1 and A1 and instance i1 with block coverage enabled as indicated by blocks b1 and b2 and a code coverage checksum csum. The module m in the second model Model 2 contains the two assertions as those in instance i.

On application of the union algorithm to the two models shown in FIG. 24, the resulting unioned model has block coverage as well as assertions in both instances i and i1, as well as in module m.

FIG. 25 illustrates the case where there is a difference in checksum of an assertion across two models as indicated by cs1 and cs3 for the same assertion A1 used for each of the two models, Model 1 and Model 2. Note that the checksum is the same for the same second assertion A2 used for each of the two models. The resultant unioned model in this case has its first assertion marked to indicate that a conflict exists and there is a potential loss of data. If the merge is still in process and data from all the runs is still being merged to the model, there may be no loss of coverage data. In the verification plan window, the unioned model is marked with CONFLICT-WITH-LOSS-OF-DATA", there will be a special mark in the verification plan (VP) window and html reports.

The model merge algorithm can be enhanced to allow merging for different configurations of code coverage. Four different checksums can be stored for each model instance, namely a block checksum, an expression checksum, an FSM checksum, and a toggle checksum. The merge_cc portion of the union merge algorithm is altered as shown in the pseudo-code that follows below.

```
merge_cc(node1, node2)
{
for each coverage_type in {BLOCK, EXPR, FSM, TOGGLE}
{
  case coverage_type
    BLOCK:
    {
        if (block_csum(node1) == 0) && (block_csum(node2) != 0)
          copy block coverage of node2 to node1 including
          block_csum and flags;
        else if (block_csum(node1) != 0) && (block_csum(node2) != 0)
        && (block_csum(node1) != block_csum(node2))
        {
          issue a warning message;
          mark node1 "CONFLICT-WITH-LOSS-OF-BLOCK-DATA";
        }
    }
    EXPR:
    {
        if (expr_csum(node1) == 0) && (expr_csum(node2) != 0)
          copy expression coverage of node2 to node1 including
          expr_csum and flags;
        else if (expr_csum(node1) != 0) && (expr_csum(node2) != 0)
        && (expr_csum(node1) != expr_csum(node2))
        {
          issue a warning message;
          mark node1 "CONFLICT-WITH-LOSS-OF-EXPR-DATA";
        }
    }
    FSM:
    {
        if (fsm_csum(node1) == 0) && (fsm_csum(node2) != 0)
          copy fsm coverage of node2 to node1 including
          fsm_csum and flags;
        else if (fsm_csum(node1) != 0) && (fsm_csum(node2) != 0)
        && (fsm_csum(node1) != fsm_csum(node2))
        {
          issue a warning message;
          mark node1 "CONFLICT-WITH-LOSS-OF-FSM-DATA";
        }
    }
    TOGGLE:
    {
        if (toggle_csum(node1) == 0) && (toggle_csum(node2) != 0)
          copy toggle coverage of node2 to node1 including
          toggle_csum and flags;
        else if (toggle_csum(node1) != 0) && (toggle_sum(node2) != 0)
        && (toggle_csum(node1) != toggle_csum(node2))
        {
          issue a warning message;
          mark node1 "CONFLICT-WITH-LOSS-OF-TOGGLE-DATA";
        }
    }
}
}
```

FIG. 26 illustrates an example of model merge with the added checksum information. The first model, Model 1, has an instance top.i with block and toggle coverage as indicated by the check sums block_csum1 and toggle_csum1. The same instance in the second model (Model 2), instance top.i, has identical block coverage but an additional expression coverage and a modified toggle coverage. The additional expression coverage is indicated by the check sum expr_csum1 and the modified toggle coverage is indicated by the check sum toggle_csum2. The unioned model, the result of a merge of the first and second models, has block, expression and toggle coverages as indicated by the check sums. However, the unioned model and the instance is marked with "CONFLICT-WITH-LOSS-OF-TOGGLE-DATA" to due to the conflict in the toggle checksums indicating differences in the toggle coverage.

If a model or instance is marked with a type "CONFLICT-WITH-LOSS-OF-DATA" for block, expression, toggle, or FSM coverages, a special mark is added to the verification plan (VP) window and html reports to flag the user. If a model or instance is marked with a type "CONFLICT-WITH-NO-LOSS-OF-DATA", a different special mark is added to the verification plan (VP) window and html reports to flag the user.

To use model union for the verification manager (VM) analysis, the user selects "UNION", under the "VPLAN" tab of configuration window. The option is available under section titled "Coverage Merging" for option against "Upon multiple coverage models.

During the union operation, warning messages may be issued in case of checksum mismatches at various points in the union algorithm. Additionally, during analysis, the objects having conflicts across multiple models are identified in the graphical user interface (GUI) and in HTML/text reports that may be provided to the user.

In the presence of verification scopes and named subtrees, the model union (unioned model) may be formed as follows.

For the set of verification runs to be analyzed, the order in which models will be loaded is determined using user settings in the verification manager (VM).

```
SetOfScopes S = null;
for each model M in the ordered list
{
locate scope VS of M in S;
if VS not present in S
    add VS to S with empty model VS.model;
/* so far a scope has been created for analysis
    if not already present */
for each named subtree NST in model M
/* Go over each named subtree definition, i.e. if same
    subtree name is used for multiple hierarchical paths,
    go over each of them as part of this loop */
{
 nst_copy = copy_subtree(M, NST.name, NST.hier_path);
 merge_model(VS.model, nst_copy);
 /* merge_model is slightly modified version in the sense that it
    uses nst_copy as a model with NST.name as the id and assumes
    NST.name as the name of the root of the tree for the purpose
    model union */
 delete(nst_copy);
}
merge_model(VS.model, M); /* In the end merge the entire model,
    it being the default named subtree */
}
```

The pseudo-code above explains the way models would be merged or kept separate based on verification scopes and named subtree definitions. The projection of the data from each run would be done as explained in the pseudo-code below.

```
SetOfScopes S = null;
for each data D
{
identify the scope VS to which D belongs;
for each named subtree NST in D
{
    nst_copy = nst_data_copy(D, NST.name, NST.hier_path);
    project(nst_copy, VS.model);
    /* involves locating named subtree in model and connecting */
    /* nst_copy is not being deleted here as it might be required
        for multiple projection operations. It gets deleted if the
        entire data itself is deleted */
```

```
/* Note: rucd is not discussed here to avoid confusion and keep
    the conceptual explanation simple */
}
}
```

Merge Points

A merge point is an instance in a verification hierarchy (i.e., in the design under test or its verification environment) that is the root of a subtree for which verification data will be merged across multiple runs. A merge point is characterized by a target scope (where the merge results should be stored), a name (under which the results are accessible), and a set of logical {scope:named subtree} pairs that should be merged. Merge points allow users to specify named subtrees across verification scopes that user wants to merge.

Specification and analysis using verification scopes and named subtrees, as described in previous section, follows a typical verification manager (VM) flow, roughly described as follows.

Specify test specifications in vsif along with verification scopes and named subtrees
Specify verification scopes and named subtrees in verification plan
Perform runs using vsif
Load/analyze sessions/runs
Analyze using default verification plan (VP) view
Read user written verification plan
Analyze using user written verification plan The rest of this section describes specification of merge points and analysis in presence of merge points.

Merge Point Specification

Unlike named subtrees, merge points are most likely to be used across scopes and hence the specification of merge points cannot be associated with a test in the vsif file. Merge points are defined in the user written verification plans and are specified under the "mergepoint" attribute of a section. The attribute "merge_point" is a new section attribute. A section can have zero or more merge point specified in it. The specification of merge points may be done using the following syntax.

```
merge_point: [<scope>:]<id> = { [<scope>:]<named subtree>,
    [<scope>:]<named_subtree>, ...};
merge_point is a new section attribute
id is identifier
<scope> is a verification scope
<named_subtree> is a named subtree
```

A merge point specification consists of two parts. The first part is the scope and named subtree that are created for the merge point. The second part is a list of scope and subtree pairs that are merged to create the merge point. In the example shown in FIG. 13, a merge point of TargetScope1: MergedTree1=ScopeB:Subtree2, ScopeC:Subtree3 may be specified to merge the coverage and check results 1304B-1304C over the different verification scopes of scopeB 1302B and scopeC 1302C. A different merge point of TargetScope2: MergedTree2=ScopeB:Subtree1, ScopeB:Subtree2 may be specified to merge the coverage and check results 1304A-1304B for different named subtrees within the same scope of scopeB 1302B.

The first part of a merge point specification is specified as [<scope>:]id. A merge point specification creates a named subtree with name id in the specified scope. Not specifying the scope refers to the default scope, i.e. a named subtree with name id is created in the default scope with the name "default".

The second part of a merge point specification is a list enclosed with curly braces. The list is a list of scope and subtree pairs specified in the form [<scope>:]id. The id refers to the id of the named subtree to be included in the merge. When scope is not specified, the named subtree is searched in the default scope.

It would be an error if the same merge point id is specified to define more than one merge point within the same scope. It would be an error if the merge point specification tries to create a named subtree which already exists due to previous scope and named subtree specifications.

Consider a first example of a merge point specification as follows:

merge_point: MP1 = {VS1:NST1, VS2:NST2};

This merge point specification specifies a merge point with identifier "MP1". It specifies the two named subtrees, NST1 from verification scope VS1 and NST2 from verification scope VS2, to be merged. The merged results are to be presented as named subtree MP1 under the default scope.

Named Subgroup

A named subgroup is a set of named subtrees from the same hierarchy. A named subgroup is characterized by a user-defined name that denotes the set of named subtrees and associated verification data. A named subgroup defines a context in which verification data is to be rolled up by type, in addition to being collected by instance.

Merging Data within a Single Run (Roll-Up by Type)

If a given named subgroup contains instance-level data for multiple instances of the same type (e.g., same (Verilog, SystemVerilog) module or class, or same (VHDL) design entity, or same (e) unit or struct), the data for each instance will be merged into an aggregate representation for the type itself. The instance data will remain in the named subtrees that are associated with the named subgroup, and the named subgroup will be updated with merged type data.

The roll-up operation can be done either upon creation of the database for a given run, before the results are written to the file system, or it can be done on demand when the data for one or more runs is being analyzed. If it is done on demand, then it might be done either before the individual run's data is merged with other data, or it might be done in the process of merging the individual run's data with other data.

The set of instances of this type in any named subtree in the named subgroup will be partitioned into subsets that are compatible for merging. The merge process is as follows:
for each compatible subset S of instances of type T in subtrees of named subgroup NS,
    create new type record TR in NS;
    for each instance I of type T in subset S,
    for each assertion instance AI in I (where AI is an instance of some assertion A in T)
    create a corresponding assertion instance AI in TR;

```
       // initialize the metrics in TR.AI;
       TR.AI.CheckResult = Other;
       TR.AI.FailedCount := 0;
       TR.AI.FinishedCount := 0;
       TR.AI.Failed := False;
```

```
       TR.AI.Traced := False;
       // merge check and coverage data from AI into TR.AI
       merge(AI, TR.AI);
       end;
     end;
   // merge other coverage data from instance I into TR;
   ... ;
 end;
```

Each type record TR should act as if it were a new instance in the named subgroup, so further merging of the updated named subgroup should transparently handle merging of data that has already been merged by type.

Analysis

A merge point specification creates a new scope, if required, using the scope specification in it. The analysis in the presence of merge points can be performed either using the default verification plan view or using a user written verification plan.

Analysis Using Default Verification Plan View

The merge point specifications either add new named subtrees to existing scopes or cause new scopes with named subtrees in them to be created. These new scopes and subtrees are presented in the default view. Consider Example 7 with the verification scope, named subtree and merge point specifications as follows:

```
test test1 {
  verification_scope: VS1;
  named_subtree: NST1: "dut.ctrl1.arb1";
  ...
}
test test2 {
  verification_scope: VS2;
  named_subtree: NST2: "sys.master1.ctrl1.arb1";
  ...
}
``` merge_point: VSMERGE:MP = {VS1:NST1, VS2:NST2};

The verification scope and named subtree specifications are the same as those in Example 3. Two named subtrees exist in two verification scopes. The merge point specification asks for merged information of the two named subtrees. The default verification plan (VP) view for this example would be as follows:

```
– Verification Metrics
   – VS1
      + Scenario (testcase) model
      – Functional coverage model
         – Instance based HDL functional coverage
            + DUT (default named subtree)
            + NST1
         + Module based HDL functional coverage
      – Code coverage model
         – Instance based code coverage
            + DUT (default named subtree)
            + NST1
         + Module based code coverage
   – VS2
      + Scenario (testcase) model
      – Functional coverage model
```

```
        - Instance based HDL functional coverage
            + SYS (default named subtree)
            + NST2
        + Module based HDL functional coverage
    - Code coverage model
        - Instance based code coverage
            + SYS (default named subtree)
            + NST2
        + Module based code coverage
- VSMERGE
    + Scenario (testcase) model
    - Functional coverage model
        - Instance based HDL functional coverage
            + MP1
    - Code coverage model
        - Instance based code coverage
            + MP1
```

A scope which is created through a merge point specification does not contain the scenario model section.

Analysis Using User Written Verification Plan

Since merge point specifications either add named subtrees to existing scopes or create new scopes and named subtrees in them, they may be used in the user written verification plans.

Advanced Analysis

Since merge point specifications are treated as verification scopes, most of the handling of merge points is similar to the explanation under the heading "Named subtrees and model merge (Advanced analysis)". When the tool reads merge point specifications, it adds the merge point identification (ids) to the user specified target scopes, which might create new scopes, and proceeds with rest of the algorithm.

Basic Merging of Coverage Information

In most digital designs, the major blocks of a chip may be designed by independent design teams and multiple simulation verification runs may be performed on each block. The databases of individual blocks and chip can be merged independently to get the coverage figures for all the runs performed on a particular block or a chip. In order to get a complete picture, it should be possible to merge the coverage information of all the blocks into the chip's coverage information. Alternately, it should also be possible to merge the coverage information of a block obtained from its block-level run with the coverage information of a block from the chip-level run.

Referring now to FIG. 27, blocks of a chip, blocks 1-n, may be verified in multiple runs producing multiple coverage databases 10. These multiple coverage databases 10 may be merged into a single merged coverage database 20 for each block. Additionally, multiple verification runs may be performed on the entire chip producing multiple coverage databases 10. These coverage databases 10 may be merged into a single merged coverage database 20 for the entire chip. Since the chip may comprise the same blocks 1-n, components of the merged coverage database 20 for the entire chip may be merged with merged coverage databases 20 for individual blocks of the chip. In like manner, the merged coverage databases 20 for the individual blocks may be merged with the merged coverage database 20 for the entire chip.

Figure 28:
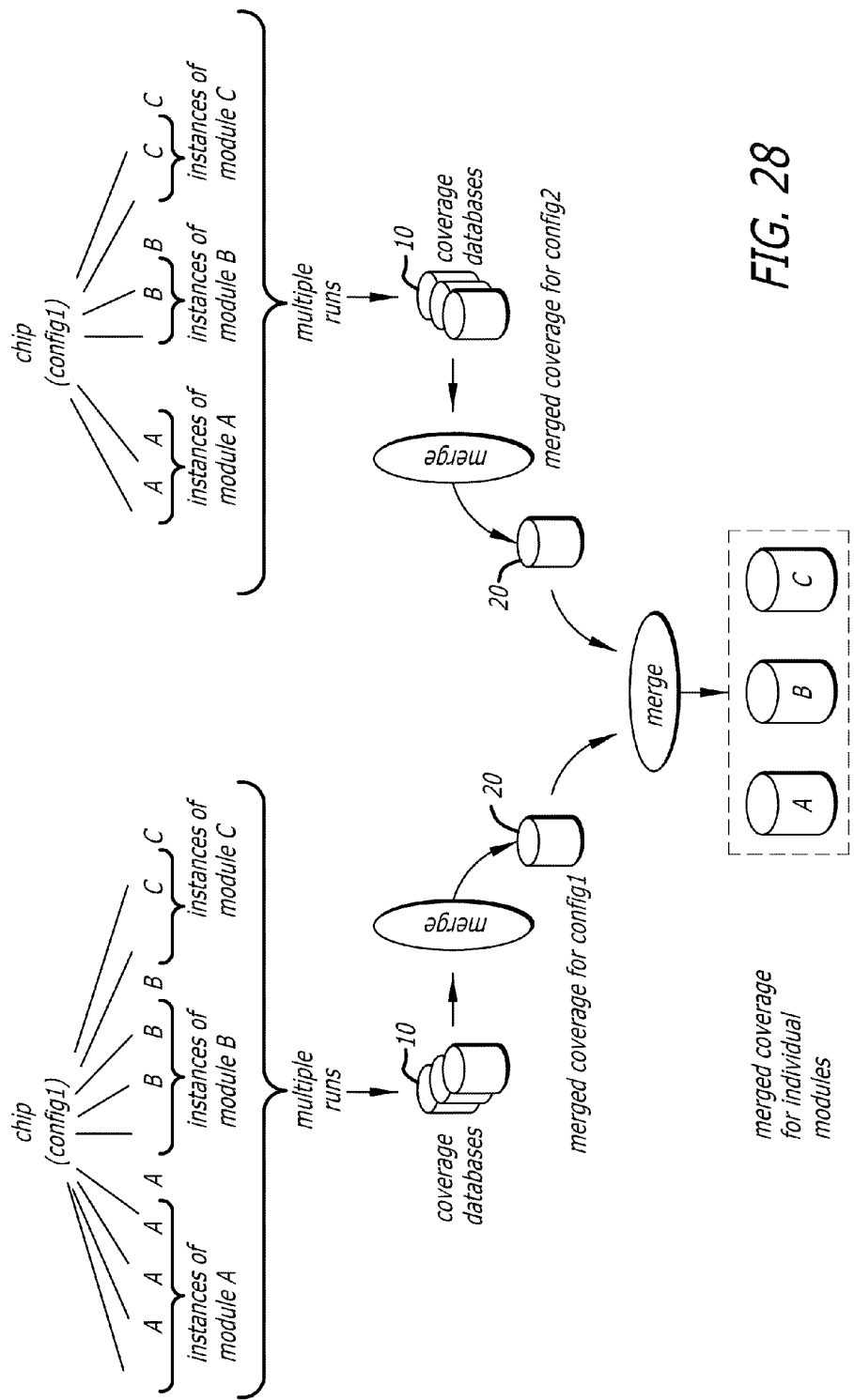
FIG. 28 illustrates the merger of coverage databases from different configurations of a chip.

Referring now to FIG. 28, during the design cycle different configurations of a chip may be designed. Many of the blocks of the chip may be common between the different configurations. As illustrated in FIG. 28, a plurality of coverage databases 10 are generated from multiple runs of a first chip configuration config1. Additionally, the plurality of coverage databases 10 are generated from multiple runs of a second chip configuration config2. Chip configurations config1 and config2 may comprise multiple instances of modules A, B, and C. As illustrated, config1 and config2 may share significant commonality in modules A, B, and C. Coverage databases 10 are then merged to produce merged coverage databases 20. Since there is significant commonality in structure of config1 and config2, merged coverage databases may be further merged to produce merged coverage for individual modules of blocks A, B, and C.

Figure 29:
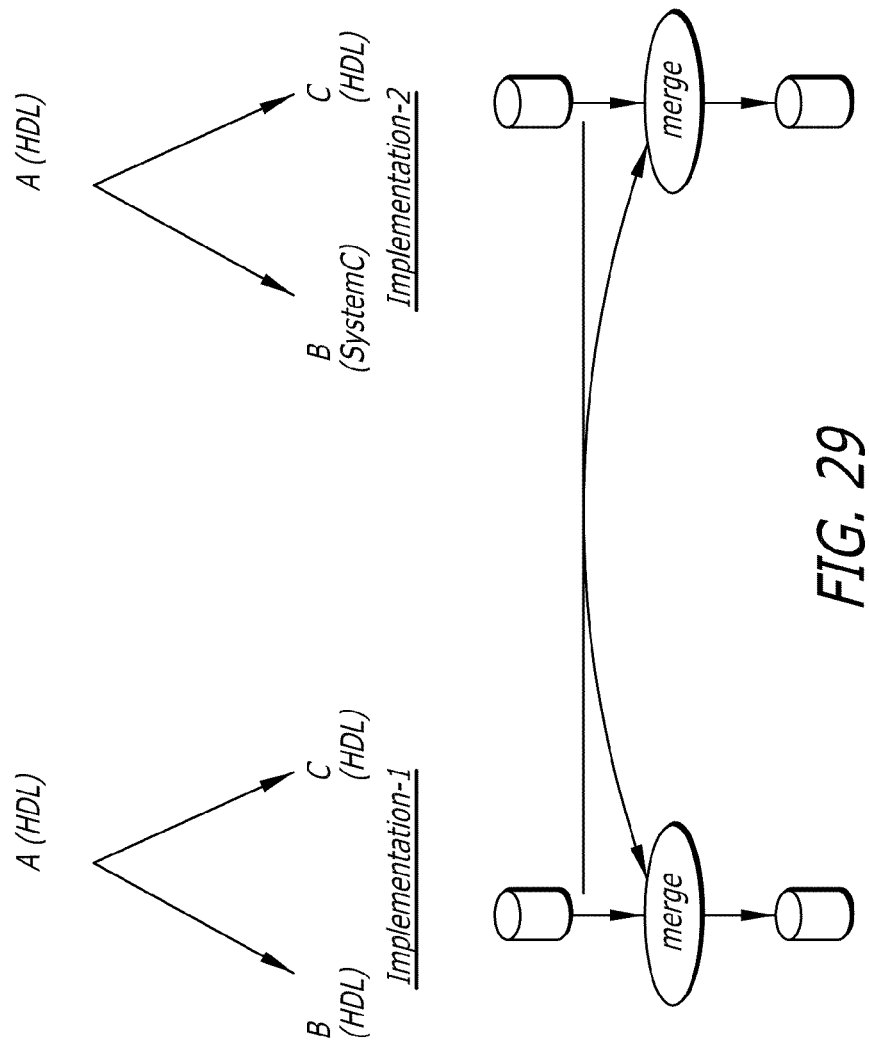
FIG. 29 illustrates code coverage merger for designs at different levels of abstraction.

Referring now to FIG. 29, a design may evolve over project duration where the abstraction level of major blocks changes from a higher level (for instance implementation in SystemC) to lower level (for instance implementation in a Hardware Description Language "HDL"). For example, as illustrated in FIG. 29, multiple implementations of the same design may have different combinations of HDL and SystemC components. FIG. 29 depicts one embodiment where Implementation-2 contains block, or module, B described in SystemC whereas the same module B is described in HDL in Implementation-1. Code coverage may be merge from Implementation-2 to Implementation-1 and vice-versa in which all HDL components are merged ignoring the SystemC components.

The embodiments of invention allow for the merger of coverage data generated at different stages of implementation of an integrated circuit design. As the design of the integrated circuit changes and matures, some previously verified modules may be deselected in subsequent verification runs. Additionally, as errors are corrected in various modules, the system and methods provided herein allow for verification coverage from prior runs to be merged with new verification runs, thereby reducing the time necessary to verify the modified design.

Figures 30, 31, 32:
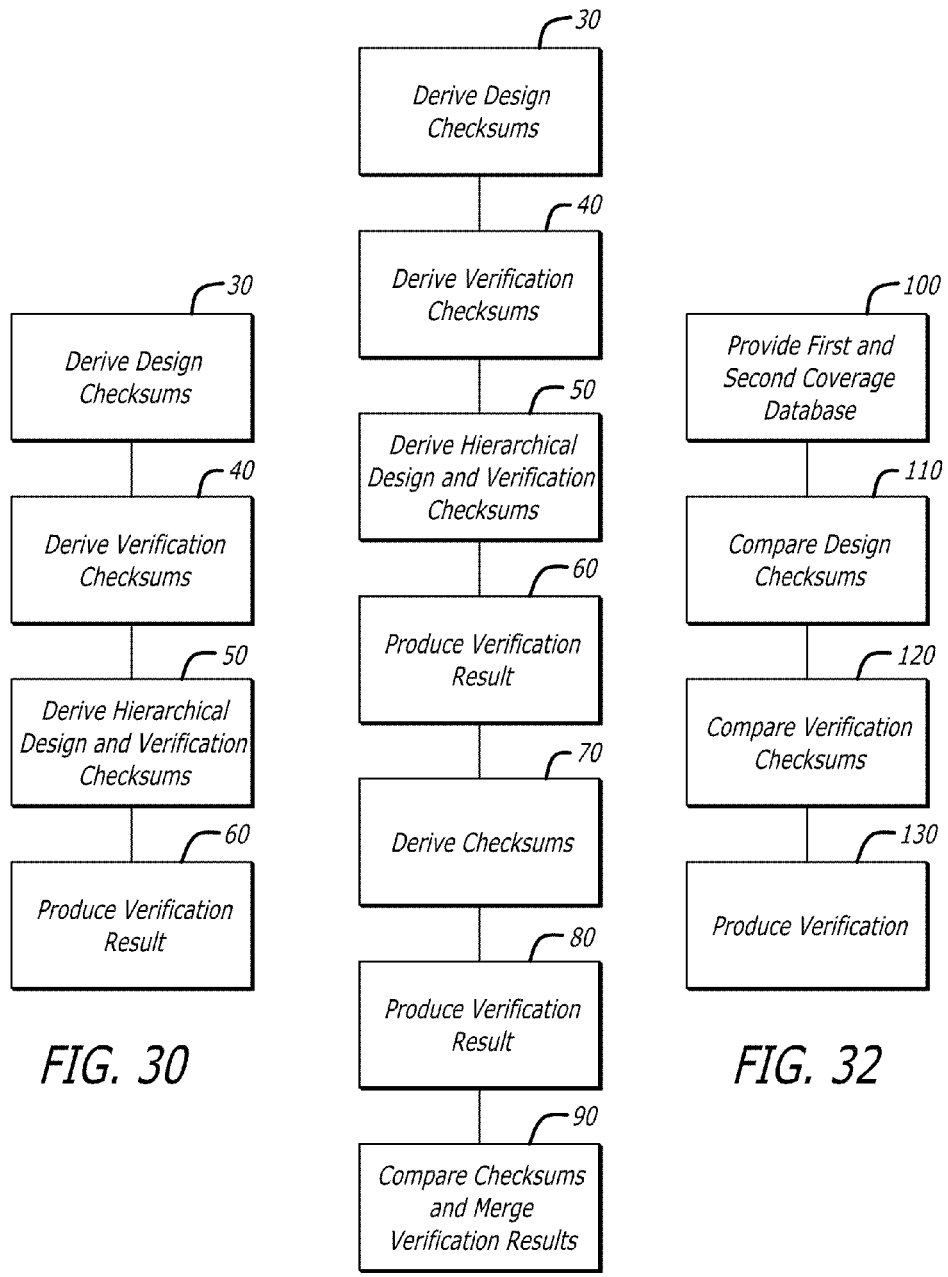
FIGS. 30-33 are flow charts illustrating various methods of merging coverage data.

FIG. 30 is a flow chart of a method of operation of a verification apparatus. The process of the verification apparatus begins with block 30 where it derives design checksums for various coverage points in a digital design. The process of deriving a design checksum includes associating a unique number to each HDL construct in the coverage point. For example, a unique number can be associated to control statements like IF, ELSE, ELSIF, FOR, and WAIT. Unique numbers can also be associated with other HDL constructs like expression operators, declarations etc. For a module, or other coverage point in the design a checksum may then be calculated from the unique numbers. As is known in the art, a checksum is an algorithm based method of determining the integrity of a digital data object. One exemplary algorithm for generating a checksum is known a cyclical redundancy check (CRC). Since the CRC algorithm is widely known in the art, the details of CRC are not provided here.

The method continues to block 40 where verification checksums are derived. Verification checksums differ from design checksums in that verification checksums relate to functional coverage where design checksums relate to code coverage. In block 40, like the above, a unique checksum is derived for functional coverage points within the instance of the module. The method then continues to block 50 where hierarchical design and verification checksums are derived from the previously derived design and verification checksums of an instance and its children instances. These new checksums are calculated for all objects in the instance in a hierarchical manner.

The method continues to block 60, where a verification result is produced from a verification run. As discussed above, the verification result may comprise a coverage database 10 that includes the checksums and coverage information for the instance of the module being verified.

This process provides a method of determining when changes have occurred within a module of a digital design.

Since the checksums are derived from unique numbers assigned to the structures in the module, subsequent changes to the module will result in a different checksum value being assigned. Checksums may then be compared across a number of verification runs and if an instance of a module in the design has the same checksum, the verification results may be merged across these runs.

FIG. 31 illustrates a flowchart of another operational method of a verification apparatus. In this case, the processes of blocks 30-60 is substantially the same as that described with reference to FIG. 30. At block 70, a second verification run derives design, verification, and hierarchical checksums for the digital design. The method continues to block 80, where a second verification result is produced. As described above, the verification result may comprise a coverage database 10. Flow then continues to block 90 where the checksums from the first verification result are compared to the checksums for the second verification result. When matching checksums are found, in the first and second verification results, the results are merged for those instances where checksums match. As discussed above this merged result may be stored in a merged coverage database 20.

FIG. 32 illustrates a flow chart of another operational method of a verification apparatus. The process or method begins with block 100 where a first and a second coverage database 10 (FIG. 28) are provided or read. Flow continues to block 110 where design checksums for instances of like modules from each of the first and second coverage databases 10 are compared. Flow continues to block 120 where verification checksums for instances of like modules from each of the coverage databases 10 are compared. As discussed above, the comparison of design and verification checksums may include a comparison of hierarchical design and verification checksums representing a plurality of design and verification checksums. In block 130 a verification result is produced. This verification result may include merged results from the first and second coverage databases 10 in the form of a merged coverage database 20. It is important to note that a plurality of coverage databases 10 may be used to practice the current invention, the exemplary embodiment depicted in FIG. 32 shows first and second coverage databases for convenience.

Figure 33:
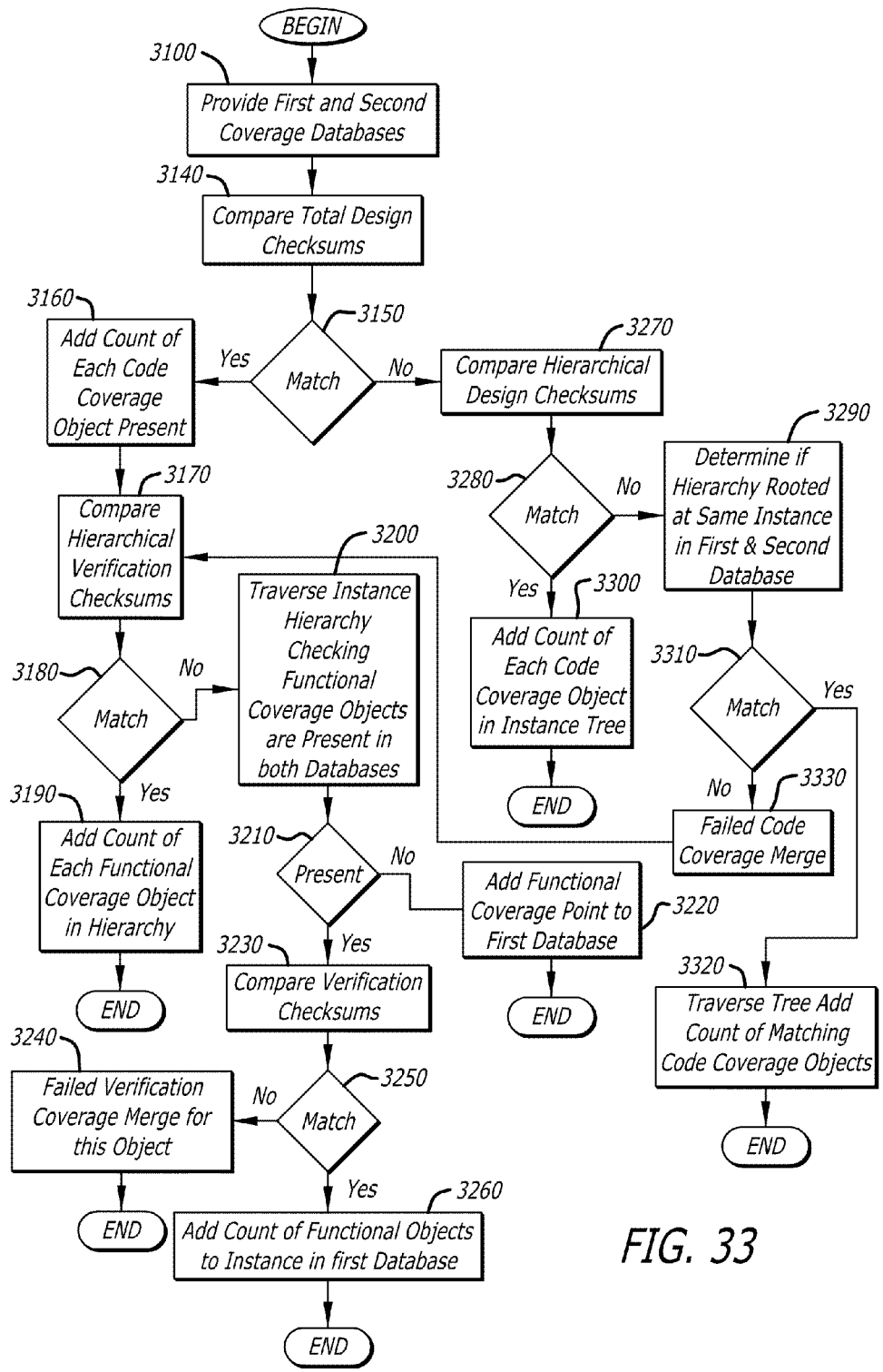

FIG. 33 illustrates a flow chart of another method of a verification apparatus. The process begins at process block 3100 where a first and a second coverage database 10 are provided. The process continues to block 3140 where total design checksums for instances of like modules from each of the first and second coverage databases 10 are compared. If in block 3150 it is determined that the total design checksums match, flow continues to block 3160 where the count of corresponding code coverage objects in the second coverage data base 10 is added to corresponding code coverage objects in the first coverage database 10. Flow then continues to block 3170 where a comparison of hierarchical verification checksums is performed. If, in block 3180 it is determined that the hierarchical verification checksums match, flow continues to block 3190 where the count of corresponding functional coverage objects in the second coverage data base 10 is added to corresponding functional coverage objects in the first coverage database 10.

Returning to block 3180, if the hierarchical verification checksums do not match, the process continues to block 3200, where it is determined if the functional coverage objects in the hierarchy are present in both databases. This determination may be made by traversing the instance hierarchy checking for the presence of like objects in the first and second coverage databases 10. For each object in the hierarchy, if it is determined that the object is present in both coverage databases 10, in block 3210, the verification checksums for these objects are compared in block 3230. If it is determined, in block 3250, that the verification checksums do not match, flow proceeds to block 3240 where a failure to merge functional verification objects is reported. On the other hand, if a match is found in block 3250, flow proceeds to block 3260 where the count of each functional coverage objects in the first database is increased by the objects with matching verification checksums. Returning to decision block 3210, if it is determined that a functional coverage point present in the second coverage database 10 is not present in the first coverage database 10, flow continues to block 3220 where the additional functional coverage point is added to the ones present in the first coverage database.

Returning to decision block 3150, if the comparison of design checksums does not match, flow continues to block 3270 where hierarchical design checksums are compared. If it is determined in decision block 3280 that the hierarchical design checksums match, flow is continued to block 3300, where the count of each code coverage object in the instance tree of the hierarchy from the second coverage database 10 is added to those in the matching instance tree of the first coverage database 10. If no match is found in decision block 3280, flow proceeds to block 3290 where it is determined if the hierarchy is rooted at the same instance and is isomorphic in the first and second coverage databases 10. If in block 3310 the instance hierarchy is found to be isomorphic, flow continues to block 3320 where the instance tree is traversed. During the traversal of the instance tree comparison of design checksums for matching instances in the tree are conducted and where matches are found, the count of matching code coverage objects of those instances is added to the first coverage database 10. If in decision block 3310 it is determined that the hierarchies are not isomorphic, flow proceeds to block 3330 where a code coverage failure may be reported for that hierarchy. Flow then proceeds to block 3170 for a check of functional coverage as described above.

Computing Apparatus

Figure 3:
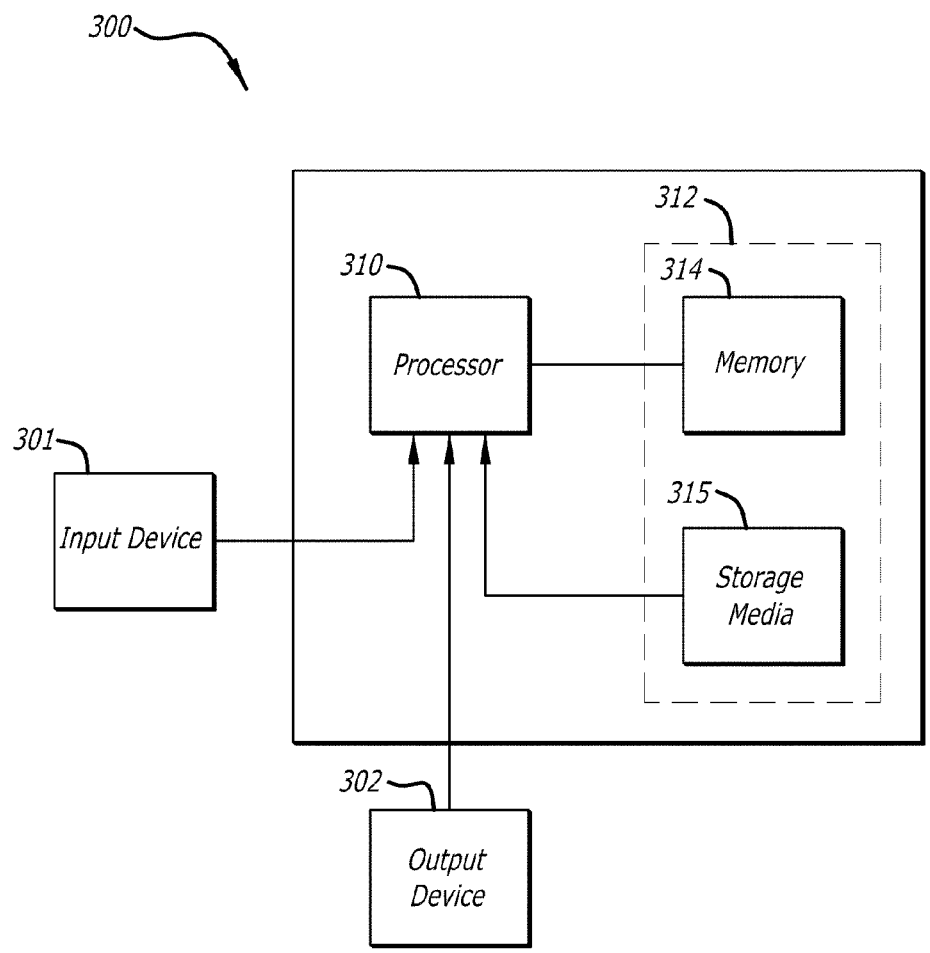
FIG. 3 illustrates a computing apparatus consistent with one or more disclosed embodiments of the invention.

Referring now to FIG. 3, an exemplary computing system or apparatus 300 is illustrated. The exemplary computing apparatus 300 adapted to perform electronic computer aided design (ECAD) may be used to execute instructions or code of software programs to perform the processes or elements of the methods disclosed herein. The computing apparatus 300 includes an input device 301, such as a keyboard, mouse, Ethernet or other communications port; an output device 302, such as a monitor, speakers, a printer, communications port, or a writeable media drive; a processor 310; and a storage device 312 coupled together as shown. The storage device 312 may include one or more of a memory 314, such as a volatile memory like RAM, SDRAM, DDR, DDR2, DDR3; and a storage media 315. The storage media 315 may comprise a non-volatile memory such as a hard drive, a solid-state drive, and the like. In some embodiments, as is known in the art, the storage media may be located on another computing device across a network (not shown). Instructions may be loaded from the storage media into the memory. The processor may retrieve instructions from the storage media or memory and execute the instructions to perform the operations described herein.

Included in the storage device 312 is a set of processor executable instructions that, when executed by the processor 310 configure the computing apparatus to produce verification reports on DUTs in a manner consistent with the methods disclosed herein. The screen shots of the verification user interface (e.g., verification plan etc.) shown in the Figures may be displayed on the output device 302, such as a monitor or a display device, in response to processor or machine readable instructions.

The computing system includes a processor, a memory, a removable media drive, and a hard disk drive. The processor within the computer executes instructions stored in a machine-readable storage device such as the hard disk drive or a removable storage device (e.g., an optical medium (compact disk (CD), digital video disk (DVD), etc.), a magnetic medium (magnetic disk, a magnetic tape, etc.), or a combination of both.

When implemented in software, the elements of the embodiments of the invention are essentially the program, code segments, or instructions to perform the necessary tasks. The program, code segments, or instructions can be stored in a processor readable medium or storage device that can be read and executed by a processor. The processor readable medium may include any medium that can store information. Examples of the processor readable medium include an electronic circuit, a semiconductor memory device, a read only memory (ROM), a flash memory, an erasable programmable read only memory (EPROM), a floppy diskette, a CD-ROM, an optical disk, and a magnetic disk. The program or code segments may be downloaded via computer networks such as the Internet, Intranet, etc and stored in the processor readable medium or storage device.

When implemented as an electronic computer aided design (ECAD) system, the elements of the embodiments of the invention include one or more processor to execute the program, code segments, or instructions that may be stored in a processor readable medium or storage device to perform the tasks or functions of a method or process. The one or more processors may be specifically adapted to electronic computer aided design including processing logic that may comprise hardware (e.g., circuitry, dedicated logic, etc.), software, or a combination of both.

Some portions of the preceding detailed description may have been presented in terms of algorithms and symbolic representations that perform operations on data bits within a computer memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities may take the form of electrical (e.g., current or voltage) or magnetic signals capable of being stored, transferred, combined, compared, and otherwise manipulated. It has proven convenient at times, principally for reasons of common usage, to refer to these signals as bits, values, levels, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, processing logic, or similar electronic computing device, that automatically or semi-automatically manipulates and transforms data represented as physical (electronic) quantities within the computer system's registers and memories into other data similarly represented as physical quantities within the computer system memories or registers or other such information storage, transmission or display devices.

Additionally, the embodiments of the invention are not described with reference to any particular programming language. It will be appreciated that a variety of programming languages may be used to implement the teachings of the embodiments of the invention as described herein.

CONCLUSION

Thus, it is seen that a system, method and apparatus for merger of verification runs and production of verification reports are provided. It will be appreciated that the embodiments of the invention can be practiced by other means than that the above-described embodiments, which are presented in this description for purposes of illustration and not of limitation. The specification and drawings are not intended to limit the exclusionary scope of this patent document. It is noted that various equivalents for the particular embodiments discussed in this description may practice the claimed invention as well. That is, while specific embodiments of the invention have been described, it is evident that many alternatives, modifications, permutations and variations will become apparent in light of the foregoing description. Accordingly, it is intended that the claimed invention embrace all such alternatives, modifications and variations as fall within the scope of the appended claims. The fact that a product, process or method exhibits differences from one or more of the above-described exemplary embodiments does not mean that the product or process is outside the scope (literal scope and/or other legally-recognized scope) of the following claims.

What is claimed is:

1. A method of verifying functionality of an integrated circuit design to improve the manufacturing of integrated circuits there-from, the method comprising:
    defining a plurality of verification scopes of an integrated circuit design as part of a verification plan;
    executing, with at least one processor, a plurality of verification runs within two or more verification scopes to generate verification results;
    selecting at least two verification runs to merge verification results together;
    merging like named scenarios together for each verification scope to generate merged verification results;
    saving the merged verification results into a merge database; and
    generating a verification report for the integrated circuit design from the merged verification results saved in the merge database.

2. The method of claim 1, wherein prior to saving the merged verification results, the method further comprises:
    merging like named subtrees for each selected verification scope of the selected verification runs, and
    merging like named subgroups for each selected verification scope of the selected verification runs.

3. The method of claim 2, wherein prior to generating the merged verification report, the method further comprises:
    determining if no further verification run is selected to have its verification results merged together and if so then generate the merged verification report.

4. The method of claim 1, further comprising:
    displaying the verification report for the integrated circuit design to a user on an output device.

5. The method of claim 1, further comprising:
specifying at least one merge point over at least two verification scopes and a specified subtree from each of the at least two verification scopes;
merging the specified subtrees across the at least two verification scopes of the selected verification runs in response to the at least one merge point.

6. The method of claim 5, wherein a first verification scope is a system and a second verification scope is a module and the method further comprises:
specifying at least one merge point over the first verification scope and the second verification scope to combine check and coverage results obtained during simulation of the system with the check and coverage results obtained during formal verification of the module.

7. The method of claim 1, further comprising:
specifying at least one merge point for a verification scope and a first specified subtree and a second specified subtree within the verification scope;
merging verification results for the first and second specified subtrees within the verification scope of the selected verification runs in response to the at least one merge point.

8. The method of claim 1, wherein
at least one of the plurality of verification scopes is automatically defined at a top level of a verification hierarchy of the verification plan, and
the verification plan is a default verification plan.

9. The method of claim 1, further comprising:
for each verification result of each verification run,
computing abstract uniform check results for each assertion instance in the verification run, the abstract uniform check results indicating pass, fail, or other for each assertion instance in the verification run,
computing abstract coverage results for each assertion instance in the verification run,
computing scenario results for each test scenario defined for the verification run, the scenario results to indicate the success of the verification run in exercising each test scenario, and
computing an overall run result in response to the abstract uniform check results, the abstract coverage results, the scenario results, and the verification result.

10. The method of claim 1, wherein
the plurality of verification runs includes one or more of formal analysis runs, one or more simulation runs, or a combination of one or more formal analysis runs and one or more simulation runs.

11. The method of claim 1, wherein
the merge database is stored in a storage device.

12. A machine readable product for designing an integrated circuit, the machine readable product comprising:
a machine readable storage device having stored therein machine readable instructions to
define a plurality of verification scopes of an integrated circuit design as part of a verification plan;
execute a plurality of verification runs within two or more verification scopes;
select at least two verification runs to merge verification results together;
merge like named scenarios together for each verification scope to generate merged verification results;
save the merged verification results into a merge database; and
generate a verification report for the integrated circuit design from the merged verification results saved in the merge database.

13. The machine readable product of claim 12, wherein processes performed by the machine readable instructions are automated processes in response to a verification plan.

14. The machine readable product of claim 12, wherein the machine readable storage device further has stored therein machine readable instructions to
merge like named subtrees for each selected verification scope of the selected verification runs and
merge like named subgroups for each selected verification scope of the selected verification runs,
before the merged verification results are saved into the merge database.

15. The machine readable product of claim 14, wherein the machine readable storage device further has stored therein machine readable instructions to
determine if no further verification run is selected to have its verification results merged together and if so then generate the merged verification report,
before the generation of the merged verification report.

16. The machine readable product of claim 12, wherein the machine readable storage device further has stored therein machine readable instructions to
display the verification report for the integrated circuit design to a user on an output device.

17. The machine readable product of claim 12, wherein the machine readable storage device further has stored therein machine readable instructions to
specify at least one merge point over at least two verification scopes and a specified subtree from each of the at least two verification scopes;
merge the specified subtrees across the at least two verification scopes of the selected verification runs in response to the at least one merge point.

18. The machine readable product of claim 17, wherein a first verification scope is a system and a second verification scope is a module, and the machine readable storage device further has stored therein machine readable instructions to
specify at least one merge point over the first verification scope and the second verification scope to combine check and coverage results obtained during simulation of the system with the check and coverage results obtained during formal verification of the module.

19. The machine readable product of claim 12, wherein the machine readable storage device further has stored therein machine readable instructions to
specify at least one merge point for a verification scope and a first specified subtree and a second specified subtree within the verification scope; and
merge verification results for the first and second specified subtrees within the verification scope of the selected verification runs in response to the at least one merge point.

20. The machine readable product of claim 12, wherein
at least one of the plurality of verification scopes is automatically defined at a top level of a verification hierarchy of the verification plan, and
the verification plan is a default verification plan.

21. The machine readable product of claim 12, wherein for each verification result of each verification run the machine readable storage device further has stored therein machine readable instructions to
compute abstract uniform check results for each assertion instance in the verification run, the abstract uniform check results indicating pass, fail, or other for each assertion instance in the verification run, compute abstract coverage results for each assertion instance in the verification run, compute scenario results for each test scenario defined for the verification run, the scenario results to indicate the success of the verification run in exercising each test scenario, and compute an overall run result in response to the abstract uniform check results, the abstract coverage results, the scenario results, and the verification result.

22. The machine readable product of claim 12, wherein the plurality of verification runs includes one or more of formal analysis runs, one or more simulation runs, or a combination of one or more formal analysis runs and one or more simulation runs.

* * * * *